United States Patent
Iijima et al.

(10) Patent No.: US 9,704,612 B2
(45) Date of Patent: Jul. 11, 2017

(54) COMPOSITION OF SILVER-CONJUGATED COMPOUND COMPOSITE

(75) Inventors: Takayuki Iijima, Ibaraki (JP);
Hideyuki Higashimura, Ibaraki (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 330 days.

(21) Appl. No.: 14/005,099

(22) PCT Filed: Mar. 15, 2012

(86) PCT No.: PCT/JP2012/056740
§ 371 (c)(1),
(2), (4) Date: Sep. 13, 2013

(87) PCT Pub. No.: WO2012/124771
PCT Pub. Date: Sep. 20, 2012

(65) Prior Publication Data
US 2014/0001422 A1   Jan. 2, 2014

(30) Foreign Application Priority Data

Mar. 17, 2011   (JP) ................. 2011-059152

(51) Int. Cl.
| | | |
|---|---|---|
| H01B 1/00 | (2006.01) |
| H01B 1/12 | (2006.01) |
| B22F 1/00 | (2006.01) |
| B22F 1/02 | (2006.01) |
| C22C 5/06 | (2006.01) |
| H01B 1/22 | (2006.01) |
| C08K 3/08 | (2006.01) |
| H01B 1/02 | (2006.01) |
| H01L 51/00 | (2006.01) |
| H01L 51/50 | (2006.01) |

(52) U.S. Cl.
CPC ........... *H01B 1/121* (2013.01); *B22F 1/0003* (2013.01); *B22F 1/02* (2013.01); *C08K 3/08* (2013.01); *C22C 5/06* (2013.01); *H01B 1/02* (2013.01); *H01B 1/22* (2013.01); *H01L 51/0043* (2013.01); *C08G 2261/91* (2013.01); *C08G 2261/95* (2013.01); *H01L 51/0035* (2013.01); *H01L 51/0039* (2013.01); *H01L 51/5076* (2013.01)

(58) Field of Classification Search
USPC ............... 252/500, 511–514, 519.34, 519.33
See application file for complete search history.

(56) References Cited

U.S. PATENT DOCUMENTS

| | | | |
|---|---|---|---|
| 5,215,820 A * | 6/1993 | Hosokawa ........... | C08G 61/123 428/328 |
| 7,618,560 B2 | 11/2009 | Englebienne et al. | |
| 7,981,326 B2 | 7/2011 | Sato et al. | |
| 2006/0231805 A1* | 10/2006 | Wang .................. | B01J 13/00 252/500 |
| 2010/0252782 A1 | 10/2010 | Masahiro | |
| 2011/0186956 A1 | 8/2011 | Hiroshige et al. | |
| 2012/0032121 A1 | 2/2012 | Higashimura et al. | |
| 2012/0168693 A1 | 7/2012 | Iijima et al. | |

FOREIGN PATENT DOCUMENTS

| | | |
|---|---|---|
| JP | 4202707 A | 7/1992 |
| JP | 2006-89818 A | 4/2006 |
| JP | 2007-146279 A | 6/2007 |
| JP | 2008-97949 A | 4/2008 |
| JP | 2008-190025 A | 8/2008 |
| JP | 2009-102601 A | 5/2009 |
| JP | 2010-261102 A | 11/2010 |
| WO | 02/058928 A1 | 8/2002 |
| WO | 2009/044894 A1 | 4/2009 |
| WO | 2010/117075 A1 | 10/2010 |

OTHER PUBLICATIONS

Communication dated Nov. 4, 2015 from the Japanese Patent Office in counterpart application No. 2012-059020.

* cited by examiner

*Primary Examiner* — Monique Peets
(74) *Attorney, Agent, or Firm* — Sughrue Mion, PLLC

(57) ABSTRACT

A composition of a silver-conjugated compound composite containing (1) a silver-conjugated compound composite containing a silver particle with a Feret diameter of 1,000 nm or less and a conjugated compound having a weight average molecular weight of $3.0 \times 10^2$ or more being adsorbed to the silver particles and (2) an ionic compound. The ionic compound may be a compound having a structure represented by the following Formula (hh-1):

[Chem. 1]

$$M^{m'+}{}_a X^{m'-}{}_b \quad \text{(hh-1)}$$

wherein $M^{m'+}$ represents a metal cation, $X^{m'-}$ represents an anion, a and b each independently represent an integer of 1 or more, and when $M^{m'+}$ and $X^{m'-}$ are each plurally present, they may be the same as or different from each other.

20 Claims, No Drawings

COMPOSITION OF SILVER-CONJUGATED COMPOUND COMPOSITE

CROSS REFERENCE TO RELATED APPLICATIONS

This application is a National Stage of International Application No. PCT/JP2012/056740, filed on Mar. 15, 2012, which claims priority from Japanese Patent Application No. 2011-059152, filed on Mar. 17, 2011, the contents of all of which are incorporated herein by reference in their entirety.

TECHNICAL FIELD

The present invention relates to a composition of a silver-conjugated compound composite.

BACKGROUND ART

Recently, a composite of a silver particle and an organic compound is attracting attention as a material for forming electrodes, circuit patterns, etc. of electronic devices. In Patent Document 1, silver particles with an average particle diameter of 20 nm or less that have on their surfaces an organic compound having an unsaturated bond in its molecule, more specifically, oleylamine, are described as an ink material for an ink-jet printing method. In Patent Document 2, a silver colloidal solution containing silver-based particles prepared by providing a coating layer of polyvinylpyrrolidone, polyallylamine, or polyethyleneimine on the surfaces of silver particles having an average particle diameter of 10 nm or less is described as an ink material for an ink-jet printing method.

RELATED ART DOCUMENT

Patent Document

Patent Document 1: JP 2008-190025 A
Patent Document 2: JP 2007-146279 A

However, when such silver particles are used to manufacture an electrode of an electronic device, the light-emitting brightness of the obtained electronic device (particularly, a light-emitting device) is not sufficient.

SUMMARY OF THE INVENTION

Problem to be Solved by the Invention

Accordingly, it is an object of the present invention to provide a material capable of improving the light-emitting brightness.

Means for Solving Problem

Firstly, the present invention provides a composition of a silver-conjugated compound composite comprising:
(1) a silver-conjugated compound composite comprising a silver particle with a Feret diameter of 1,000 nm or less and a conjugated compound having a weight average molecular weight of $3.0 \times 10^2$ or more being adsorbed to the silver particles; and
(2) an ionic compound (also referred to as a "salt"). The Feret diameter means the average value of Feret diameters. The Feret diameter means the distance between two parallel lines sandwiching a particle in a certain direction (a diameter in the certain direction), and the Feret diameter of a silver particle can be measured from a photograph taken by a scanning electron microscope (SEM) or a transmission electron microscope (TEM).

Secondly, the present invention provides a dispersion liquid, an electrode material and an organic electronic device comprising the composition of a silver-conjugated compound composite.

Thirdly, the present invention provides a layered structure comprising: a substrate; and a layer comprising the composition of a silver-conjugated compound composite formed on the substrate.

Effect of Invention

When the composition of a silver-conjugated compound composite of the present invention is used to manufacture an electrode of an electronic device (particularly, a light-emitting device or a solar cell), an electronic device having excellent light-emitting brightness or photovoltaic efficiency can be manufactured. Also, using the composition of a silver-conjugated compound composite of the present invention, an application method is applicable to the manufacture of an electrically conductive member such as an electrode and a circuit pattern. Therefore, the composition of a silver-conjugated compound composite of the present invention is useful as, for example, a coated electrode, an electrically conductive paint, a wiring material, an adhesive, a bond, an electrically conductive coating, a circuit, an integrated circuit, an electromagnetic wave shielding material, a sensor, an antenna, an antistatic agent, a fiber, a packaging material, an antimicrobial agent, a deodorant, a heating device, a radiator, or a medical material. Particularly, the composition of a silver-conjugated compound composite of the present invention has excellent electrical conductivity and is therefore useful particularly as the material of an electrode of an electronic device such as a light-emitting device, a solar cell and an organic transistor. The organic electronic device of the present invention can be simply manufactured, since a layer other than an anode can be formed by an application method.

EMBODIMENTS FOR CARRYING OUT THE INVENTION

Preferred embodiments of the present invention will be described below.

<Silver-Conjugated Compound Composite>

The silver-conjugated compound composite used in the present invention is usually a composite composed of the silver particle and the conjugated compound adsorbed to the surface of the silver particle.

As used herein, the term "adsorption" may be a chemical adsorption, a physical adsorption, or a combination thereof. The chemical adsorption is preferred due to strong adsorption. The chemical adsorption means adsorption that occurs with a chemical bond (such as a covalent bond, an ionic bond, a metallic bond, a coordination bond, and a hydrogen bond) between an adsorbate and an adsorbent. The physical adsorption means adsorption that occurs through interaction such as van der Waals force, electrostatic attraction, and magnetic force. In the silver-conjugated compound composite used in the present invention, the adsorbate is the conjugated compound, and the adsorbent is the silver particles.

Silver Particle:

In a silver particle used as a substrate of the silver-conjugated compound composite, the Feret diameter of the silver particle itself is usually 1,000 nm or less. For easy synthesis, the Feret diameter is preferably 800 nm or less, more preferably 600 nm or less, further preferably 400 nm or less, and particularly preferably 300 nm or less. The Feret diameter of the silver particle is usually 1 nm or more.

The aspect ratio of the silver particle, which is an index defining its shape, is usually less than 1.5, and is preferably 1.4 or less and more preferably 1.2 or less. As used herein, the aspect ratio means (the largest diameter)/(the smallest diameter). When the aspect ratio has a distribution, the aspect ratio means a number average value.

Conjugated Compound:

The weight average molecular weight of the conjugated compound is preferably $3.0 \times 10^2$ or more, more preferably $5.0 \times 10^2$ or more, and further preferably $1.0 \times 10^3$ or more and is preferably $1.0 \times 10^8$ or less, more preferably $1.0 \times 10^7$ or less, and further preferably $5.0 \times 10^6$ or less, because the silver-conjugated compound composite having good stability is obtained. Therefore, the range of the weight average molecular weight is preferably $3.0 \times 10^2$ to $1.0 \times 10^8$, more preferably $5.0 \times 10^2$ to $1.0 \times 10^7$, and still more preferably $1.0 \times 10^3$ to $5.0 \times 10^6$. When the weight average molecular weight of the conjugated compound is less than $3.0 \times 10^2$, the conjugated compound adsorbed to the silver-conjugated compound composite may be easily desorbed by evaporation. As used herein, the weight average molecular weight and number average molecular weight of a compound mean a weight average molecular weight and a number average molecular weight in terms of polystyrene measured by gel permeation chromatography (GPC).

As used herein, the conjugated compound means a compound that has a plurality of multiple bonds in its main chain and that includes a region in which adjacent multiple bonds connected via a single bond are arranged or a region in which a hetero atom having an unshared electron pair is present in such an arrangement of multiple bonds, wherein conjugated π electrons are delocalized in the region.

In the conjugated compound, a value calculated by a formula of {(the number of atoms included in the delocalization region of conjugated π electrons in the main chain)/ (the total number of atoms in the main chain)}×100% is preferably 50% or higher, more preferably 60% or higher, further preferably 70% or higher, particularly preferably 80% or higher, and most preferably 90% or higher, because good electron transport property is achieved.

The conjugated compound used in the present invention is preferably water insoluble, because the compound can be efficiently purified using water.

The meaning that the conjugated compound is water insoluble means that the amount of the conjugated compound soluble in 100 mL of water at standard temperature and standard pressure is less than 20 mg.

The conjugated compound used in the present invention is preferably an aromatic compound.

From the viewpoint of dispersibility of the silver-conjugated compound composite, the ratio of the conjugated compound in the composite used in the present invention is preferably 1.0% by weight or more and more preferably 5.0% by weight or more, based on 100% by weight of the silver-conjugated compound composite. The upper limit of the ratio of the conjugated compound in the silver-conjugated compound composite is usually 50% by weight or less.

It is preferable that the conjugated compound used in the present invention has a hetero atom-containing group, because the silver-conjugated compound composite having good stability is obtained.

In the present application, the term "hetero atom" means an atom of an element other than carbon and hydrogen.

Preferably, the conjugated compound used in the present invention is a compound having a group represented by Formula (I) below, a repeating unit represented by Formula (II) below, or both of them.

[Chem. 1]

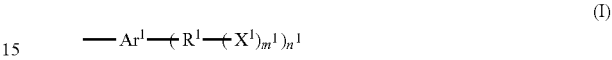
(I)

In Formula (I), $Ar^1$ represents an $(n^1+1)$ valent aromatic group, $R^1$ represents a single bond or an $(m^1+1)$ valent group, $X^1$ represents a hetero atom-containing group, $m^1$ and $n^1$ are each independently an integer of 1 or more, and when $R^1$, $X^1$ and $m^1$ are each plurally present, they may be the same as or different from each other.

[Chem. 2]

(II)

In Formula (II), $Ar^2$ represents an $(n^2+2)$ valent aromatic group, $R^2$ represents a single bond or an $(m^2+1)$ valent group, $X^2$ represents a hetero atom-containing group, $m^2$ and $n^2$ are each independently an integer of 1 or more, and when $R^2$, $X^2$ and $m^2$ are each plurally present, they may be the same as or different from each other.

The phrase "when $R^1$, $X^1$ and $m^1$ are each plurally present, they may be the same as or different from each other" represents the same meaning as "when $R^1$ is plurally present, they may be the same as or different from each other, when $X^1$ is plurally present, they may be the same as or different from each other, and when $m^1$ is plurally present, they may be the same as or different from each other."

The formula weight of the repeating unit represented by Formula (II) above is preferably $3.0 \times 10^2$ or more, more preferably $5.0 \times 10^2$ or more, and further preferably $1.0 \times 10^3$ or more, because the silver-conjugated compound composite having good stability is obtained. Although the upper limit of the formula weight of the repeating unit is not particularly limited, the upper limit is preferably $1.0 \times 10^8$ or less, more preferably $1.0 \times 10^7$ or less, further preferably $5.0 \times 10^6$ or less, particularly preferably $1.0 \times 10^5$ or less, and most preferably $1.0 \times 10^4$ or less, because monomers constituting the repeating unit can be easily synthesized and the silver-conjugated compound composite having good stability can be obtained.

The formula weight of the repeating unit is obtained by subtracting the atomic weight of two hydrogen atoms from the molecular weight of a compound represented by Formula (III) below.

[Chem. 3]

(III)

Examples of the ($n^1$+1) valent aromatic group represented by $Ar^1$ in Formula (I) may include an atomic group remaining after removing ($n^1$+1) hydrogen atoms directly bonding to carbon atoms that constitute a ring of an aromatic compound represented by any one of Formulae (1) to (57) below. The ($n^1$+1) valent aromatic group represented by $Ar^1$ optionally has a substituent.

Examples of the substituent may include at least one substituent selected from the group consisting of a halogen atom, a monovalent hydrocarbon group, a mercapto group, a mercaptocarbonyl group, a mercaptothiocarbonyl group, a hydrocarbylthio group, a hydrocarbylthiocarbonyl group, a hydrocarbyldithio group, a hydroxyl group, hydrocarbyloxy groups, a carboxyl group, hydrocarbylcarbonyl groups, a cyano group, an amino group, a monohydrocarbylamino group, a dihydrocarbylamino group, a phosphino group, a monohydrocarbylphosphino group, a dihydrocarbylphosphino group, a group represented by formula: —P(=O)(OH)$_2$, a sulfo group, a monovalent heterocyclic group, a group represented by formula: —COOM, a group represented by formula: —PO$_3$M, a group represented by formula: —SO$_3$M (wherein M represents a metal cation or a substituted or unsubstituted ammonium cation), and a group represented by formula: —NR$_3$M' (wherein R represents a hydrogen atom or a monovalent hydrocarbon group such as an alkyl group, a cycloalkyl group, an aryl group, or an aralkyl group, and M' represents an anion). Of these, a halogen atom, a monovalent hydrocarbon group, a carboxyl group, an amino group, a monovalent heterocyclic group, a group represented by formula: —COOM, or a group represented by formula: —SO$_3$M is preferred, a monovalent hydrocarbon group, a carboxyl group, an amino group, a pyrrolidonyl group, a pyridinyl group, or a group represented by formula: —COOM is more preferred, a monovalent hydrocarbon group, a carboxyl group, or a group represented by formula: —COOM is further preferred, and a monovalent hydrocarbon group, a carboxyl group, a pyridinyl group, or a group represented by formula: —COOM is particularly preferred.

Examples of the ($n^2$+2) valent aromatic group represented by $Ar^2$ in Formula (II) may include an atomic group remaining after removing ($n^2$+2) hydrogen atoms directly bonding to carbon atoms that constitute a ring of an aromatic compound represented by any one of Formulae (1) to (57) below. The ($n^2$+2) valent aromatic group represented by $Ar^2$ optionally has a substituent. The substituent may be the same as those described for $Ar^1$.

Among the aromatic compounds represented by Formulae (1) to (57) below, a compound represented by any one of Formulae (1) to (8), (17), (24) to (33), (36) to (51), and (55) is preferred, a compound represented by any one of Formulae (1) to (8), (17), (30) to (33), (36) to (42), (48) to (51), and (55) is more preferred, a compound represented by any one of Formulae (1) to (8) is further preferred, a compound represented by Formula (3) or (8) is particularly preferred, because of the ease of synthesis.

[Chem. 4]

(1)

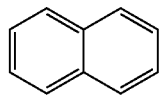
(2)

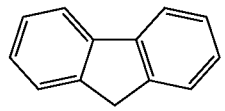
(3)

(4)

(5)

(6)

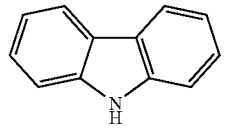
(7)

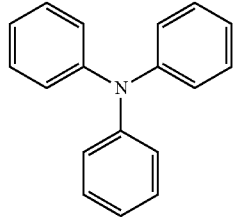
(8)

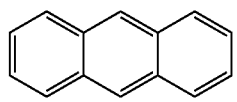
(9)

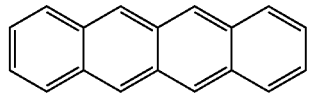
(10)

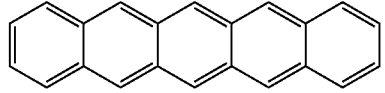
(11)

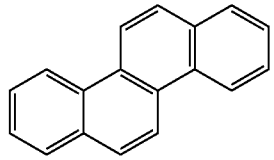
(12)

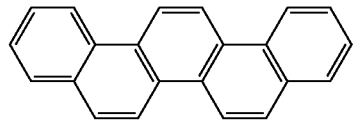
(13)

(14) 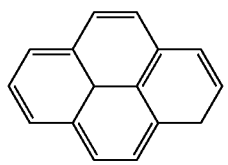
(15) 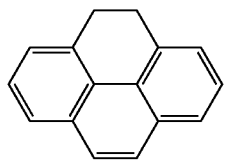
(16) 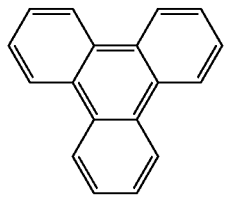
(17) 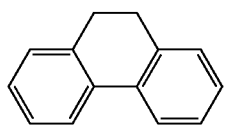
(18) 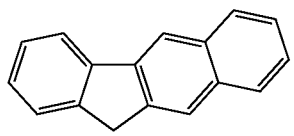
(19) 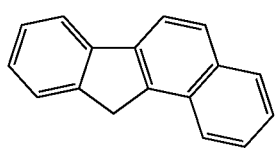
(20) 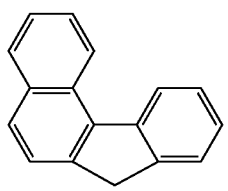
(21) 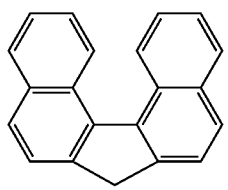
(22) 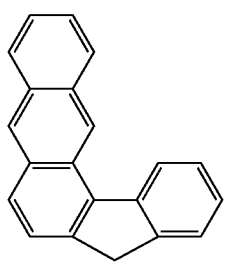
(23) 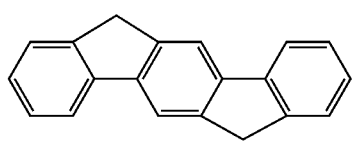
(24) 
(25) 
(26) 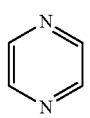
(27) 
(28) 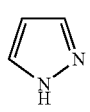
(29) 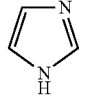
(30) 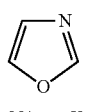
[Chem. 5]
(31)
(32)
(33)
(34)
(35)

 (36)
 (37)
 (38)
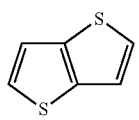 (39)
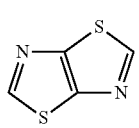 (40)
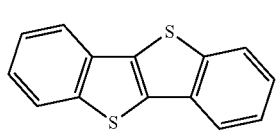 (41)
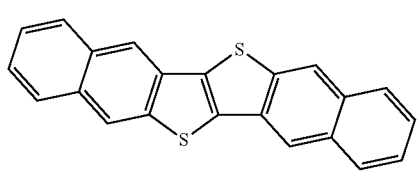 (42)
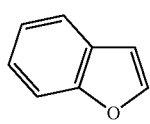 (43)
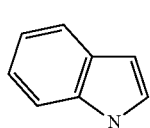 (44)
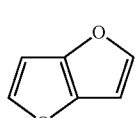 (45)
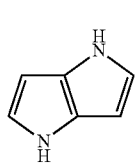 (46)
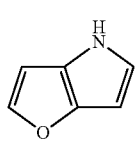 (47)
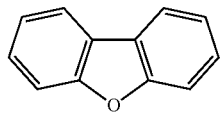 (48)
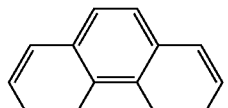 (49)
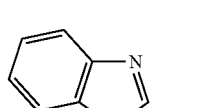 (50)
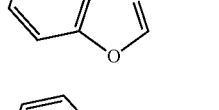 (51)
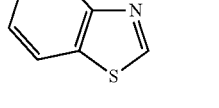 (52)
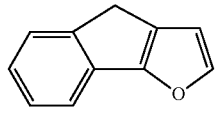 (53)
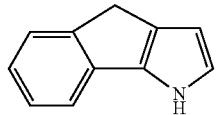 (54)
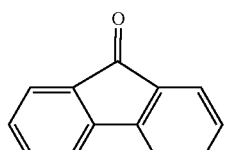 (55)
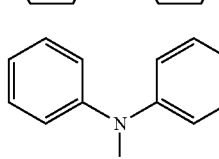 (56)
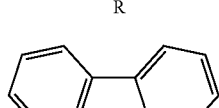 (57)
In Formulae, R represents the same meaning as described above.

The atoms and groups shown as an example of the substituent that $Ar^1$ and $Ar^2$ optionally have are used with the following meanings in the present description.

Examples of the "halogen atom" may include a fluorine atom, a chlorine atom, a bromine atom, and an iodine atom. The halogen atom used as the substituent for $Ar^1$ and $Ar^2$ is preferably a fluorine atom, a chlorine atom, or a bromine atom.

The "monovalent hydrocarbon group" means substituted or unsubstituted monovalent hydrocarbon group. Examples of the unsubstituted monovalent hydrocarbon group may include: alkyl groups having 1 to 50 carbon atoms such as a methyl group, an ethyl group, a propyl group, an isopropyl group, a butyl group, an isobutyl group, a tert-butyl group, a pentyl group, a hexyl group, a nonyl group, a dodecyl group, a pentadecyl group, an octadecyl group, and a docosyl group; cycloalkyl groups having 3 to 50 carbon atoms such as a cyclopropyl group, a cyclobutyl group, a cyclopentyl group, a cyclohexyl group, a cyclononyl group, and a cyclododecyl group; bicycloalkyl groups having 4 to 50 carbon atoms such as a norbornyl group and an adamantyl group; alkenyl groups having 2 to 50 carbon atoms such as an ethenyl group, a propenyl group, a 3-butenyl group, a 2-butenyl group, a 2-pentenyl group, a 2-hexenyl group, a 2-nonenyl group, and a 2-dodecenyl group; aryl groups having 6 to 50 carbon atoms such as a phenyl group, a 1-naphthyl group, a 2-naphthyl group, a 2-methylphenyl group, a 3-methylphenyl group, a 4-methylphenyl group, a 4-ethylphenyl group, a 4-propylphenyl group, a 4-isopropylphenyl group, a 4-butylphenyl group, a 4-tert-butylphenyl group, a 4-hexylphenyl group, a 4-cyclohexylphenyl group, a 4-adamantylphenyl group, and a 4-phenylphenyl group; and aralkyl groups having 7 to 50 carbon atoms such as a phenylmethyl group, a 1-phenylethyl group, a 2-phenylethyl group, a 1-phenyl-1-propyl group, a 1-phenyl-2-propyl group, a 2-phenyl-2-propyl group, a 3-phenyl-1-propyl group, a 4-phenyl-1-butyl group, a 5-phenyl-1-pentyl group, and a 6-phenyl-1-hexyl group. Examples of the substituted monovalent hydrocarbon group may include a group obtained by substituting a part or all of the hydrogen atoms in the unsubstituted monovalent hydrocarbon groups with a halogen atom, a mercapto group, or the like.

The monovalent hydrocarbon group used as the substituent for $Ar^1$ and $Ar^2$ is preferably an alkyl group having 1 to 50 carbon atoms or an aryl group having 6 to 50 carbon atoms, more preferably an alkyl group having 1 to 12 carbon atoms or an aryl group having 6 to 18 carbon atoms, and further preferably an alkyl group having 1 to 6 carbon atoms or an aryl group having 6 to 12 carbon atoms. A part of all of the hydrogen atoms in these groups may be substituted with a halogen atom, a mercapto group, or the like.

The "hydrocarbylthio group," the "hydrocarbylthiocarbonyl group," the "hydrocarbyldithio group," the "hydrocarbyloxy group," and the "hydrocarbylcarbonyl group" mean a substituted or unsubstituted hydrocarbylthio group, a substituted or unsubstituted hydrocarbylthiocarbonyl group, a substituted or unsubstituted hydrocarbyldithio group, a substituted or unsubstituted hydrocarbyloxy group, and a substituted or unsubstituted hydrocarbylcarbonyl group, respectively.

As used herein, the "hydrocarbylthio group" means an unsubstituted hydrocarbylthio group and a substituted hydrocarbylthio group in which a part or all of hydrogen atoms in the unsubstituted hydrocarbylthio group are substituted with a halogen atom, a mercapto group, or the like.

Examples of the unsubstituted hydrocarbylthio group may include an unsubstituted alkylthio group, an unsubstituted cycloalkylthio group, an unsubstituted bicycloalkylthio group, an unsubstituted alkenylthio group, an unsubstituted arylthio group, and an unsubstituted aralkylthio group.

The unsubstituted alkylthio group may be linear or branched. The number of carbon atoms in the unsubstituted alkylthio group is usually 1 to 20, preferably 1 to 15, and more preferably 1 to 10. Examples of the unsubstituted alkylthio group may include a methylthio group, an ethylthio group, a propylthio group, an isopropylthio group, a butylthio group, an isobutylthio group, a sec-butylthio group, a tert-butylthio group, a pentylthio group, a hexylthio group, a heptylthio group, an octylthio group, a 2-ethylhexylthio group, a nonylthio group, a decylthio group, a 3,7-dimethyloctylthio group, and a dodecylthio group. Examples of the substituted alkylthio group may include a trifluoromethylthio group.

The unsubstituted cycloalkylthio group has usually 3 to 50 carbon atoms, and examples thereof may include a cyclopropylthio group, a cyclobutylthio group, a cyclopentylthio group, a cyclohexylthio group, a cyclononylthio group, and a cyclododecylthio group.

The unsubstituted bicycloalkylthio group has usually 4 to 50 carbon atoms, and examples thereof may include a norbornylthio group and an adamantylthio group.

The unsubstituted alkenylthio group has usually 2 to 50 carbon atoms, and examples thereof may include an ethenylthio group, a propenylthio group, a 3-butenylthio group, a 2-butenylthio group, a 2-pentenylthio group, a 2-hexenylthio group, a 2-nonenylthio group, and a 2-dodecenylthio group.

The unsubstituted arylthio group has usually 6 to 50 carbon atoms, and examples thereof may include a phenylthio group, a 1-naphthylthio group, a 2-naphthylthio group, a 2-methylphenylthio group, a 3-methylphenylthio group, a 4-methylphenylthio group, a 4-ethylphenylthio group, a 4-propylphenylthio group, a 4-isopropylphenylthio group, a 4-butylphenylthio group, a 4-tert-butylphenylthio group, a 4-hexylphenylthio group, a 4-cyclohexylphenylthio group, a 4-adamantylphenylthio group, and a 4-phenylphenylthio group.

The unsubstituted aralkylthio group has usually 7 to 50 carbon atoms, and examples thereof may include a phenylmethylthio group, a 1-phenylethylthio group, a 2-phenylethylthio group, a 1-phenyl-1-propylthio group, a 1-phenyl-2-propylthio group, a 2-phenyl-2-propylthio group, a 3-phenyl-1-propylthio group, a 4-phenyl-1-butylthio group, a 5-phenyl-1-pentylthio group, and a 6-phenyl-1-hexylthio group.

The "hydrocarbylthiocarbonyl group" means an unsubstituted hydrocarbylthiocarbonyl group and a substituted hydrocarbylthiocarbonyl groups in which a part or all of hydrogen atoms in the unsubstituted hydrocarbylthiocarbonyl group are substituted with a halogen atom, a mercapto group, or the like.

Examples of the unsubstituted hydrocarbylthiocarbonyl group may include an unsubstituted alkylthiocarbonyl group, an unsubstituted cycloalkylthiocarbonyl group, an unsubstituted bicycloalkylthiocarbonyl group, an unsubstituted alkenylthiocarbonyl group, an unsubstituted arylthiocarbonyl group, and an unsubstituted aralkylthiocarbonyl group.

The unsubstituted alkylthiocarbonyl group may be linear or branched. The unsubstituted alkylthiocarbonyl group has usually 2 to 21 carbon atoms, preferably 2 to 16 carbon atoms, and more preferably 2 to 11 carbon atoms. Examples of the unsubstituted alkylthiocarbonyl group may include a methylthiocarbonyl group, an ethylthiocarbonyl group, a propylthiocarbonyl group, an isopropylthiocarbonyl group, a butylthiocarbonyl group, an isobutylthiocarbonyl group, a sec-butylthiocarbonyl group, a tert-butylthiocarbonyl group, a pentylthiocarbonyl group, a hexylthiocarbonyl group, a heptylthiocarbonyl group, an octylthiocarbonyl group, a 2-ethylhexylthiocarbonyl group, a nonylthiocarbonyl group, a decylthiocarbonyl group, a 3,7-dimethyloctylthiocarbonyl group, and a dodecylthiocarbonyl group. Examples of the substituted alkylthiocarbonyl group may include a trifluoromethylthiocarbonyl group.

The unsubstituted cycloalkylthiocarbonyl group has usually 4 to 50 carbon atoms, and examples thereof may include a cyclopropylthiocarbonyl group, a cyclobutylthiocarbonyl group, a cyclopentylthiocarbonyl group, a cyclohexylthiocarbonyl group, a cyclononylthiocarbonyl group, and a cyclododecylthiocarbonyl group.

The unsubstituted bicycloalkylthiocarbonyl group has usually 5 to 50 carbon atoms, and examples thereof may include a norbornylthiocarbonyl group and an adamantylthiocarbonyl group.

The unsubstituted alkenylthiocarbonyl group has usually 3 to 50 carbon atoms, and examples thereof may include an ethenylthiocarbonyl group, a propenylthiocarbonyl group, a 3-butenylthiocarbonyl group, a 2-butenylthiocarbonyl group, a 2-pentenylthiocarbonyl group, a 2-hexenylthiocarbonyl group, a 2-nonenylthiocarbonyl group, and a 2-dodecenylthiocarbonyl group.

The unsubstituted arylthiocarbonyl group has usually 7 to 50 carbon atoms, and examples thereof may include a phenylthiocarbonyl group, a 1-naphthylthiocarbonyl group, a 2-naphthylthiocarbonyl group, a 2-methylphenylthiocarbonyl group, a 3-methylphenylthiocarbonyl group, a 4-methylphenylthiocarbonyl group, a 4-ethylphenylthiocarbonyl group, a 4-propylphenylthiocarbonyl group, a 4-isopropylphenylthiocarbonyl group, a 4-butylphenylthiocarbonyl group, a 4-tert-butylphenylthiocarbonyl group, a 4-hexylphenylthiocarbonyl group, a 4-cyclohexylphenylthiocarbonyl group, a 4-adamantylphenylthiocarbonyl group, and a 4-phenylphenylthiocarbonyl group.

The unsubstituted aralkylthiocarbonyl group has usually 8 to 50 carbon atoms, and examples thereof may include a phenylmethylthiocarbonyl group, a 1-phenylethylthiocarbonyl group, a 2-phenylethylthiocarbonyl group, a 1-phenyl-1-propylthiocarbonyl group, a 1-phenyl-2-propylthiocarbonyl group, a 2-phenyl-2-propylthiocarbonyl group, a 3-phenyl-1-propylthiocarbonyl group, a 4-phenyl-1-butylthiocarbonyl group, a 5-phenyl-1-pentylthiocarbonyl group, and a 6-phenyl-1-hexylthiocarbonyl group.

The "hydrocarbyldithio group" means an unsubstituted hydrocarbyldithio group and a substituted hydrocarbyldithio group in which a part or all of hydrogen atoms in the unsubstituted hydrocarbyldithio group are substituted with a halogen atom, a mercapto group, or the like.

Examples of the unsubstituted hydrocarbyldithio group may include an unsubstituted alkyldithio group, an unsubstituted cycloalkyldithio group, an unsubstituted bicycloalkyldithio group, an unsubstituted alkenyldithio group, an unsubstituted aryldithio group, and an unsubstituted aralkyldithio group.

The unsubstituted alkyldithio group may be linear or branched. The unsubstituted alkyldithio group has usually 1 to 20 carbon atoms, preferably 1 to 15 carbon atoms, and more preferably 1 to 10 carbon atoms. Examples of the unsubstituted alkyldithio group may include a methyldithio group, an ethyldithio group, a propyldithio group, an isopropyldithio group, a butyldithio group, an isobutyldithio group, a sec-butyldithio group, a tert-butyldithio group, a pentyldithio group, a hexyldithio group, a heptyldithio group, an octyldithio group, a 2-ethylhexyldithio group, a nonyldithio group, a decyldithio group, a 3,7-dimethyloctyldithio group, and a dodecyldithio group. Examples of the substituted alkyldithio groups may include a trifluoromethyldithio group.

The unsubstituted cycloalkyldithio group has usually 3 to 50 carbon atoms, and examples thereof may include a cyclopropyldithio group, a cyclobutyldithio group, a cyclopentyldithio group, a cyclohexyldithio group, a cyclononyldithio group, and a cyclododecyldithio group.

The unsubstituted bicycloalkyldithio group has usually 4 to 50 carbon atoms, and examples thereof may include a norbornyldithio group and an adamantyldithio group.

The unsubstituted alkenyldithio group has usually 2 to 50 carbon atoms, and examples thereof may include an ethenyldithio group, a propenyldithio group, a 3-butenyldithio group, a 2-butenyldithio group, a 2-pentenyldithio group, a 2-hexenyldithio group, a 2-nonenyldithio group, and a 2-dodecenyldithio group.

The unsubstituted aryldithio group has usually 6 to 50 carbon atoms, and examples thereof may include a phenyldithio group, a 1-naphthyldithio group, a 2-naphthyldithio group, a 2-methylphenyldithio group, a 3-methylphenyldithio group, a 4-methylphenyldithio group, a 4-ethylphenyldithio group, a 4-propylphenyldithio group, a 4-isopropylphenyldithio group, a 4-butylphenyldithio group, a 4-tert-butylphenyldithio group, a 4-hexylphenyldithio group, a 4-cyclohexylphenyldithio group, a 4-adamantylphenyldithio group, and a 4-phenylphenyldithio group.

The unsubstituted aralkyldithio group has usually 7 to 50 carbon atoms, and examples thereof may include a phenylmethyldithio group, a 1-phenylethyldithio group, a 2-phenylethyldithio group, a 1-phenylpropyldithio group, a 2-phenyl-1-methylethyldithio group, a 1-phenyl-1-methylethyldithio group, a 3-phenylpropyldithio group, a 4-phenylbutyldithio group, a 5-phenylpentyldithio group, and a 6-phenylhexyldithio group.

The "hydrocarbyloxy group" means an unsubstituted hydrocarbyloxy group and a substituted hydrocarbyloxy group in which a part or all of hydrogen atoms in the unsubstituted hydrocarbyloxy group are substituted with a halogen atom, a mercapto group, or the like.

Examples of the unsubstituted hydrocarbyloxy group may include an unsubstituted alkoxy group, an unsubstituted cycloalkoxy group, an unsubstituted bicycloalkoxy group, an unsubstituted alkenyloxy group, an unsubstituted aryloxy group, and an unsubstituted aralkyloxy group.

The unsubstituted alkoxy group may be linear or branched. The unsubstituted alkoxy group has usually 1 to 20 carbon atoms, preferably 1 to 15 carbon atoms, and more preferably 1 to 10 carbon atoms. Examples of the unsubstituted alkoxy group may include a methoxy group, an ethoxy group, a propyloxy group, an isopropyloxy group, a butoxy group, an isobutoxy group, a sec-butoxy group, a tert-butoxy group, a pentyloxy group, a hexyloxy group, a heptyloxy group, an octyloxy group, a 2-ethylhexyloxy group, a nonyloxy group, a decyloxy group, a 3,7-dimethyloctyloxy group, and a dodecyloxy group. Examples of the substituted alkoxy group may include a trifluoromethoxy group.

The unsubstituted cycloalkoxy group has usually 3 to 50 carbon atoms, and examples thereof may include a cyclopropyloxy group, a cyclobutoxy group, a cyclopentyloxy group, a cyclohexyloxy group, a cyclononyloxy group, and a cyclododecyloxy group.

The unsubstituted bicycloalkoxy group has usually 4 to 50 carbon atoms, and examples thereof may include a norbornyloxy group and an adamantyloxy group.

The unsubstituted alkenyloxy group has usually 2 to 50 carbon atoms, and examples thereof may include an ethenyloxy group, a propenyloxy group, a 3-butenyloxy group, a 2-butenyloxy group, a 2-pentenyloxy group, a 2-hexenyloxy group, a 2-nonenyloxy group, and a 2-dodecenyloxy group.

The unsubstituted aryloxy group has usually 6 to 50 carbon atoms, and examples thereof may include a phenoxy group, a 1-naphthyloxy group, a 2-naphthyloxy group, a 2-methylphenoxy group, a 3-methylphenoxy group, a 4-methylphenoxy group, a 4-ethylphenoxy group, a 4-propylphenoxy group, a 4-isopropylphenoxy group, a 4-butylphenoxy group, a 4-tert-butylphenoxy group, a 4-hexylphenoxy group, a 4-cyclohexylphenoxy group, a 4-adamantylphenoxy group, and a 4-phenylphenoxy group.

The unsubstituted aralkyloxy group has usually 7 to 50 carbon atoms, and examples thereof may include a phenylmethoxy group, a 1-phenylethoxy group, a 2-phenylethoxy group, a 1-phenyl-1-propyloxy group, a 1-phenyl-2-propyloxy group, a 2-phenyl-2-propyloxy group, a 3-phenyl-1-propyloxy group, a 4-phenyl-1-butoxy group, a 5-phenyl-1-pentyloxy group, and a 6-phenyl-1-hexyloxy group.

The "hydrocarbylcarbonyl group" means an unsubstituted hydrocarbylcarbonyl group and a substituted hydrocarbylcarbonyl group in which a part or all of hydrogen atoms in the unsubstituted hydrocarbylcarbonyl group are substituted with a halogen atom, a mercapto group, or the like.

Examples of the unsubstituted hydrocarbylcarbonyl group may include an unsubstituted alkylcarbonyl group, an unsubstituted cycloalkylcarbonyl group, an unsubstituted bicycloalkylcarbonyl group, an unsubstituted alkenylcarbonyl group, an unsubstituted arylcarbonyl group, and an unsubstituted aralkylcarbonyl group.

The unsubstituted alkylcarbonyl group may be linear or branched. The unsubstituted alkylcarbonyl group has usually 1 to 20 carbon atoms, preferably 1 to 15 carbon atoms, and more preferably 1 to 10 carbon atoms. Examples of the unsubstituted alkylcarbonyl group may include a formyl group, an acetyl group, an ethylcarbonyl group, a propylcarbonyl group, an isopropylcarbonyl group, a butylcarbonyl group, an isobutylcarbonyl group, a sec-butylcarbonyl group, a tert-butylcarbonyl group, a pentylcarbonyl group, a hexylcarbonyl group, a heptylcarbonyl group, an octylcarbonyl group, a 2-ethylhexylcarbonyl group, a nonylcarbonyl group, a decylcarbonyl group, a 3,7-dimethyloctylcarbonyl group, and a dodecylcarbonyl group. Examples of the substituted alkylcarbonyl group may include a trifluoromethylcarbonyl group.

The unsubstituted cycloalkylcarbonyl group has usually 4 to 50 carbon atoms, and examples thereof may include a cyclopropylcarbonyl group, a cyclobutylcarbonyl group, a cyclopentylcarbonyl group, a cyclohexylcarbonyl group, a cyclononylcarbonyl group, and a cyclododecylcarbonyl group.

The unsubstituted bicycloalkylcarbonyl group has usually 5 to 50 carbon atoms, and examples thereof may include a norbornylcarbonyl group and an adamantylcarbonyl group.

The unsubstituted alkenylcarbonyl group has usually 2 to 50 carbon atoms, and examples thereof may include an ethenylcarbonyl group, a propenylcarbonyl group, a 3-butenylcarbonyl group, a 2-butenylcarbonyl group, a 2-pentenylcarbonyl group, a 2-hexenylcarbonyl group, a 2-nonenylcarbonyl group, and a 2-dodecenylcarbonyl group.

The unsubstituted arylcarbonyl group has usually 6 to 50 carbon atoms, and examples thereof may include a phenylcarbonyl group, a 1-naphthylcarbonyl group, a 2-naphthylcarbonyl group, a 2-methylphenylcarbonyl group, a 3-methylphenylcarbonyl group, a 4-methylphenylcarbonyl group, a 4-ethylphenylcarbonyl group, a 4-propylphenylcarbonyl group, a 4-isopropylphenylcarbonyl group, a 4-butylphenylcarbonyl group, a 4-tert-butylphenylcarbonyl group, a 4-hexylphenylcarbonyl group, a 4-cyclohexylphenylcarbonyl group, a 4-adamantylphenylcarbonyl group, and a 4-phenylphenylcarbonyl group.

The unsubstituted aralkylcarbonyl group has usually 7 to 50 carbon atoms, and examples thereof may include a phenylmethylcarbonyl group, a 1-phenylethylcarbonyl group, a 2-phenylethylcarbonyl group, a 1-phenyl-1-propylcarbonyl group, a 1-phenyl-2-propylcarbonyl group, a 2-phenyl-2-propylcarbonyl group, a 3-phenyl-1-propylcarbonyl group, a 4-phenyl-1-butylcarbonyl group, a 5-phenyl-1-pentylcarbonyl group, and a 6-phenyl-1-hexylcarbonyl group.

The "monohydrocarbylamino group," the "dihydrocarbylamino group," the "monohydrocarbylphosphino group," and the "dihydrocarbylphosphino group" means a substituted or unsubstituted monohydrocarbylamino group, a substituted or unsubstituted dihydrocarbylamino group, a substituted or unsubstituted monohydrocarbylphosphino group, and a substituted or unsubstituted dihydrocarbylphosphino group, respectively.

The "monohydrocarbylamino group" means an unsubstituted monohydrocarbylamino group and a substituted monohydrocarbylamino group in which a part or all of hydrogen atoms in the unsubstituted monohydrocarbylamino group are substituted with a halogen atom, a mercapto group, or the like. The monohydrocarbylamino group is also referred to as "mono(substituted or unsubstituted hydrocarbyl)amino group."

Examples of the unsubstituted monohydrocarbylamino group may include unsubstituted alkylamino groups, unsubstituted cycloalkylamino groups, unsubstituted bicycloalkylamino groups, unsubstituted alkenylamino groups, unsubstituted arylamino groups, and unsubstituted aralkylamino groups.

The unsubstituted alkylamino group may be linear or branched. The unsubstituted alkylamino group has usually 1 to 20 carbon atoms, preferably 1 to 15 carbon atoms, and more preferably 1 to 10 carbon atoms. Examples of the unsubstituted alkylamino group may include a methylamino group, an ethylamino group, a propylamino group, an isopropylamino group, a butylamino group, an isobutylamino group, a sec-butylamino group, a tert-butylamino group, a pentylamino group, a hexylamino group, a heptylamino group, an octylamino group, a 2-ethylhexylamino group, a nonylamino group, a decylamino group, a 3,7-dimethyloctylamino group, and a dodecylamino group. Examples of the substituted alkylamino group may include a trifluoromethylamino group.

The unsubstituted cycloalkylamino group has usually 3 to 50 carbon atoms, and examples thereof may include a cyclopropylamino group, a cyclobutylamino group, a cyclopentylamino group, a cyclohexylamino group, a cyclononylamino group, and a cyclododecylamino group.

The unsubstituted bicycloalkylamino group has usually 4 to 50 carbon atoms, and examples thereof may include a norbornylamino group and an adamantylamino group.

The unsubstituted alkenylamino group has usually 2 to 50 carbon atoms, and examples thereof may include an ethenylamino group, a propenylamino group, a 3-butenylamino group, a 2-butenylamino group, a 2-pentenylamino group, a 2-hexenylamino group, a 2-nonenylamino group, and a 2-dodecenylamino group.

The unsubstituted arylamino group has usually 6 to 50 carbon atoms, and examples thereof may include a phenylamino group, a 1-naphthylamino group, a 2-naphthylamino group, a 2-methylphenylamino group, a 3-methylphenylamino group, a 4-methylphenylamino group, a 4-ethylphenylamino group, a 4-propylphenylamino group, a 4-isopropylphenylamino group, a 4-butylphenylamino group, a 4-tert-butylphenylamino group, a 4-hexylphenylamino group, a 4-cyclohexylphenylamino group, a 4-adamantylphenylamino group, and a 4-phenylphenylamino group.

The unsubstituted aralkylamino group has usually 7 to 50 carbon atoms, and examples thereof may include a phenylmethylamino group, a 1-phenylethylamino group, a 2-phenylethylamino group, a 1-phenyl-1-propylamino group, a 1-phenyl-2-propylamino group, a 2-phenyl-2-propylamino group, a 3-phenyl-1-propylamino group, a 4-phenyl-1-butylamino group, a 5-phenyl-1-pentylamino group, and a 6-phenyl-1-hexylamino group.

The "dihydrocarbylamino group" may be an amino group in which two hydrogen atoms are substituted with the same type or different type of monovalent hydrocarbon group having 1 to 20 carbon atoms, and examples thereof may include: dialkylamino groups such as a dimethylamino group, a diethylamino group, a methylethylamino group, a dipropylamino group, a methylpropylamino group, a diisopropylamino group, a dibutylamino group, a methylbutylamino group, a diisobutylamino group, a di-sec-butylamino group, a di-tert-butylamino group, a dipentylamino group, a dihexylamino group, an ethylhexylamino group, a diheptylamino group, a dioctylamino group, a dinonylamino group, and a didecylamino group; alkylarylamino groups such as a methylphenylamino group and an ethylphenylamino group; and diarylamino groups such as a di(4-methylphenyl)amino group, a di(2,3-xylyl)amino group, a diphenylamino group, and a phenyltolylamino group. The dihydrocarbylamino group is also referred to as "di(substituted or unsubstituted hydrocarbyl)amino group."

Further examples of the dihydrocarbylamino group may include 5- and 6-membered cyclic amino groups such as a 1-pyrrolidinyl group, a 3-methyl-1-pyrrolidinyl group, a 1-pyrrolyl group, a 3-ethyl-1-pyrrolyl group, a 1-indolyl group, a 1-piperidinyl group, a 3-methyl-1-piperidinyl group, a 1-piperazinyl group, a 4-methyl-1-piperazinyl group, a 1-imidazolidinyl group, and a 4-morpholinyl group.

The "monohydrocarbylphosphino group" means an unsubstituted monohydrocarbylphosphino group and a substituted monohydrocarbylphosphino group in which a part or all of hydrogen atoms in the unsubstituted monohydrocarbylphosphino groups are substituted with a halogen atom, a mercapto group, or the like. The monohydrocarbylphosphino group is also referred to as "mono(substituted or unsubstituted hydrocarbyl)phosphino group."

Examples of the unsubstituted monohydrocarbylphosphino group may include an unsubstituted alkylphosphino group, an unsubstituted cycloalkylphosphino group, an unsubstituted bicycloalkylphosphino group, an unsubstituted alkenylphosphino group, an unsubstituted arylphosphino group, and an unsubstituted aralkylphosphino group.

The unsubstituted alkylphosphino group may be linear or branched. The unsubstituted alkylphosphino group has usually 1 to 20 carbon atoms, preferably 1 to 15 carbon atoms, and more preferably 1 to 10 carbon atoms. Examples of the unsubstituted alkylphosphino group may include a methylphosphino group, an ethylphosphino group, a propylphosphino group, an isopropylphosphino group, a butylphosphino group, an isobutylphosphino group, a sec-butylphosphino group, a tert-butylphosphino group, a pentylphosphino group, a hexylphosphino group, a heptylphosphino group, an octylphosphino group, a 2-ethylhexylphosphino group, a nonylphosphino group, a decylphosphino group, a 3,7-dimethyloctylphosphino group, and a dodecylphosphino group. Examples of the substituted alkylphosphino group may include a trifluoromethylphosphino group.

The unsubstituted cycloalkylphosphino group has usually 3 to 50 carbon atoms, and examples thereof may include a cyclopropylphosphino group, a cyclobutylphosphino group, a cyclopentylphosphino group, a cyclohexylphosphino group, a cyclononylphosphino group, and a cyclododecylphosphino group.

The unsubstituted bicycloalkylphosphino group has usually 4 to 50 carbon atoms and examples thereof may include a norbornylphosphino group and an adamantylphosphino group.

The unsubstituted alkenylphosphino group has usually 2 to 50 carbon atoms, and examples thereof may include an ethenylphosphino group, a propenylphosphino group, a 3-butenylphosphino group, a 2-butenylphosphino group, a 2-pentenylphosphino group, a 2-hexenylphosphino group, a 2-nonenylphosphino group, and a 2-dodecenylphosphino group.

The unsubstituted arylphosphino group has usually 6 to 50 carbon atoms, and examples thereof may include a phenylphosphino group, a 1-naphthylphosphino group, a 2-naphthylphosphino group, a 2-methylphenylphosphino group, a 3-methylphenylphosphino group, a 4-methylphenylphosphino group, a 4-ethylphenylphosphino group, a 4-propylphenylphosphino group, a 4-isopropylphenylphosphino group, a 4-butylphenylphosphino group, a 4-tert-butylphenylphosphino group, a 4-hexylphenylphosphino group, a 4-cyclohexylphenylphosphino group, a 4-adamantylphenylphosphino group, and a 4-phenylphenylphosphino group.

The unsubstituted aralkylphosphino group has usually 7 to 50 carbon atoms, and examples thereof may include a phenylmethylphosphino group, a 1-phenylethylphosphino group, a 2-phenylethylphosphino group, a 1-phenyl-1-propylphosphino group, a 1-phenyl-2-propylphosphino group, a 2-phenyl-2-propylphosphino group, a 3-phenyl-1-propylphosphino group, a 4-phenyl-1-butylphosphino group, a 5-phenyl-1-pentylphosphino group, and a 6-phenyl-1-hexylphosphino group.

The "dihydrocarbylphosphino group" means an unsubstituted dihydrocarbylphosphino group and a substituted dihydrocarbylphosphino group in which a part or all of hydrogen atoms in the unsubstituted dihydrocarbylphosphino group are substituted with a halogen atom, a mercapto group, or the like. The dihydrocarbylphosphino group is also referred to as "di(substituted or unsubstituted hydrocarbyl)phosphino group."

The unsubstituted dihydrocarbylphosphino group may be a phosphino group in which two hydrogen atoms in the phosphino group are substituted with the same type or different type of monovalent hydrocarbon group having 1 to 20 carbon atoms, and examples thereof may include a dimethylphosphino group, a diethylphosphino group, a methylethylphosphino group, a dipropylphosphino group, a methylpropylphosphino group, a diisopropylphosphino group, a dibutylphosphino group, a methylbutylphosphino group, a diisobutylphosphino group, a di-sec-butylphosphino group, a di-tert-butylphosphino group, a dipentylphosphino group, a dihexylphosphino group, an ethylhexylphosphino group, a diheptylphosphino group, a dioctylphosphino group, a dinonylphosphino group, a didecylphosphino group, a diphenylphosphino group, a methylphenylphosphino group, an ethylphenylphosphino group, a di-4-methylphenylphosphino group, a di-2,3-xylylphosphino group, and a phenyltolylphosphino group.

The "monovalent heterocyclic group" is an atomic group remaining after removing one hydrogen atom directly bonding to a carbon atom that constitutes a ring of a heterocyclic compound. Examples of the heterocyclic ring may include a pyridine ring, a pyrrolidone ring, a 1,2-diazine ring, a 1,3-diazine ring, a 1,4-diazine ring, a 1,3,5-triazine ring, a furan ring, a pyrrole ring, a thiophene ring, a pyrazole ring, an imidazole ring, an oxazole ring, a thiazole ring, an oxadiazole ring, a thiadiazole ring, and an azadiazole ring. Of these, a pyridine ring, a 1,2-diazine ring, a 1,3-diazine ring, a 1,4-diazine ring, or a 1,3,5-triazine ring is preferred, and a pyridine ring or a 1,3,5-triazine ring is more preferred.

A part or all of hydrogen atoms in the monovalent heterocyclic group may be substituted with a halogen atom, a monovalent hydrocarbon group, or the like. The monovalent heterocyclic group is preferably a monovalent aromatic heterocyclic group.

In the "group represented by formula: —COOM," the "group represented by formula: —PO$_3$M," and the "group represented by formula: —SO$_3$M," M represents a metal cation or a substituted or unsubstituted ammonium cation.

The metal cation is preferably a monovalent, divalent, or trivalent ion, and examples thereof may include ions of metals such as Li, Na, K, Cs, Be, Mg, Ca, Ba, Ag, Al, Bi, Cu, Fe, Ga, Mn, Pb, Sn, Ti, V, W, Y, Yb, Zn, and Zr.

Examples of the substituent that the ammonium cation optionally has may include alkyl groups having 1 to 10 carbon atoms such as a methyl group, an ethyl group, a propyl group, an isopropyl group, an n-butyl group, an isobutyl group, and a tert-butyl group.

In the group represented by formula: —COOM, formula: —PO$_3$M, or formula: —SO$_3$M, a metal cation other than M or an anion may be involved so that the charge of the entire group is neutralized. In such a case, the cation of other metal than M is the same as the above metal cations.

Examples of the anion may include F$^-$, Cl$^-$, Br$^-$, I$^-$, OH$^-$, ClO$^-$, ClO$_2^-$, ClO$_3^-$, ClO$_4^-$, BF$_4^-$, PF$_6^-$, an 8-quinolinolato anion, a 2-methyl-8-quinolinolato anion, and a 2-phenyl-8-quinolinolato anion. An 8-quinolinolato anion or a 2-methyl-8-quinolinolato anion is preferred.

In formula: —NR$_3$M', R represents a hydrogen atom or a monovalent hydrocarbon group.

In formula: —NR$_3$M', M' represents an anion. The anion is as described above.

The hetero atom-containing group represented by X$^1$ in Formula (I) and X$^2$ in Formula (II) is preferably a group containing at least one hetero atom selected from the group consisting of a sulfur atom, an oxygen atom, a nitrogen atom, a phosphorus atom, and halogen atoms, because good adsorptivity and good dispersibility in a solvent are achieved.

More preferred examples of such a hetero atom-containing group may include a mercapto group, a mercaptocarbonyl group, a mercaptothiocarbonyl group, a hydrocarbylthio group, a hydrocarbylthiocarbonyl group, a hydrocarbyldithio group, a hydroxyl group, a hydrocarbyloxy group, a carboxyl group, a hydrocarbylcarbonyl group, a cyano group, an amino group, a pyrrolidonyl group, a monohydrocarbylamino group, a dihydrocarbylamino group, a phosphino group, a monohydrocarbylphosphino group, a dihydrocarbylphosphino group, a group represented by formula: —P(=O)(OH)$_2$, a sulfo group, a monovalent heterocyclic group, a group represented by formula: —COOM, a group represented by formula: —SO$_3$M, a group represented by formula: —NR$_3$M', a halogen atom, a formyl group, a hydrocarbyloxycarbonyl group, a hydrocarbylcarbonyloxy group, a nitro group, a group represented by formula: —OP(=O) (OH)$_2$, a carbamoyl group, a monohydrocarbylcarbamoyl group, a dihydrocarbylcarbamoyl group, a group represented by formula: —C(=S)NR$_2$, a group represented by formula: —B(OH)$_2$, a group represented by formula: —BR$_2$, a boric acid ester residue represented by formula:

[Chem.6]

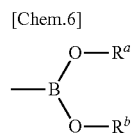

wherein R$^a$ and R$^b$ are each independently a monovalent hydrocarbon group, or R$^a$ and R$^b$ are combined together to form a divalent hydrocarbon group;
a group represented by formula: —Si(OR)$_3$, a hydrocarbylsulfo group, a group represented by formula: —S(=O)$_2$R, a sulfino group, a hydrocarbylsulfino group, a group represented by formula: —NRC(=O)OR, a group represented by formula: —NRC(=O)SR, a group represented by formula: —NRC(=S)OR, a group represented by formula: —NRC(=S)SR, a group represented by formula: —OC(=O)NR$_2$, a group represented by formula: —SC(=O)NR$_2$, a group represented by formula: —OC(=S)NR$_2$, a group represented by formula: —SC(=S)NR$_2$, a group represented by formula: —NRC(=O)NR$_2$, a group represented by formula: —NRC(=S)NR$_2$, a group represented by formula: —SM, a group represented by formula: —C(=O)SM, a group represented by formula: —CS$_2$M, a group represented by formula: —OM, a group represented by formula: —NM$_2$, a group represented by formula: —NRM, a group represented by formula: —OP(=O) (OM)$_2$, a group represented by formula: —P(=O) (OM)$_2$, a group represented by formula: —C(=O)NM$_2$, a group represented by formula: —C(=O)NRM, a group represented by formula: —C(=S)NRM, a group represented by formula: —C(=S)NM$_2$, a group represented by formula: —B(OM)$_2$, a group represented by formula: —BR$_3$M, a group represented by formula: —B(OR)$_3$M, a group represented by formula: —S(=O)$_2$M, a group represented by formula: —S(=O)OM, a group represented by formula: —NRC(=O)OM, a group represented by formula: —NRC(=O)SM, a group represented by formula: —NRC(=S)OM, a group represented by formula: —NRC(=S)SM, a group represented by formula: —OC(=O)NM$_2$, a group represented by formula: —OC(=O)NRM, a group represented by formula: —OC(=S)NM$_2$, a group represented by formula: —OC(=S)NRM, a group represented by formula: —SC(=O)NM$_2$, a group represented by formula: —SC(=O)NRM, a group represented by formula: —SC(=S)NM$_2$, a group represented by formula: —SC(=S)NRM, a group represented by formula: —NRC(=O)NM$_2$, a group represented by formula: —NRC(=O)NRM, a group represented by formula: —NRC(=S)NM$_2$, a group represented by formula: —NRC(=S)NRM, a group represented by formula: —PR$_3$M', a group represented by formula: —OR$_2$M', a group represented by formula:

—SR$_2$M', a group represented by formula: —IRM', an atomic group remaining after removing one hydrogen atom directly bonding to a carbon atom that constitutes a ring of an aromatic compound represented by any one of Formulae (n-1) to (n-13) below:

[Chem. 7]

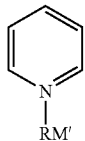
(n-1)

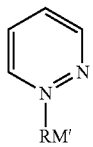
(n-2)

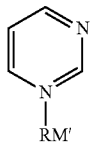
(n-3)

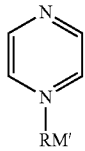
(n-4)

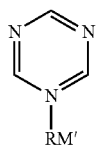
(n-5)

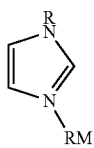
(n-6)

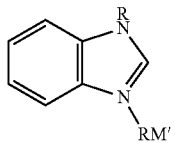
(n-7)

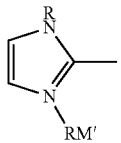
(n-8)

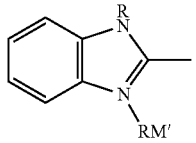
(n-9)

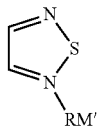
(n-10)

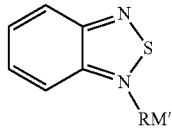
(n-11)

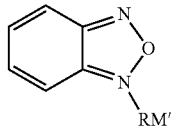
(n-12)

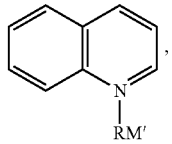
(n-13)

and a monovalent group represented by any one of Formulae (p-1) to (p-9) below:

$$—O—(R'O)_m—R''  \quad (p\text{-}1)$$

[Chem. 8]

$$—R'''\begin{array}{c}—O\\(OR')_m\end{array} \quad (p\text{-}2)$$

$$—S—(R'S)_q—R'' \quad (p\text{-}3)$$

$$—C(=O)—(R'—C(=O))_q—R'' \quad (p\text{-}4)$$

$$—C(=S)—(R'—C(=S))_q—R'' \quad (p\text{-}5)$$

$$—N\{R'\}_qR''\}_2 \quad (p\text{-}6)$$

$$—C(=O)O—(R'—C(=O)O)_q—R'' \quad (p\text{-}7)$$

$$—C(=O)—O—(R'O)_q—R'' \quad (p\text{-}8)$$

$$—NHC(=O)—(R'NHC(=O))_q—R'', \quad (p\text{-}9)$$

wherein R represents a hydrogen atom or a monovalent hydrocarbon group; M represents a metal cation or a substituted or unsubstituted ammonium cation; M' represents an anion; R' represents a substituted or unsubstituted divalent hydrocarbon group; R" represents a hydrogen atom, a substituted or unsubstituted monovalent hydrocarbon group, a carboxyl group, a sulfo group, a hydroxyl group, a group represented by formula: —SH, a group represented by formula: —NR$^c_2$, a cyano group, or a group represented by formula: —C(=O)NR$^c_2$, wherein R$^c$ represents a substituted or unsubstituted alkyl group having 1 to 30 carbon atoms or a substituted or unsubstituted aryl group having 6 to 50 carbon atoms; R''' represents a substituted or unsubstituted trivalent hydrocarbon group; m represents an integer of 1 or more; q represents an integer of 0 or more; and when R', R'', and R''' are each plurally present, they may be the same as or different from each other.

The hetero atom-containing group may be used alone or in combination of two or more types thereof.

Among the hetero atom-containing groups, a mercapto group, a hydrocarbylthio group, a hydrocarbyldithio group, a hydroxyl group, a hydrocarbyloxy group, a carboxyl group, a hydrocarbylcarbonyl group, a cyano group, an amino group, a monohydrocarbylamino group, a dihydrocarbylamino group, a group represented by formula: —P(=O)(OH)$_2$, a sulfo group, a monovalent heterocyclic group, a group represented by formula: —COOM, a group represented by formula: —SO$_3$M, a group represented by a group represented by formula: —NR$_3$M', a halogen atom, a formyl group, a nitro group, a group represented by formula: —OP(=O) (OH)$_2$, a carbamoyl group, a group represented by Formula (n-1), a group represented by Formula (n-5), a group represented by Formula (p-1), or a group represented by Formula (p-2) is further preferred, a mercapto group, a hydroxyl group, a carboxyl group, a cyano group, an amino group, a group represented by formula: —P(=O) (OH)$_2$, a sulfo group, a monovalent heterocyclic group, a group represented by formula: —COOM, a group represented by formula: —SO$_3$M, a group represented by formula: —NR$_3$M', a group represented by Formula (p-1), or a group represented by Formula (p-2) is particularly preferred, and a mercapto group, a hydroxyl group, a carboxyl group, a cyano group, an amino group, a pyrrolidonyl group, a sulfo group, a pyridinyl group, a group represented by formula: —COOM, a group represented by Formula (p-1), or a group represented by Formula (p-2) is more particularly preferred. Of these, a hydroxyl group, a carboxyl group, an amino group, a pyrrolidonyl group, a pyridinyl group, a group represented by formula: —COOM, a group represented by Formula (p-1), or a group represented by Formula (p-2) is yet more preferred, and a pyrrolidonyl group, a group represented by formula: —COOM, a group represented by Formula (p-1), or a group represented by Formula (p-2) is most preferred.

A part of the hetero atom-containing groups shown above are the same as described for the substituents that Ar$^1$ and Ar$^2$ optionally have. Other hetero atom-containing groups are used with the following meanings in the present description.

The "hydrocarbyloxycarbonyl group" means an unsubstituted hydrocarbyloxycarbonyl group and a substituted hydrocarbyloxycarbonyl group in which a part or all of hydrogen atoms in the unsubstituted hydrocarbyloxycarbonyl group are substituted with a halogen atom, a mercapto group, or the like.

Examples of the unsubstituted hydrocarbyloxycarbonyl group may include an unsubstituted alkoxycarbonyl group, an unsubstituted cycloalkoxycarbonyl group, an unsubstituted bicycloalkoxycarbonyl group, an unsubstituted alkenyloxycarbonyl group, an unsubstituted aryloxycarbonyl group, and an unsubstituted aralkyloxycarbonyl group.

The unsubstituted alkoxycarbonyl group may be linear or branched. The unsubstituted alkoxycarbonyl group has usually 1 to 20 carbon atoms, preferably 1 to 15 carbon atoms, and more preferably 1 to 10 carbon atoms. Examples of the unsubstituted alkoxycarbonyl group may include a methoxycarbonyl group, an ethoxycarbonyl group, a propyloxycarbonyl group, an isopropyloxycarbonyl group, a butoxycarbonyl group, an isobutoxycarbonyl group, a sec-butoxycarbonyl group, a tert-butoxycarbonyl group, a pentyloxycarbonyl group, a hexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, and a dodecyloxycarbonyl group. Examples of the substituted alkoxycarbonyl group may include a trifluoromethoxycarbonyl group.

The unsubstituted cycloalkoxycarbonyl group has usually 4 to 50 carbon atoms, and examples thereof may include a cyclopropyloxycarbonyl group, a cyclobutoxycarbonyl group, a cyclopentyloxycarbonyl group, a cyclohexyloxycarbonyl group, a cyclononyloxycarbonyl group, and a cyclododecyloxycarbonyl group.

The unsubstituted bicycloalkoxycarbonyl group has usually 5 to 50 carbon atoms, and examples thereof may include a norbornyloxycarbonyl group and an adamantyloxycarbonyl group.

The unsubstituted alkenyloxycarbonyl group has usually 2 to 50 carbon atoms, and examples thereof may include an ethenyloxycarbonyl group, a propenyloxycarbonyl group, a 3-butenyloxycarbonyl group, a 2-butenyloxycarbonyl group, a 2-pentenyloxycarbonyl group, a 2-hexenyloxycarbonyl group, a 2-nonenyloxycarbonyl group, and a 2-dodecenyloxycarbonyl group.

The unsubstituted aryloxycarbonyl group has usually 6 to 50 carbon atoms, and examples thereof may include a phenoxycarbonyl group, a 1-naphthyloxycarbonyl group, a 2-naphthyloxycarbonyl group, a 2-methylphenoxycarbonyl group, a 3-methylphenoxycarbonyl group, a 4-methylphenoxycarbonyl group, a 4-ethylphenoxycarbonyl group, a 4-propylphenoxycarbonyl group, a 4-isopropylphenoxycarbonyl group, a 4-butylphenoxycarbonyl group, a 4-tert-butylphenoxycarbonyl group, a 4-hexylphenoxycarbonyl group, a 4-cyclohexylphenoxycarbonyl group, a 4-adamantylphenoxycarbonyl group, and a 4-phenylphenoxycarbonyl group.

The unsubstituted aralkyloxycarbonyl group has usually 7 to 50 carbon atoms, and examples thereof may include a phenylmethoxycarbonyl group, a 1-phenylethoxycarbonyl group, a 2-phenylethoxycarbonyl group, a 1-phenyl-1-propyloxycarbonyl group, a 1-phenyl-2-propyloxycarbonyl group, a 2-phenyl-2-propyloxycarbonyl group, a 3-phenyl-1-propyloxycarbonyl group, a 4-phenyl-1-butoxycarbonyl group, a 5-phenyl-1-pentyloxycarbonyl group, and a 6-phenyl-1-hexyloxycarbonyl group.

The "hydrocarbylcarbonyloxy group" means an unsubstituted hydrocarbylcarbonyloxy group and a substituted hydrocarbylcarbonyloxy group in which a part or all of hydrogen atoms in the unsubstituted hydrocarbylcarbonyloxy group are substituted with a halogen atom, a mercapto group, or the like.

Examples of the unsubstituted hydrocarbylcarbonyloxy group may include an unsubstituted alkylcarbonyloxy group, an unsubstituted cycloalkylcarbonyloxy group, an unsubstituted bicycloalkylcarbonyloxy group, an unsubstituted alkenylcarbonyloxy group, an unsubstituted arylcarbonyloxy group, and an unsubstituted aralkylcarbonyloxy group.

The unsubstituted alkylcarbonyloxy group may be linear or branched. The unsubstituted alkylcarbonyloxy group has usually 1 to 20 carbon atoms, preferably 1 to 15 carbon atoms, and more preferably 1 to 10 carbon atoms. Examples of the unsubstituted alkylcarbonyloxy group may include a methylcarbonyloxy group, an ethylcarbonyloxy group, a propylcarbonyloxy group, an isopropylcarbonyloxy group, a butylcarbonyloxy group, an isobutylcarbonyloxy group, a sec-butylcarbonyloxy group, a tert-butylcarbonyloxy group, a pentylcarbonyloxy group, a hexylcarbonyloxy group, a heptylcarbonyloxy group, an octylcarbonyloxy group, a 2-ethylhexylcarbonyloxy group, a nonylcarbonyloxy group, a decylcarbonyloxy group, a 3,7-dimethyloctylcarbonyloxy group, and a dodecylcarbonyloxy group. Examples of the substituted alkylcarbonyloxy group may include a trifluoromethylcarbonyloxy group.

The unsubstituted cycloalkylcarbonyloxy group has usually 4 to 50 carbon atoms, and examples thereof may include a cyclopropylcarbonyloxy group, a cyclobutylcarbonyloxy group, a cyclopentylcarbonyloxy group, a cyclohexylcarbonyloxy group, a cyclononylcarbonyloxy group, and a cyclododecylcarbonyloxy group.

The unsubstituted bicycloalkylcarbonyloxy group has usually 5 to 50 carbon atoms, and examples thereof may include a norbornylcarbonyloxy group and an adamantylcarbonyloxy group.

The unsubstituted alkenylcarbonyloxy group has usually 2 to 50 carbon atoms, and examples thereof may include an ethenylcarbonyloxy group, a propenylcarbonyloxy group, a 3-butenylcarbonyloxy group, a 2-butenylcarbonyloxy group, a 2-pentenylcarbonyloxy group, a 2-hexenylcarbonyloxy group, a 2-nonenylcarbonyloxy group, and a 2-dodecenylcarbonyloxy group.

The unsubstituted arylcarbonyloxy groups has usually 6 to 50 carbon atoms, and examples thereof may include a phenylcarbonyloxy group, a 1-naphthylcarbonyloxy group, a 2-naphthylcarbonyloxy group, a 2-methylphenylcarbonyloxy group, a 3-methylphenylcarbonyloxy group, a 4-methylphenylcarbonyloxy group, a 4-ethylphenylcarbonyloxy group, a 4-propylphenylcarbonyloxy group, a 4-isopropylphenylcarbonyloxy group, a 4-butylphenylcarbonyloxy group, a 4-tert-butylphenylcarbonyloxy group, a 4-hexylphenylcarbonyloxy group, a 4-cyclohexylphenylcarbonyloxy group, a 4-adamantylphenylcarbonyloxy group, and a 4-phenylphenylcarbonyloxy group.

The unsubstituted aralkylcarbonyloxy group has usually 7 to 50 carbon atoms, and examples thereof may include a phenylmethylcarbonyloxy group, a 1-phenylethylcarbonyloxy group, a 2-phenylethylcarbonyloxy group, a 1-phenylpropylcarbonyloxy group, a 2-phenyl-1-methylethylpropylcarbonyloxy group, a 1-phenyl-1-methylethylcarbonyloxy group, a 3-phenylpropylcarbonyloxy group, a 4-phenylbutylcarbonyloxy group, a 5-phenylpentylcarbonyloxy group, and a 6-phenylhexylcarbonyloxy group.

The "monohydrocarbylcarbamoyl group" means an unsubstituted hydrocarbylcarbamoyl group and a substituted hydrocarbylcarbamoyl group in which a part or all of hydrogen atoms in the unsubstituted monohydrocarbylcarbamoyl group are substituted with a halogen atom, a mercapto group, or the like. The monohydrocarbylcarbamoyl group is also referred to as "mono(substituted or unsubstituted hydrocarbyl)carbamoyl group."

Examples of the unsubstituted hydrocarbylcarbamoyl group may include an unsubstituted alkylcarbamoyl group, an unsubstituted cycloalkylcarbamoyl group, an unsubstituted bicycloalkylcarbamoyl group, an unsubstituted alkenylcarbamoyl group, an unsubstituted arylcarbamoyl group, and an unsubstituted aralkylcarbamoyl group.

The unsubstituted alkylcarbamoyl group may be linear or branched. The unsubstituted alkylcarbamoyl group has usually 1 to 20 carbon atoms, preferably 1 to 15 carbon atoms, and more preferably 1 to 10 carbon atoms. Examples of the unsubstituted alkylcarbamoyl group may include an N-methylcarbamoyl group, an N-ethylcarbamoyl group, an N-propylcarbamoyl group, an N-isopropylcarbamoyl group, an N-butylcarbamoyl group, an N-isobutylcarbamoyl group, an N-sec-butylcarbamoyl group, an N-tert-butylcarbamoyl group, an N-pentylcarbamoyl group, an N-hexylcarbamoyl group, an N-heptylcarbamoyl group, an N-octylcarbamoyl group, an N-2-ethylhexylcarbamoyl group, an N-nonylcarbamoyl group, an N-decylcarbamoyl group, an N-3,7-dimethyloctylcarbamoyl group, and an N-dodecylcarbamoyl group. Examples of the substituted hydrocarbylcarbamoyl group may include an N-trifluoromethylcarbamoyl group.

The unsubstituted cycloalkylcarbamoyl group has usually 4 to 50 carbon atoms, and examples thereof may include an N-cyclopropylcarbamoyl group, an N-cyclobutylcarbamoyl group, an N-cyclopentylcarbamoyl group, an N-cyclohexylcarbamoyl group, an N-cyclononylcarbamoyl group, and an N-cyclododecylcarbamoyl group.

The unsubstituted bicycloalkylcarbamoyl group has usually 5 to 50 carbon atoms, and examples thereof may include an N-norbornylcarbamoyl group and an N-adamantylcarbamoyl group.

The unsubstituted alkenylcarbamoyl group has usually 2 to 50 carbon atoms, and examples thereof may include an N-ethenylcarbamoyl group, an N-propenylcarbamoyl group, an N-3-butenylcarbamoyl group, an N-2-butenylcarbamoyl group, an N-2-pentenylcarbamoyl group, an N-2-hexenylcarbamoyl group, an N-2-nonenylcarbamoyl group, and an N-2-dodecenylcarbamoyl group.

The unsubstituted arylcarbamoyl group has usually 6 to 50 carbon atoms, and examples thereof may include an N-phenylcarbamoyl group, an N-1-naphthylcarbamoyl group, an N-(2-naphthyl)carbamoyl group, an N-(2-methylphenyl)carbamoyl group, an N-(3-methylphenyl)carbamoyl group, an N-(4-methylphenyl)carbamoyl group, an N-(4-ethylphenyl)carbamoyl group, an N-(4-propylphenyl)carbamoyl group, an N-(4-isopropylphenyl)carbamoyl group, an N-(4-butylphenyl)carbamoyl group, an N-(4-tert-butylphenyl)carbamoyl group, an N-(4-hexylphenyl)carbamoyl group, an N-(4-cyclohexylphenyl)carbamoyl group, an N-(4-adamantylphenyl)carbamoyl group, and an N-(4-phenylphenyl)carbamoyl group.

The unsubstituted aralkylcarbamoyl group has usually 7 to 50 carbon atoms, and examples thereof may include an N-phenylmethylcarbamoyl group, an N-(1-phenylethyl)carbamoyl group, an N-(2-phenylethyl)carbamoyl group, an N-(1-phenylpropyl)carbamoyl group, an N-(2-phenyl-1-methylethyl)carbamoyl group, an N-(1-phenyl-1-methylethyl)carbamoyl group, an N-(3-phenylpropyl)carbamoyl group, an N-(4-phenylbutyl)carbamoyl group, an N-(5-phenylpentyl)carbamoyl group, and an N-(6-phenylhexyl)carbamoyl group.

The "dihydrocarbylcarbamoyl group" means an unsubstituted dihydrocarbylcarbamoyl group and a substituted dihydrocarbylcarbamoyl group in which a part or all of hydrogen atoms in the unsubstituted dihydrocarbylcarbamoyl group are substituted with a halogen atom, a mercapto group, or the like. The dihydrocarbylcarbamoyl group is also referred to as "di(substituted or unsubstituted hydrocarbyl)carbamoyl group."

Examples of the unsubstituted dihydrocarbylcarbamoyl group may include an unsubstituted dialkylcarbamoyl group, an unsubstituted dicycloalkylcarbamoyl group, an unsubstituted bisbicycloalkylcarbamoyl group, an unsubstituted dialkenylcarbamoyl group, an unsubstituted diarylcarbamoyl group, an unsubstituted diaralkylcarbamoyl group, and an unsubstituted N-alkyl-N-arylcarbamoyl group.

The unsubstituted dialkylcarbamoyl group may be linear or branched. The unsubstituted dialkylcarbamoyl group has usually 1 to 20 carbon atoms, preferably 1 to 15 carbon atoms, and more preferably 1 to 10 carbon atoms. Examples of the unsubstituted dialkylcarbamoyl group may include an N,N-dimethylcarbamoyl group, an N,N-diethylcarbamoyl group, an N,N-dipropylcarbamoyl group, an N,N-diisopropylcarbamoyl group, an N,N-dibutylcarbamoyl group, an N,N-diisobutylcarbamoyl group, an N,N-di-sec-butylcarbamoyl group, an N,N-di-tert-butylcarbamoyl group, an N,N-dipentylcarbamoyl group, an N,N-dihexylcarbamoyl group, an N,N-diheptylcarbamoyl group, an N,N-dioctylcarbamoyl group, an N,N-di(2-ethylhexyl) carbamoyl group, an N,N-dinonylcarbamoyl group, an N,N-didecylcarbamoyl group, an N,N-di-3,7-dimethyloctylcarbamoyl group, an N,N-didodecylcarbamoyl group, an N-ethyl-N-methylcarbamoyl group, and an N-ethyl-N-propylcarbamoyl group. Examples of the substituted dihydrocarbylcarbamoyl group may include an N,N-bis(trifluoromethyl)carbamoyl group.

The unsubstituted dicycloalkylcarbamoyl group has usually 7 to 50 carbon atoms, and examples thereof may include an N,N-dicyclopropylcarbamoyl group, an N,N-dicyclobutylcarbamoyl group, an N,N-dicyclopentylcarbamoyl group, an N,N-dicyclohexylcarbamoyl group, an N,N-dicyclononylcarbamoyl group, and an N,N-dicyclododecylcarbamoyl group.

The unsubstituted bisbicycloalkylcarbamoyl group has usually 9 to 50 carbon atoms, and examples thereof may include an N,N-dinorbornylcarbamoyl group and an N,N-diadamantylcarbamoyl group.

The unsubstituted dialkenylcarbamoyl group has usually 2 to 50 carbon atoms, and examples thereof may include an N,N-diethenylcarbamoyl group, an N,N-dipropenylcarbamoyl group, an N,N-di(3-butenyl)carbamoyl group, an N,N-di(2-butenyl)carbamoyl group, an N,N-di(2-pentenyl)carbamoyl group, an N,N-di(2-hexenyl)carbamoyl group, an N,N-di(2-nonenyl)carbamoyl group, and an N,N-di(2-dodecenyl)carbamoyl group.

The unsubstituted diarylcarbamoyl group has usually 6 to 50 carbon atoms, and examples thereof may include an N,N-diphenylcarbamoyl group, an N,N-di(1-naphthyl)carbamoyl group, an N,N-di(2-naphthyl)carbamoyl group, an N,N-di(2-methylphenyl)carbamoyl group, an N,N-di(3-methylphenyl)carbamoyl group, an N,N-di(4-methylphenyl)carbamoyl group, an N,N-di(4-ethylphenyl)carbamoyl group, an N,N-di(4-propylphenyl)carbamoyl group, an N,N-di(4-isopropylphenyl)carbamoyl group, an N,N-di(4-butylphenyl)carbamoyl group, an N,N-di(4-tert-butylphenyl)carbamoyl group, an N,N-di(4-hexylphenyl)carbamoyl group, an N,N-di(4-cyclohexylphenyl)carbamoyl group, an N,N-di(4-adamantylphenylcarbamoyl group, and N,N-di(4-phenylphenyl)carbamoyl group.

The unsubstituted diaralkylcarbamoyl groups have generally 7 to 50 carbon atoms, and examples thereof may include an N,N-di(phenylmethyl)carbamoyl group, an N,N-di(1-phenylethyl)carbamoyl group, an N,N-di(2-phenylethyl)carbamoyl group, an N,N-di(1-phenylpropyl)carbamoyl group, an N,N-di(2-phenyl-1-methylethyl)carbamoyl group, an N,N-di(1-phenyl-1-methylethyl)carbamoyl group, an N,N-di(3-phenylpropyl)carbamoyl group, an N,N-di(4-phenylbutyl)carbamoyl group, an N,N-di(5-phenylpentyl)carbamoyl group, an N,N-di(6-phenylhexyl)carbamoyl group, and an N-phenylethyl-N-phenylmethylcarbamoyl group.

The unsubstituted N-alkyl-N-arylcarbamoyl group has usually 7 to 50 carbon atoms, and examples thereof may include an N-methyl-N-phenylcarbamoyl group, an N-ethyl-N-phenylcarbamoyl group, an N-propyl-N-phenylcarbamoyl group, an N-isopropyl-N-phenylcarbamoyl group, an N-butyl-N-phenylcarbamoyl group, an N-methyl-N-naphthylcarbamoyl group, and an N-methyl-N-(2-methylphenyl)carbamoyl group.

In formula: —C(=S)NR$_2$ and formula: —BR$_2$, R represents a hydrogen atom or a monovalent hydrocarbon group.

The "boric acid ester residue" is represented by the following formula:

[Chem. 9]

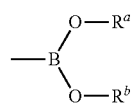

wherein R$^a$ and R$^b$ are each independently a monovalent hydrocarbon group, or R$^a$ and R$^b$ are combined together to form a divalent hydrocarbon group. Examples of the monovalent hydrocarbon group may include alkyl groups having 1 to 10 carbon atoms and aryl groups having 1 to 10 carbon atoms. Examples of the divalent hydrocarbon group may include alkylene groups having 2 to 10 carbon atoms and a phenylene group.). Particularly, groups represented by the following formulae are preferred.

[Chem. 10]

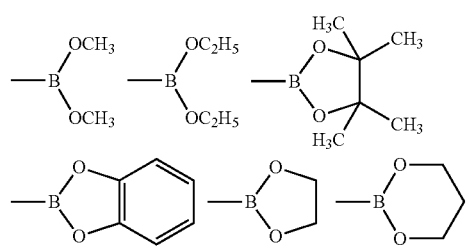

In formula: —Si(OR)$_3$, R represents a hydrogen atom or a monovalent hydrocarbon group.

The "hydrocarbylsulfo group" means an unsubstituted hydrocarbylsulfo group and a substituted hydrocarbylsulfo group in which a part or all of hydrogen atoms in the unsubstituted hydrocarbylsulfo group are substituted with a halogen atom, a mercapto group, or the like.

Examples of the unsubstituted hydrocarbylsulfo group may include an unsubstituted alkylsulfo group, an unsubstituted cycloalkylsulfo group, an unsubstituted bicycloalkylsulfo group, an unsubstituted alkenylsulfo group, an unsubstituted arylsulfo group, and an unsubstituted aralkylsulfo group.

The unsubstituted alkylsulfo group may be linear or branched. The unsubstituted alkylsulfo group has usually 1 to 20 carbon atoms, preferably 1 to 15 carbon atoms, and more preferably 1 to 10 carbon atoms. Examples of the unsubstituted alkylsulfo group may include a methylsulfo group, an ethylsulfo group, a propylsulfo group, an isopropylsulfo group, a butylsulfo group, an isobutylsulfo group, a sec-butylsulfo group, a tert-butylsulfo group, a pentylsulfo group, a hexylsulfo group, a heptylsulfo group, an octylsulfo group, a 2-ethylhexylsulfo group, a nonylsulfo group, a decylsulfo group, a 3,7-dimethyloctylsulfo group, and a dodecylsulfo group. Examples of the substituted alkylsulfo group may include a trifluoromethylsulfo group.

The unsubstituted cycloalkylsulfo group has usually 3 to 50 carbon atoms, and examples thereof may include a cyclopropylsulfo group, a cyclobutylsulfo group, a cyclopentylsulfo group, a cyclohexylsulfo group, a cyclononylsulfo group, and a cyclododecylsulfo group.

The unsubstituted bicycloalkylsulfo group has usually 4 to 50 carbon atoms, and examples thereof may include a norbornylsulfo group and an adamantylsulfo group.

The unsubstituted alkenylsulfo group has usually 2 to 50 carbon atoms, and examples thereof may include an ethenylsulfo group, a propenylsulfo group, a 3-butenylsulfo group, a 2-butenylsulfo group, a 2-pentenylsulfo group, a 2-hexenylsulfo group, a 2-nonenylsulfo group, and a 2-dodecenylsulfo group.

The unsubstituted arylsulfo group has usually 6 to 50 carbon atoms, and examples thereof may include a phenylsulfo group, a 1-naphthylsulfo group, a 2-naphthylsulfo group, a 2-methylphenylsulfo group, a 3-methylphenylsulfo group, a 4-methylphenylsulfo group, a 4-ethylphenylsulfo group, a 4-propylphenylsulfo group, a 4-isopropylphenylsulfo group, a 4-butylphenylsulfo group, a 4-tert-butylphenylsulfo group, a 4-hexylphenylsulfo group, a 4-cyclohexylphenylsulfo group, a 4-adamantylphenylsulfo group, and a 4-phenylphenylsulfo group.

The unsubstituted aralkylsulfo group has usually 7 to 50 carbon atoms, and examples thereof may include a phenylmethylsulfo group, a 1-phenylethylsulfo group, a 2-phenylethylsulfo group, a 1-phenylpropylsulfo group, a 2-phenyl-1-methylethylsulfo group, a 1-phenyl-1-methylethylsulfo group, a 3-phenylpropylsulfo group, a 4-phenylbutylsulfo group, a 5-phenylpentylsulfo group, and a 6-phenylhexylsulfo group.

In formula: $-S(=O)_2R$, R represents a hydrogen atom or a monovalent hydrocarbon group.

The "hydrocarbylsulfino group" means an unsubstituted hydrocarbylsulfino group and a substituted hydrocarbylsulfino group in which a part or all of hydrogen atoms in the unsubstituted hydrocarbylsulfino group are substituted with a halogen atom, a mercapto group, or the like.

Examples of the unsubstituted hydrocarbylsulfino group may include an unsubstituted alkylsulfino group, an unsubstituted cycloalkylsulfino group, an unsubstituted bicycloalkylsulfino group, an unsubstituted alkenylsulfino group, an unsubstituted arylsulfino group, and an unsubstituted aralkylsulfino group.

The unsubstituted alkylsulfino group may be linear or branched. The unsubstituted alkylsulfino group has usually 1 to 20 carbon atoms, preferably 1 to 15 carbon atoms, and more preferably 1 to 10 carbon atoms. Examples of the unsubstituted alkylsulfino group may include a methylsulfino group, an ethylsulfino group, a propylsulfino group, an isopropylsulfino group, a butylsulfino group, an isobutylsulfino group, a sec-butylsulfino group, a tert-butylsulfino group, a pentylsulfino group, a hexylsulfino group, a heptylsulfino group, an octylsulfino group, a 2-ethylhexylsulfino group, a nonylsulfino group, a decylsulfino group, a 3,7-dimethyloctylsulfino group, and a dodecylsulfino group. Examples of the substituted alkylsulfino group may include a trifluoromethylsulfino group.

The unsubstituted cycloalkylsulfino group has usually 3 to 50 carbon atoms, and examples thereof may include a cyclopropylsulfino group, a cyclobutylsulfino group, a cyclopentylsulfino group, a cyclohexylsulfino group, a cyclononylsulfino group, and a cyclododecylsulfino group.

The unsubstituted bicycloalkylsulfino group has usually 4 to 50 carbon atoms, and examples thereof may include a norbornylsulfino group and an adamantylsulfino group.

The unsubstituted alkenylsulfino group has usually 2 to 50 carbon atoms, and examples thereof may include an ethenylsulfino group, a propenylsulfino group, a 3-butenylsulfino group, a 2-butenylsulfino group, a 2-pentenylsulfino group, a 2-hexenylsulfino group, a 2-nonenylsulfino group, and a 2-dodecenylsulfino group.

The unsubstituted arylsulfino group has usually 6 to 50 carbon atoms, and examples thereof may include a phenylsulfino group, a 1-naphthylsulfino group, a 2-naphthylsulfino group, a 2-methylphenylsulfino group, a 3-methylphenylsulfino group, a 4-methylphenylsulfino group, a 4-ethylphenylsulfino group, a 4-propylphenylsulfino group, a 4-isopropylphenylsulfino group, a 4-butylphenylsulfino group, a 4-tert-butylphenylsulfino group, a 4-hexylphenylsulfino group, a 4-cyclohexylphenylsulfino group, a 4-adamantylphenylsulfino group, and a 4-phenylphenylsulfino group.

The unsubstituted aralkylsulfino group has usually 7 to 50 carbon atoms, and examples thereof may include a phenylmethylsulfino group, a 1-phenylethylsulfino group, a 2-phenylethylsulfino group, a 1-phenylpropylsulfino group, a 2-phenyl-1-methylethylsulfino group, a 1-phenyl-1-methylsulfino group, a 3-phenylpropylsulfino group, a 4-phenylbutylsulfino group, a 5-phenylpentylsulfino group, and a 6-phenylhexylsulfino group.

In formula: $-NRC(=O)OR$, formula: $-NRC(=O)SR$, formula: $-NRC(=S)OR$, formula: $-NRC(=S)SR$, formula: $-OC(=O)NR_2$, formula: $-SC(=O)NR_2$, formula: $-OC(=S)NR_2$, formula: $-SC(=S)NR_2$, formula: $-NRC(=O)NR_2$, formula: $-NRC(=S)NR_2$, formula: $-SM$, formula: $-C(=O)SM$, formula: $-CS_2M$, formula: $-OM$, formula: $-NM_2$, formula: $-NRM$, formula: $-OP(=O)(OM)_2$, formula: $-P(=O)(OM)_2$, formula: $-C(=O)NM_2$, formula: $-C(=O)NRM$, formula: $-C(=S)NRM$, formula: $-C(=S)NM_2$, formula: $-B(OM)_2$, formula: $-BR_3M$, formula: $-B(OR)_3M$, formula: $-S(=O)_2M$, formula: $-S(=O)OM$, formula: $-NRC(=O)OM$, formula: $-NRC(=O)SM$, formula: $-NRC(=S)OM$, formula: $-NRC(=S)SM$, formula: $-OC(=O)NM_2$, formula: $-OC(=O)NRM$, formula: $-OC(=S)NM_2$, formula: $-OC(=S)NRM$, formula: $-SC(=O)NM_2$, formula: $-SC(=O)NRM$, formula: $-SC(=S)NM_2$, formula: $-SC(=S)NRM$, formula: $-NRC(=O)NM_2$, formula: $-NRC(=O)NRM$, formula: $-NRC(=S)NM_2$, formula: $-NRC(=S)NRM$, formula: $-PR_3M'$, formula: $-OR_2M'$, formula: $-SR_2M'$, formula: $-IRM'$, and Formulae (n-1) to (n-13), R represents a hydrogen atom or a monovalent hydrocarbon group, M represents a metal cation or a substituted or unsubstituted ammonium cation, and M' represents an anion. The details of R, M, and M' are as described above.

In Formulae (p-1) to (p-9), R' represents a substituted or unsubstituted divalent hydrocarbon group; R" represents a hydrogen atom, a substituted or unsubstituted monovalent hydrocarbon group, a carboxyl group, a sulfo group, a hydroxyl group, a group represented by formula: $-SH$, a group represented by formula: $-NR^c_2$, a cyano group, or a group represented by formula: $-C(=O)NR^c_2$, wherein $R^c$ represents a substituted or unsubstituted alkyl group having 1 to 30 carbon atoms or a substituted or unsubstituted aryl group having 6 to 50 carbon atoms; R'" represents a substituted or unsubstituted trivalent hydrocarbon group; m represents an integer of 1 or more; and q represents an integer of 0 or more. When R' and R" are each plurally present, they may be the same as or different from each other.

Examples of the divalent hydrocarbon group represented by R' may include: divalent saturated hydrocarbon groups having 1 to 50 carbon atoms such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group, and a 1,12-dodecylene group; alkenylene groups having 2 to 50 carbon atoms such as an ethenylene group, a propenylene group, a 2-butenylene group, a 3-butenylene group, a 2-pentenylene group, a 2-hexenylene group, a 2-nonenylene group, and a 2-dodecenylene group; divalent cycloalkylene groups having 3 to 50 carbon atoms such as a cyclopropylene group, a cyclobutylene group, a cyclopentylene group, a cyclohexylene group, a cyclononylene group, and a cyclododecylene group; divalent bicycloalkylene groups having 4 to 50 carbon atoms such as a norbornylene group and an adamantylene group; and arylene groups having 6 to 50 carbon atoms such as a 1,3-phenylene group, 1,4-phenylene, a 1,4-naphthylene group, a 1,5-naphthylene group, a 2,6-naphthylene group, and a biphenyl-4,4'-diyl group.

The monovalent hydrocarbon group represented by R" is as defined above, and alkyl groups having 1 to 20 carbon atoms and aryl groups having 6 to 30 carbon atoms are preferred. Particularly, a methyl group, an ethyl group, a phenyl group, a 1-naphthyl group, or a 2-naphthyl group is more preferred, because the conjugated compound can have good solubility in a solvent.

The trivalent hydrocarbon group represented by R'" means a substituted or unsubstituted trivalent hydrocarbon group and has usually 1 to 50 carbon atoms and preferably 1 to 30 carbon atoms. Examples of such a trivalent hydrocarbon group may include: unsubstituted alkanetriyl groups having 1 to 20 carbon atoms such as a methanetriyl group, an ethanetriyl group, a 1,2,3-propanetriyl group, a 1,2,4-butanetriyl group, a 1,2,5-pentanetriyl group, a 1,3,5-pentanetriyl group, a 1,2,6-hexanetriyl group, and a 1,3,6-hexanetriyl group, and substituted alkanetriyl groups in which at least one hydrogen atom in these groups is substituted; and unsubstituted trivalent aromatic cyclic groups having 6 to 30 carbon atoms such as a 1,2,3-benzenetriyl group, a 1,2,4-benzenetriyl group, and a 1,3,5-benzenetriyl group, and groups in which at least one hydrogen atom in these groups is substituted. A methanetriyl group, an ethanetriyl group, a 1,2,4-benzenetriyl group, or a 1,3,5-benzenetriyl group is preferred, because the conjugated compound can have good solubility in a solvent.

The m represents an integer of 1 or more and is preferably 1 to 20, more preferably 3 to 20, further preferably 3 to 15, and particularly preferably 6 to 10.

The q represents an integer of 0 or more. In Formula (p-3), q is preferably 0 to 30, more preferably 3 to 20, further preferably 3 to 10, and particularly preferably 6 to 10. In Formulae (p-4) to (p-7), q is preferably 0 to 30, more preferably 0 to 20, further preferably 0 to 10, and particularly preferably 0 to 5. In Formula (p-8), q is preferably 0 to 30, more preferably 0 to 20, further preferably 3 to 20, and particularly preferably 3 to 10. In Formula (p-9), q is preferably 0 to 30, more preferably 0 to 20, further preferably 0 to 15, and particularly preferably 0 to 10.

$R^c$ is preferably a methyl group, an ethyl group, a phenyl group, a 1-naphthyl group, or a 2-naphthyl group, because the conjugated compound can have good solubility in a solvent.

Examples of the ($m^1$+1) valent group represented by $R^1$ in Formula (I) may include: an atomic group remaining after removing $m^1$ hydrogen atoms directly bonding to carbon atoms that constitute the above monovalent hydrocarbon group or constitute a ring of the above monovalent heterocyclic group; and a group represented by formula —O—(R'O)$_m$— (when $m^1$=1). Preferably, the ($m^1$+1) valent group represented by $R^1$ in Formula (I) is an atomic group remaining after removing $m^1$ hydrogen atoms from an alkyl group, an atomic group remaining after removing $m^1$ hydrogen atoms directly bonding to carbon atoms that constitute a ring of an aryl group, an atomic group remaining after removing $m^1$ hydrogen atoms directly bonding to carbon atoms that constitute a ring of a monovalent heterocyclic group, an atomic group remaining after removing $m^1$ hydrogen atoms from an alkyl group substituted with a monovalent heterocyclic group, or an atomic group remaining after removing $m^1$ hydrogen atoms directly bonding to carbon atoms that constitute a ring of an aryl group substituted with a monovalent heterocyclic group. More preferably, the ($m^1$+1) valent group represented by $R^1$ in Formula (I) is an atomic group remaining after removing $m^1$ hydrogen atoms from an alkyl group having 1 to 6 carbon atoms, an atomic group remaining after removing $m^1$ hydrogen atoms from a phenyl group, an atomic group remaining after removing $m^1$ hydrogen atoms from a triazinyl group, an atomic group remaining after removing $m^1$ hydrogen atoms from an alkyl group substituted with a triazinyl group, or an atomic group remaining after removing $m^1$ hydrogen atoms directly bonding to carbon atoms that constitute a ring of an aryl group substituted with a triazinyl group.

The alkyl group and aryl group may be the substituted or unsubstituted alkyl group and the substituted or unsubstituted aryl group shown as an example with regard to the monovalent hydrocarbon group.

The monovalent heterocyclic group is as described above.

The alkyl group substituted with the monovalent heterocyclic group has 3 to 30 carbon atoms, and examples thereof may include a 2-pyridinylmethyl group, a 3-pyridinylmethyl group, a 4-pyridinylmethyl group, a 3-pyridazinylmethyl group, a 4-pyridazinylmethyl group, a 2-pyrimidinylmethyl group, a 4-pyrimidinylmethyl group, a 5-pyrimidinylmethyl group, a 2-pyrazinylmethyl group, a 2-triazinylmethyl group, a quinolylmethyl group, a quinoxalinylmethyl group, a 1,10-phenanthrolinylmethyl group, a 2-pyridinylethyl group, a 3-pyridinylethyl group, a 4-pyridinylethyl group, a 3-pyridazinylethyl group, a 4-pyridazinylethyl group, a 2-pyrimidinylethyl group, a 4-pyrimidinylethyl group, a 5-pyrimidinylethyl group, a 2-pyrazinylethyl group, a 2-triazinylethyl group, a quinolylethyl group, a quinoxalinylethyl group, and a 1,10-phenanthrolinylethyl group.

The aryl group substituted with the monovalent heterocyclic group has 9 to 30 carbon atoms, and examples thereof may include a 2-pyridinylphenyl group, a 3-pyridinylphenyl group, a 4-pyridinylphenyl group, a 3-pyridazinylphenyl group, a 4-pyridazinylphenyl group, a 2-pyrimidinylphenyl group, a 4-pyrimidinylphenyl group, a 5-pyrimidinylphenyl group, a 2-pyrazinylphenyl group, a 2-triazinylphenyl group, a quinolylphenyl group, a quinoxalinylphenyl group, and a 1,10-phenanthrolinylphenyl group.

Examples of the ($m^2$+1) valent group represented by $R^2$ in Formula (II) may include: an atomic group remaining after removing $m^2$ hydrogen atoms directly bonding to carbon atoms that constitute the above monovalent hydrocarbon group or constitute a ring of the above monovalent heterocyclic group; and a group represented by formula —O—(R'O)$_m$— (when $m^2$=1). Preferably, the ($m^2$+1) valent group represented by $R^2$ in Formula (II) is an atomic group remaining after removing $m^2$ hydrogen atoms from an alkyl group, an atomic group remaining after removing $m^2$ hydrogen atoms directly bonding to carbon atoms that constitute a ring of an aryl group, an atomic group remaining after removing $m^2$ hydrogen atoms directly bonding to carbon atoms that constitute a ring of a monovalent heterocyclic group, an atomic group remaining after removing $m^2$ hydrogen atoms from an alkyl group substituted with a monovalent heterocyclic group, or an atomic group remaining after removing $m^2$ hydrogen atoms directly bonding to carbon atoms that constitute a ring of an aryl group substituted with a monovalent heterocyclic group. More preferably, the ($m^2$+

1) valent group represented by $R^2$ in Formula (II) is an atomic group remaining after removing $m^2$ hydrogen atoms from an alkyl group having 1 to 6 carbon atoms, an atomic group remaining after removing $m^2$ hydrogen atoms from a phenyl group, an atomic group remaining after removing $m^2$ hydrogen atoms from a triazinyl group, an atomic group remaining after removing $m^2$ hydrogen atoms from an alkyl group substituted with a triazinyl groups, or an atomic group remaining after removing $m^2$ hydrogen atoms directly bonding to carbon atoms that constitute a ring of an aryl group substituted with a triazinyl group. The alkyl group, the aryl group, the monovalent heterocyclic group, the alkyl group substituted with a monovalent heterocyclic group, and the aryl group substituted with a monovalent heterocyclic group are as described above.

The definitions, specific examples, and preferred examples of R' and m in the formulae are as described above.

Specific examples of the conjugated compound used in the present invention may include conjugated compounds having one or more repeating units selected from the group consisting of repeating units represented by the following Formulae (a-1) to (a-35), (b-1) to (b-39), (c-1) to (c-37), (d-1) to (d-48), (e-1) to (e-16), (f-1) to (f-35), and (g-1) to (g-24). In these Formulae, $n^3$ represents an integer of 2 or more and is preferably an integer of 2 to 30, more preferably an integer of 2 to 20, and further preferably an integer of 6 to 10. $n^4$ represents an integer of 1 or more and is preferably an integer of 1 to 10 and more preferably an integer of 2 to 6. In these Formulae, R represents a hydrogen atom or a monovalent hydrocarbon group and is preferably an alkyl group having 1 to 6 carbon atoms and more preferably a methyl group, an ethyl group, a propyl group, or a butyl group.

[Chem. 11]

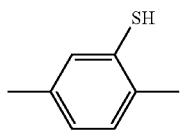
(a-1)

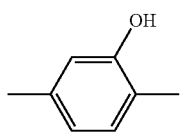
(a-2)

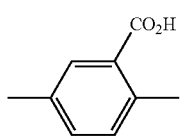
(a-3)

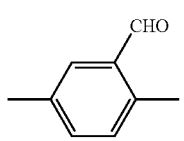
(a-4)

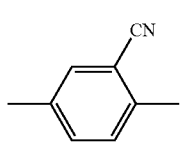
(a-5)

-continued

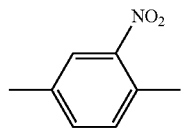
(a-6)

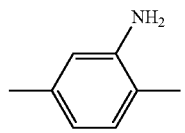
(a-7)

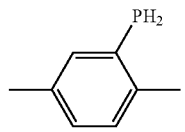
(a-8)

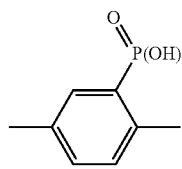
(a-9)

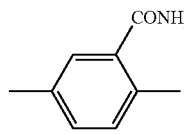
(a-10)

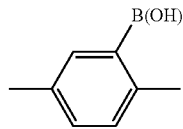
(a-11)

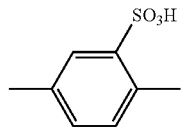
(a-12)

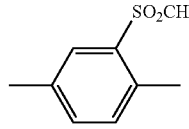
(a-13)

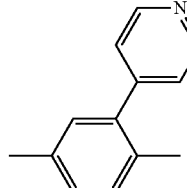
(a-14)

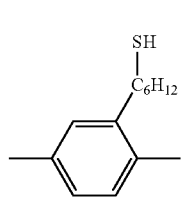
(a-15)

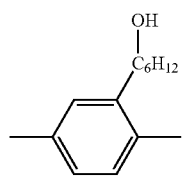 (a-16)
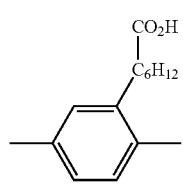 (a-17)
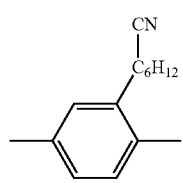 (a-18)
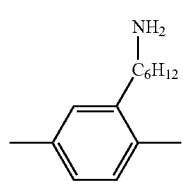 (a-19)
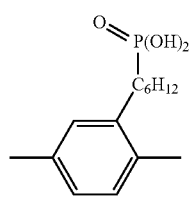 (a-20)
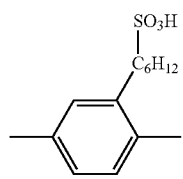 (a-21)
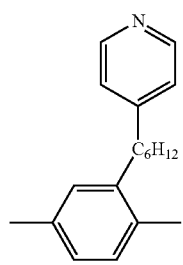 (a-22)
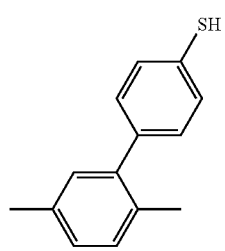 (a-23)
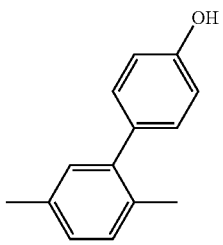 (a-24)
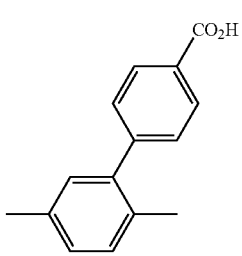 (a-25)
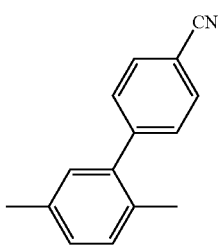 (a-26)
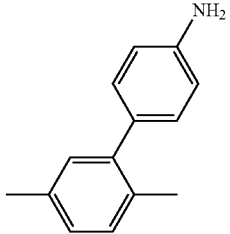 (a-27)
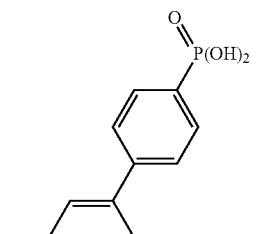 (a-28)
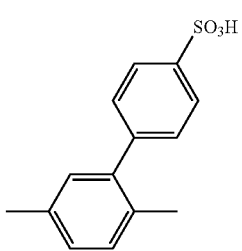 (a-29)

(a-30)
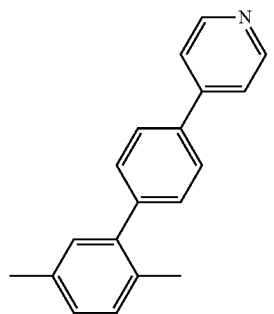
(a-31)
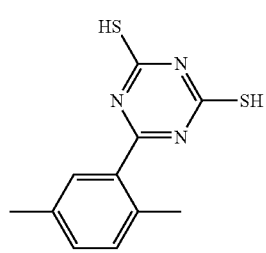
(a-32)
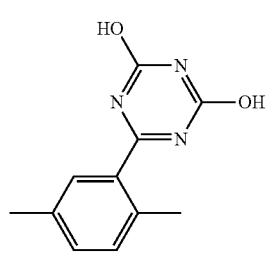
(a-33)
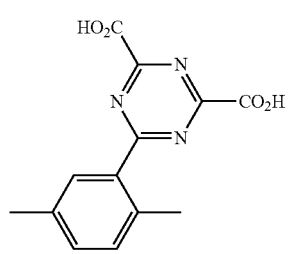
(a-34)
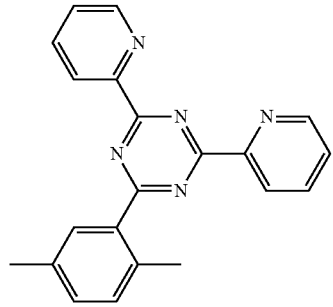
(a-35)
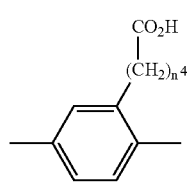
[Chem. 12]
(b-1)
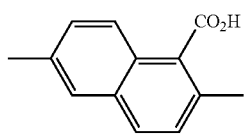
(b-2)
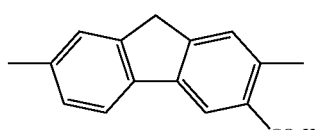
(b-3)
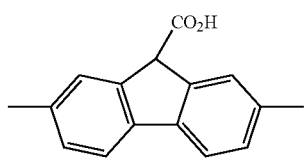
(b-4)
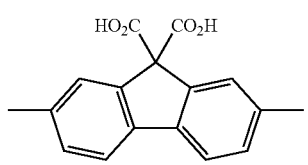
(b-5)
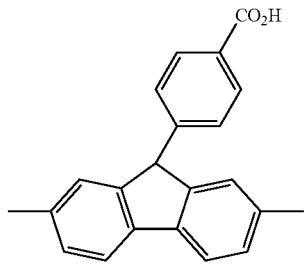
(b-6)
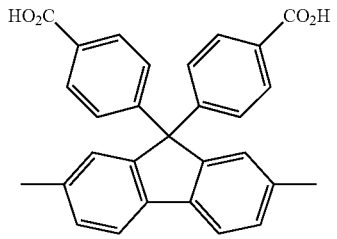
(b-7)
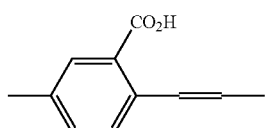
(b-8)
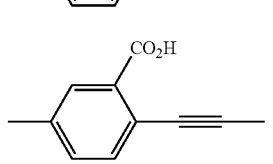
(b-9)
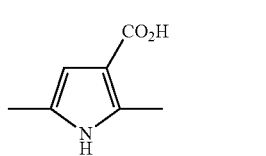

(b-10) 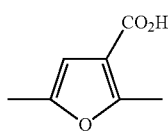
(b-11) 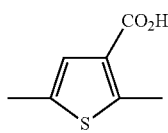
(b-12) 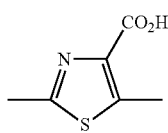
(b-13) 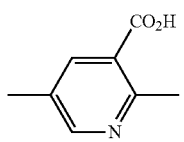
(b-14) 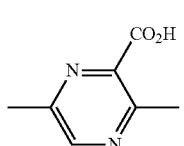
(b-15) 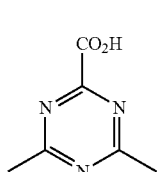
(b-16) 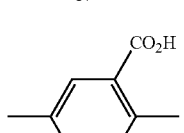
(b-17) 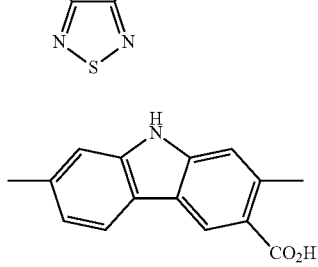
(b-18) 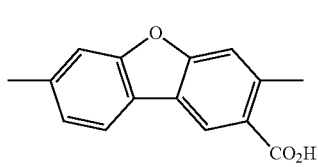
(b-19) 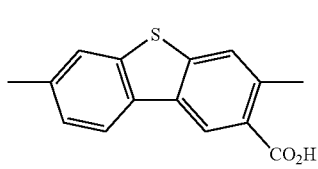
(b-20) 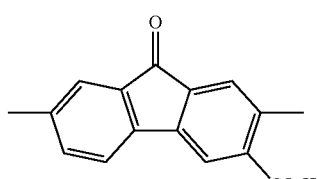
(b-21) 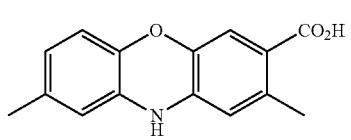
(b-22) 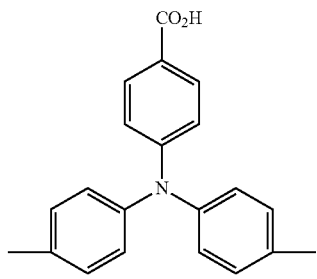
(b-23) 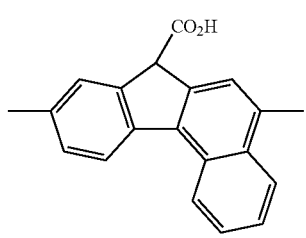
(b-24) 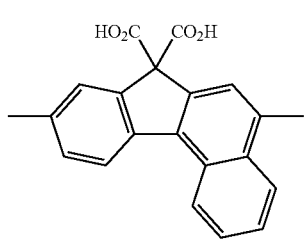
(b-25) 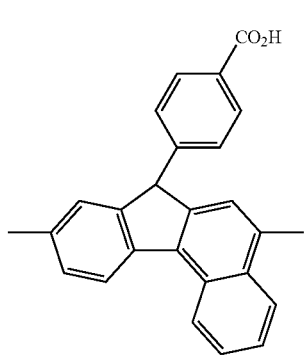

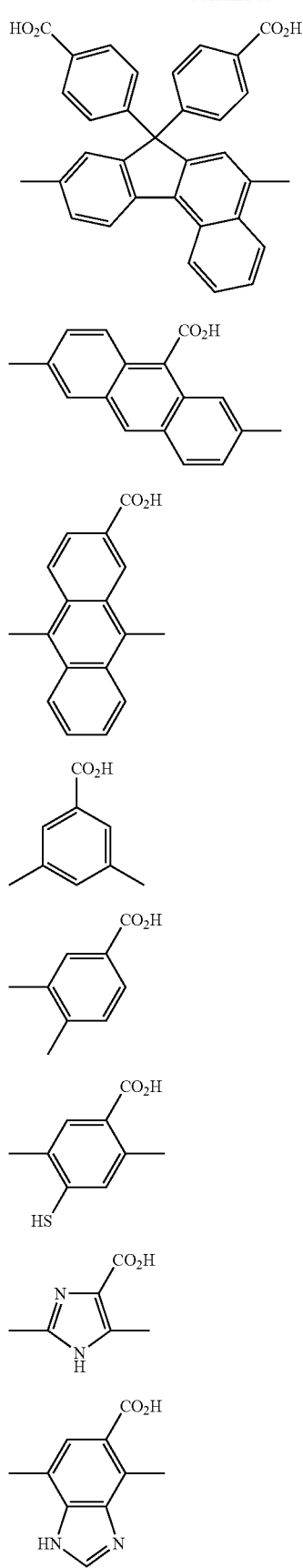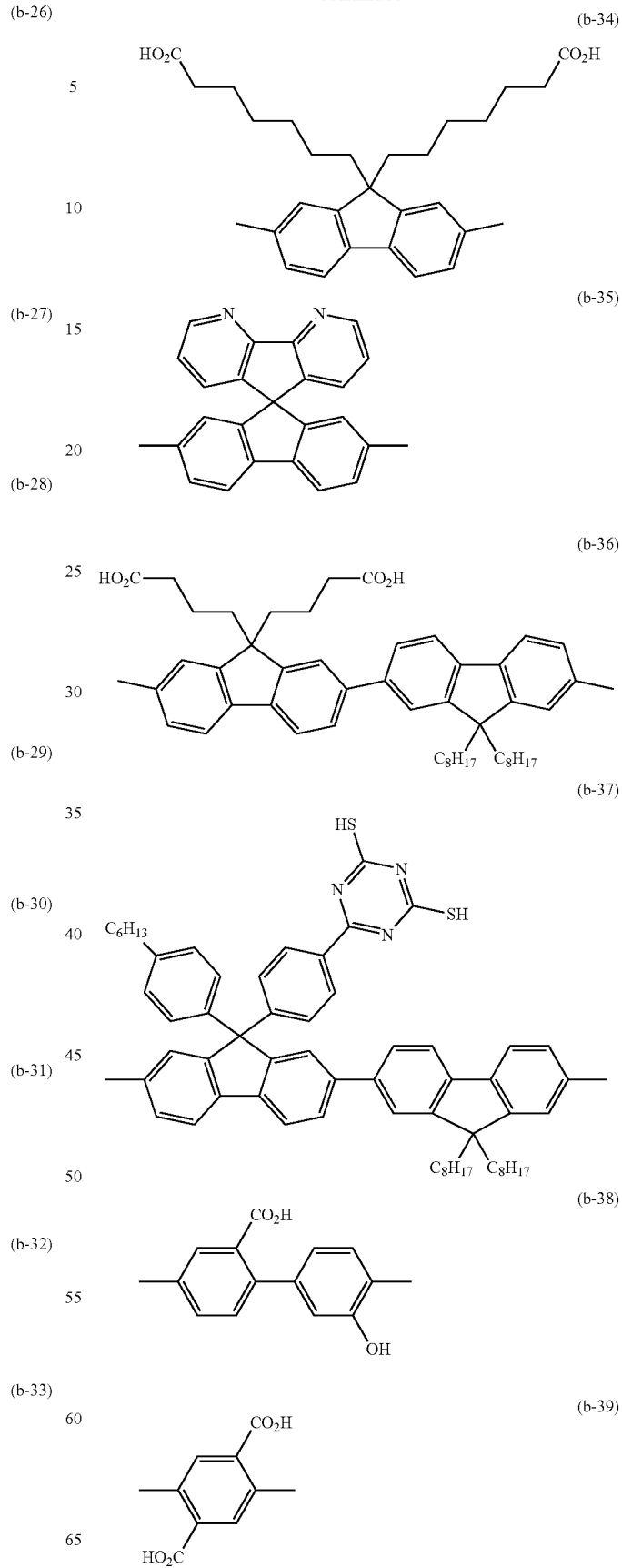

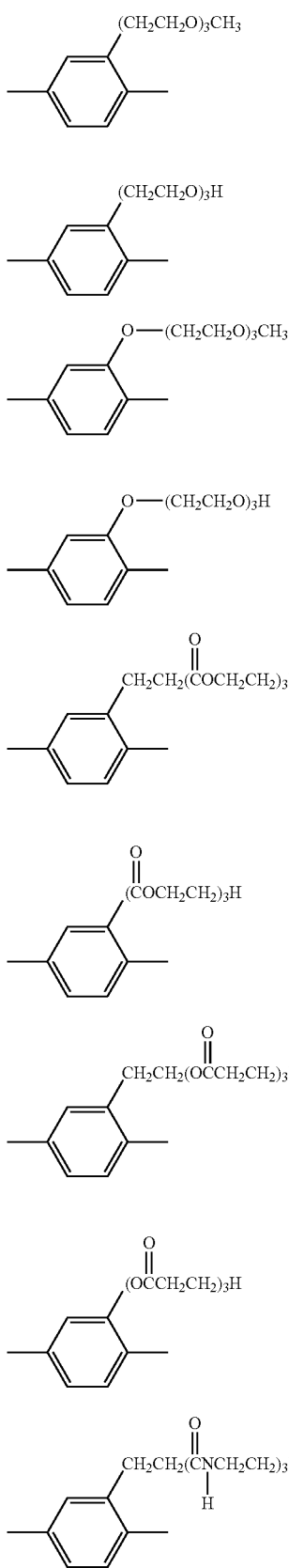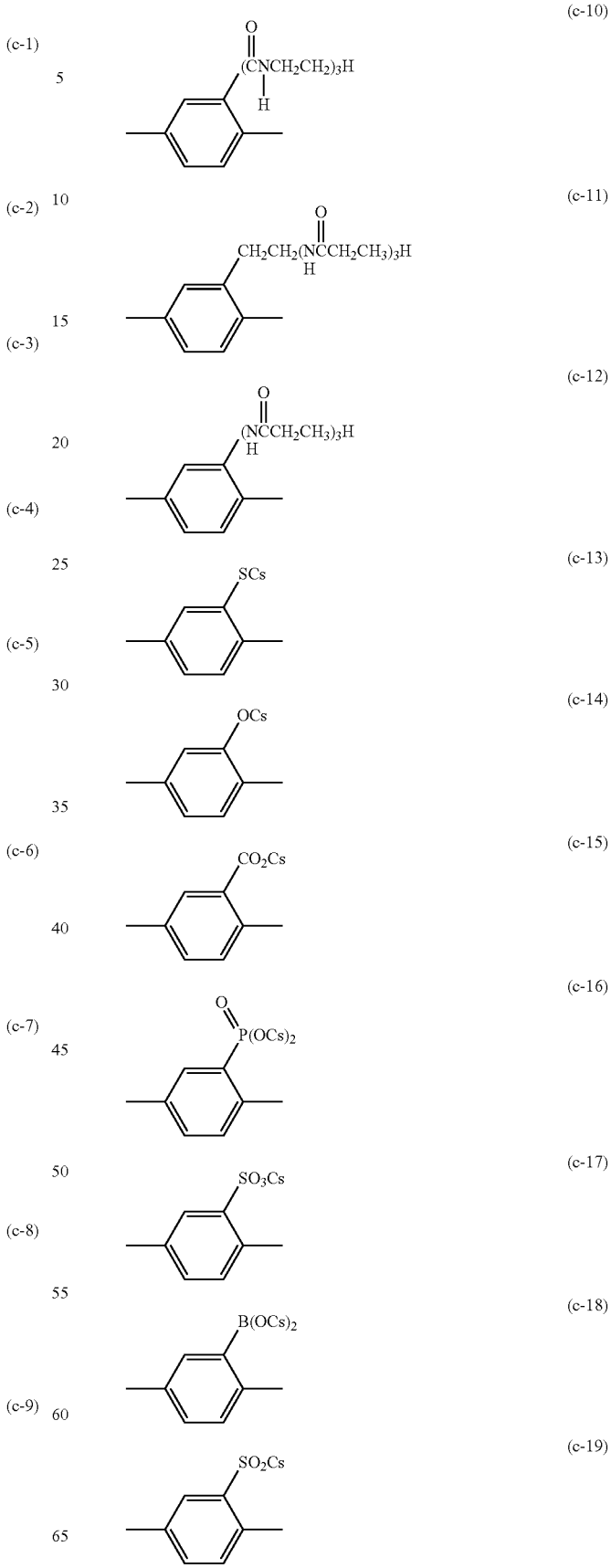

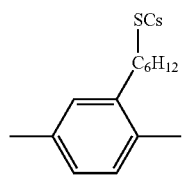 (c-20)
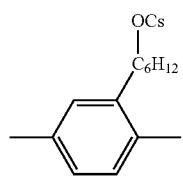 (c-21)
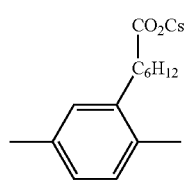 (c-22)
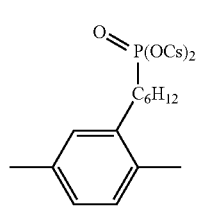 (c-23)
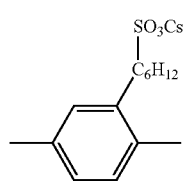 (c-24)
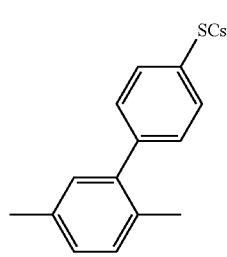 (c-25)
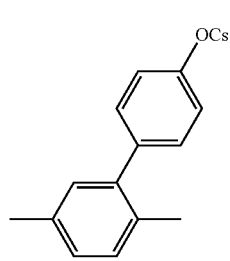 (c-26)
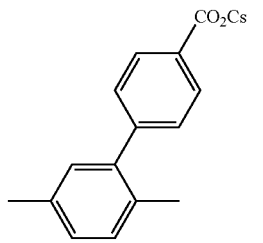 (c-27)
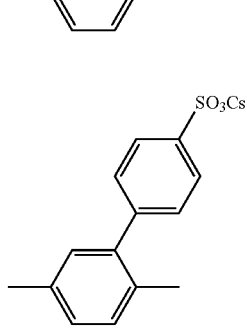 (c-28)
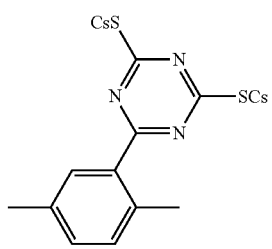 (c-29)
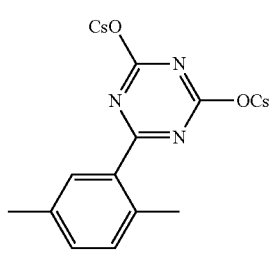 (c-30)
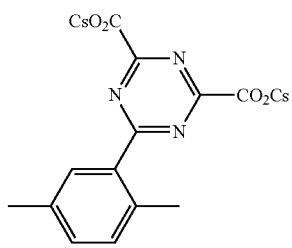 (c-31)
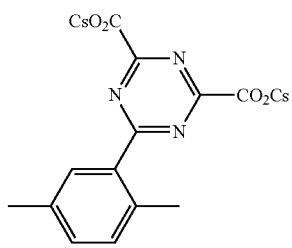 (c-32)

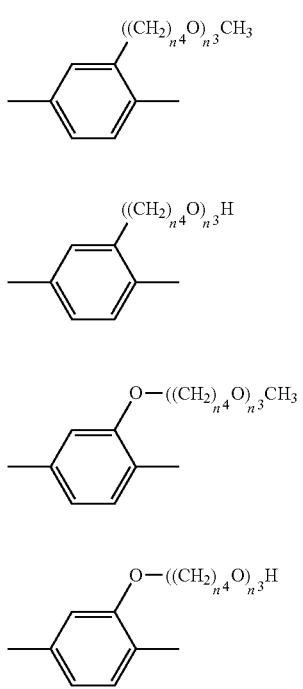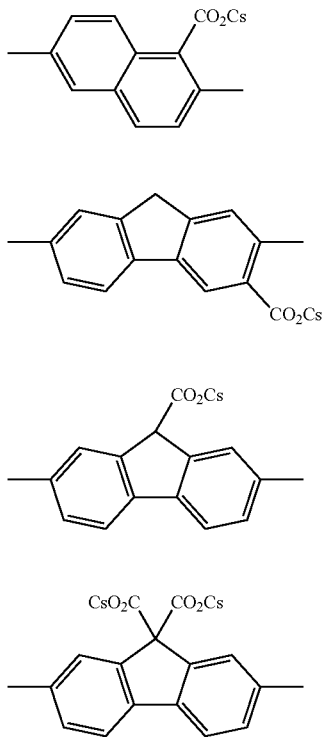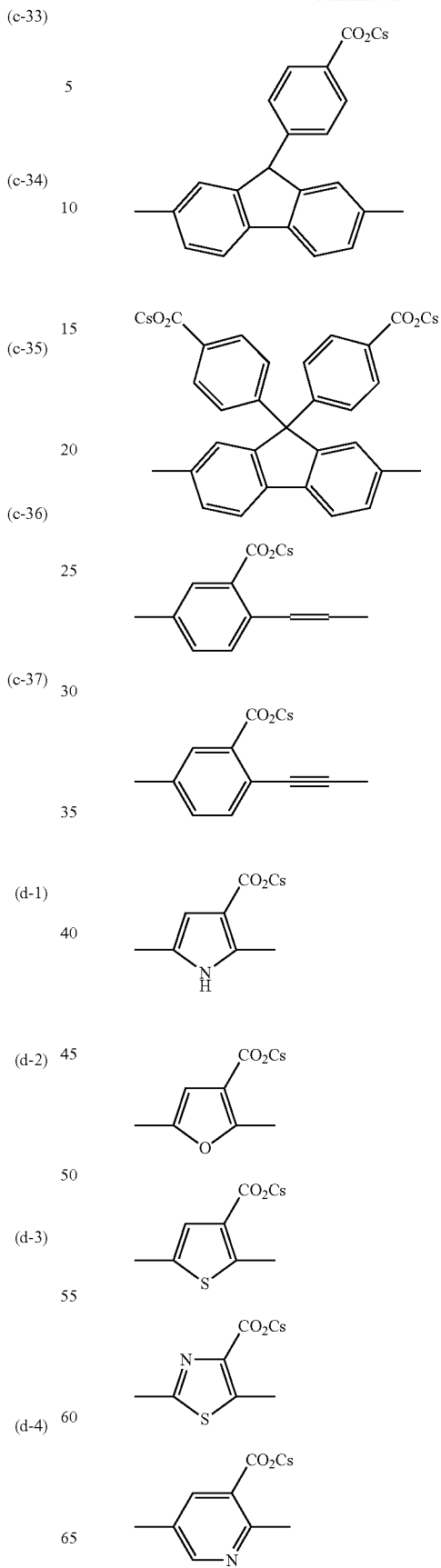

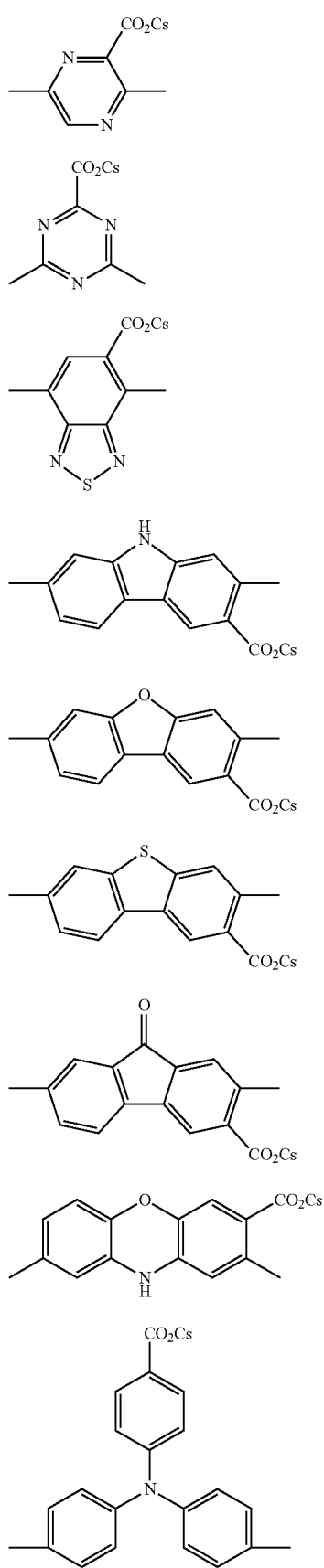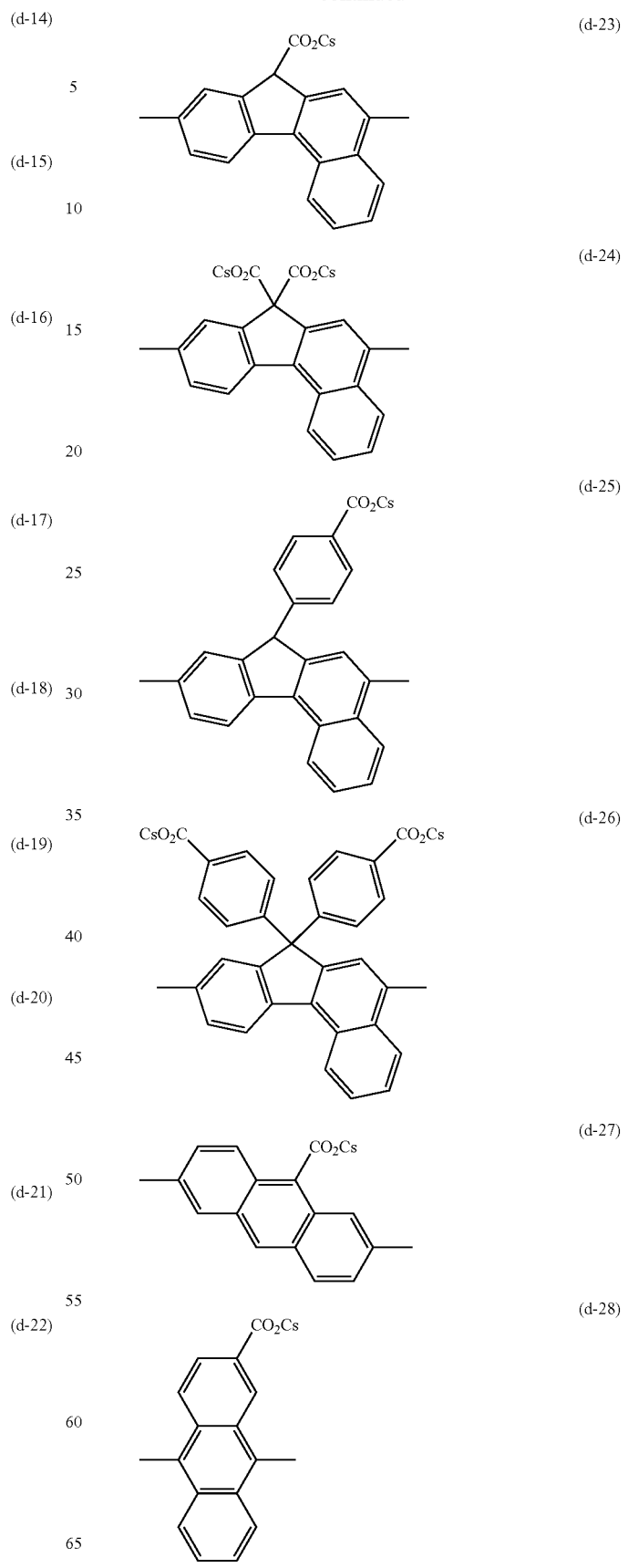

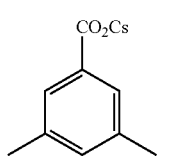
(d-29)
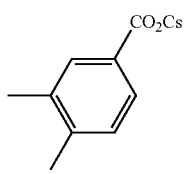
(d-30)
[Chem. 15]
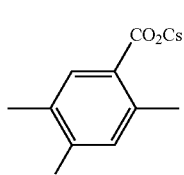
(d-31)
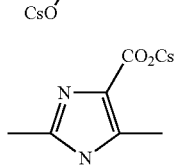
(d-32)
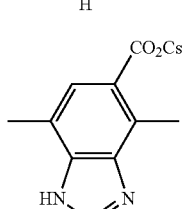
(d-33)
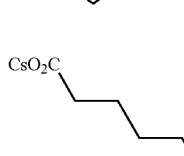
(d-34)
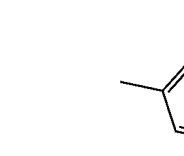
(d-35)
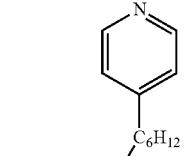
(d-36)
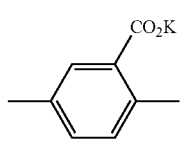
(d-37)
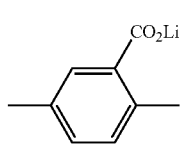
(d-38)
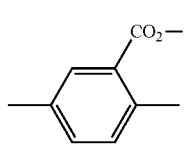
(d-39)
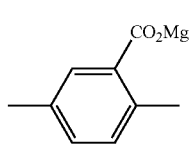
(d-40)
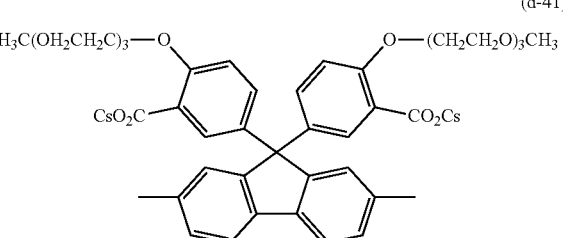
(d-41)
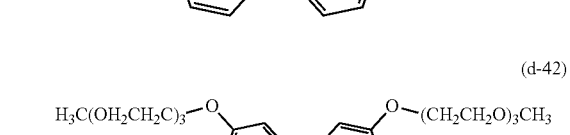
(d-42)
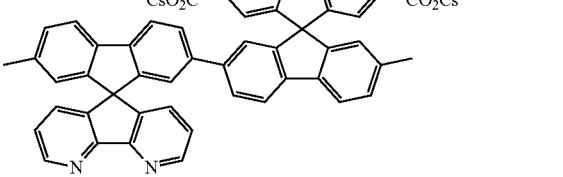
(d-43)
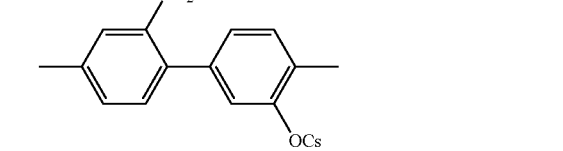
(d-44)

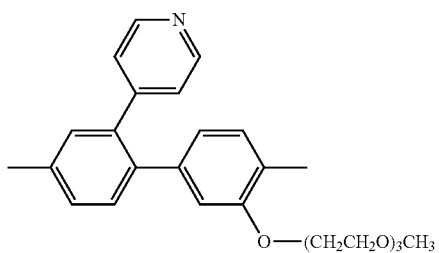
(d-45)
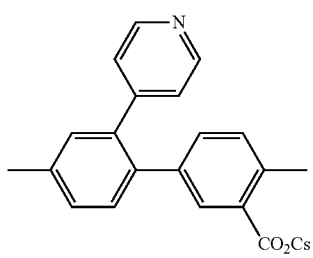
(d-46)
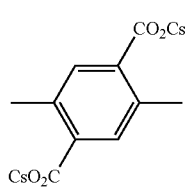
(d-47)
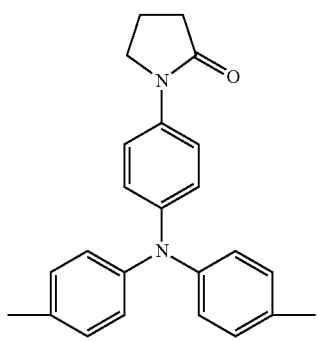
(d-48)
[Chem. 16]
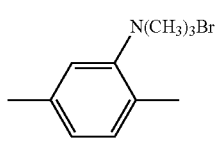
(e-1)
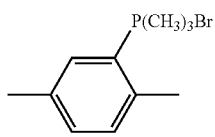
(e-2)
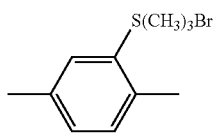
(e-3)
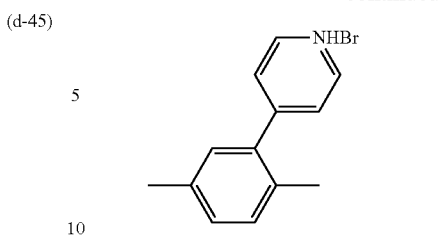
(e-4)
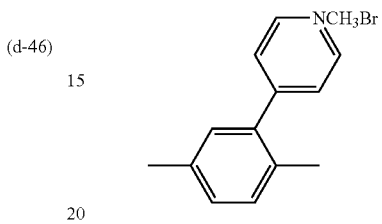
(e-5)
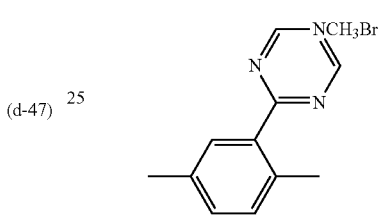
(e-6)
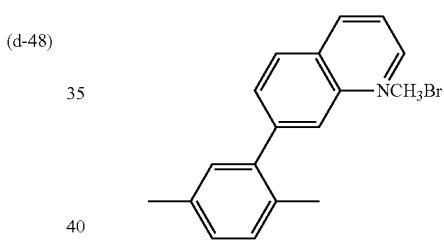
(e-7)
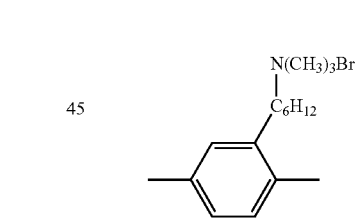
(e-8)
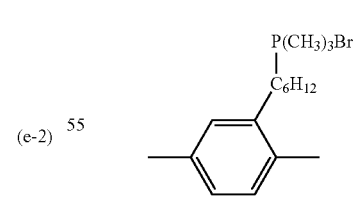
(e-9)
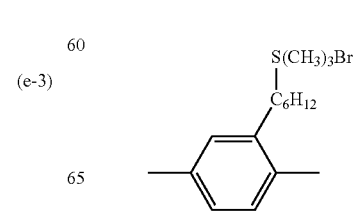
(e-10)

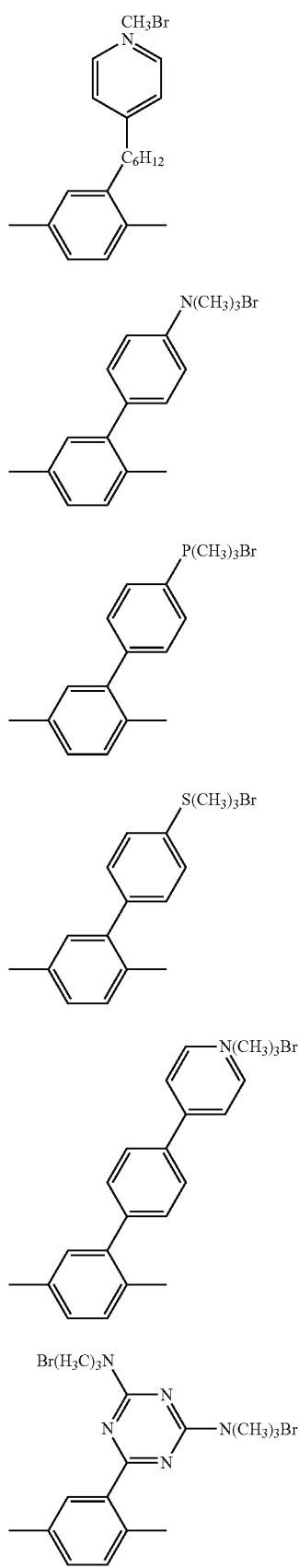
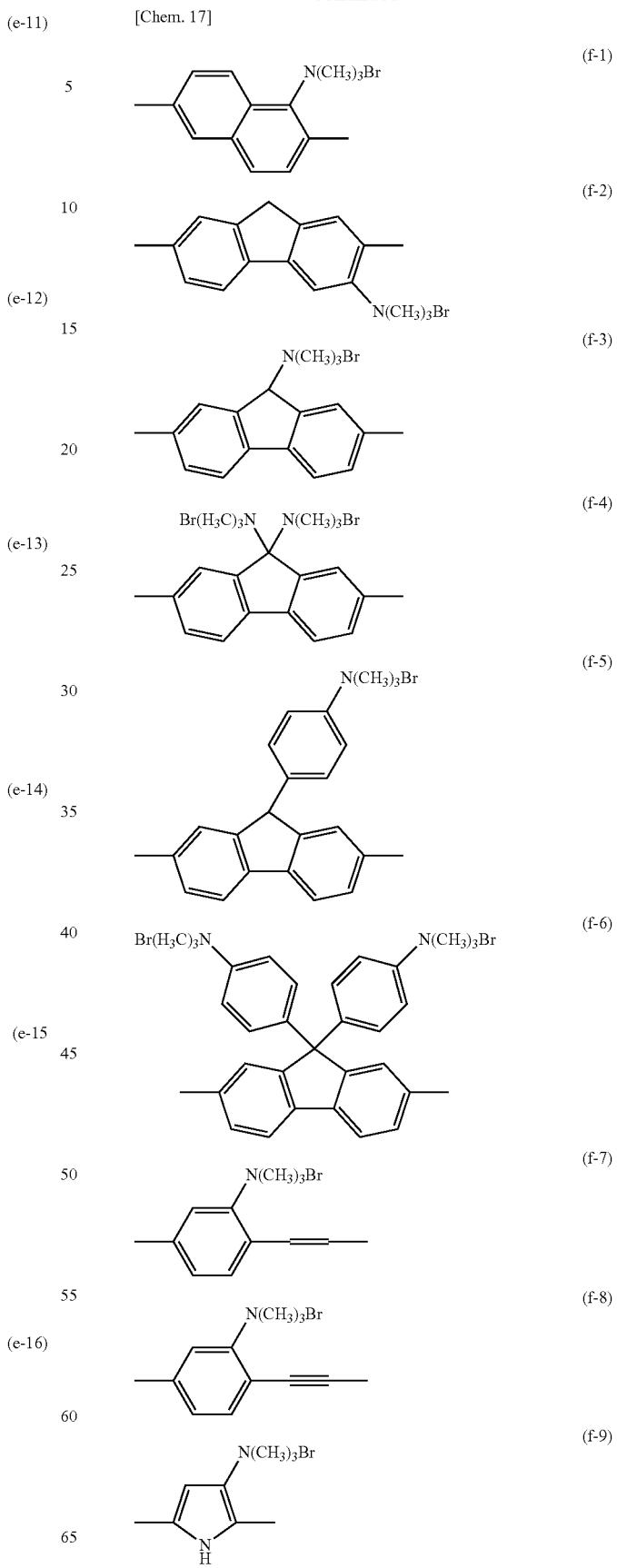

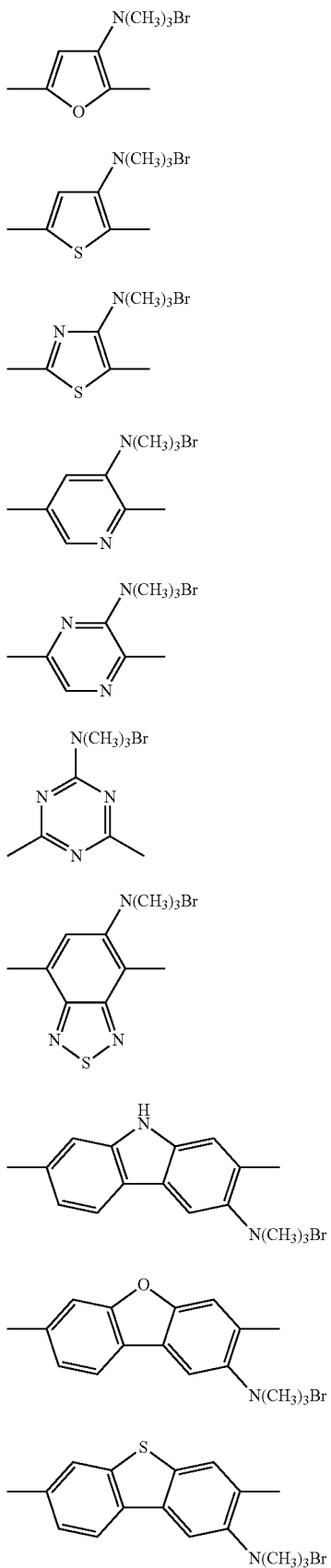
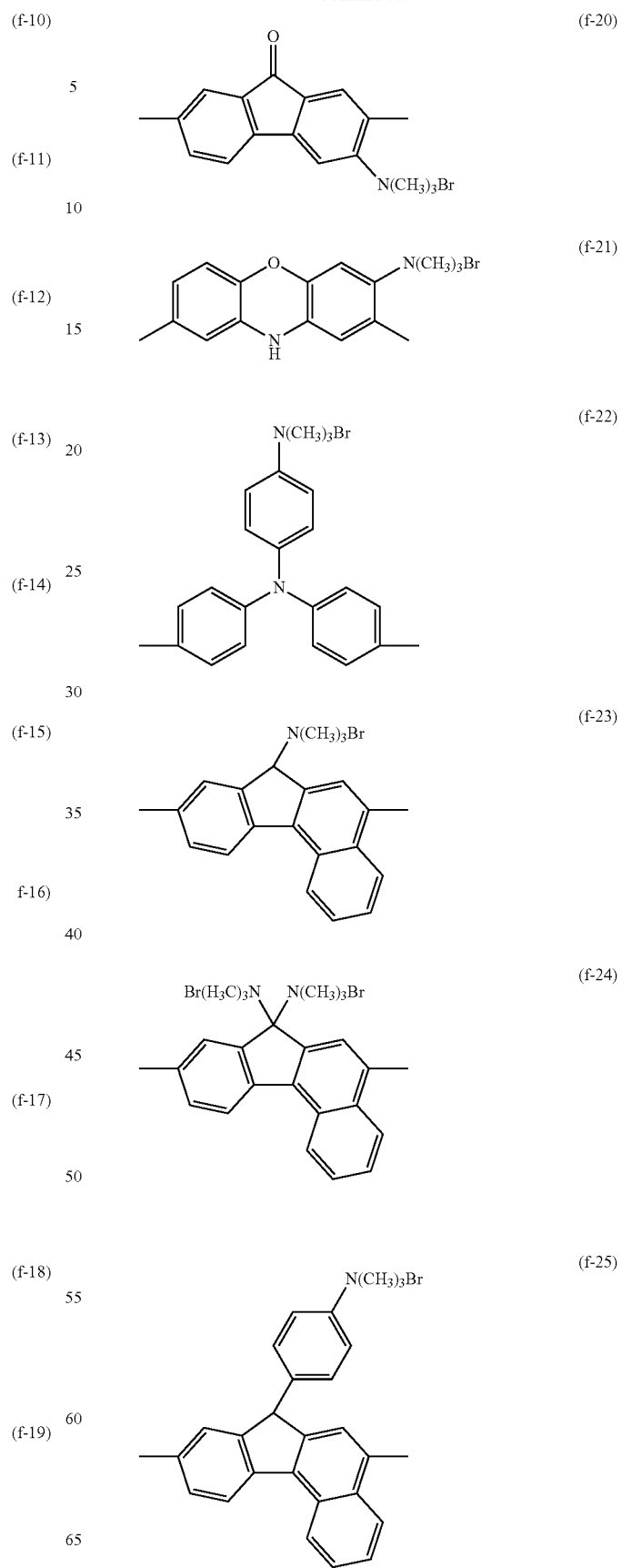

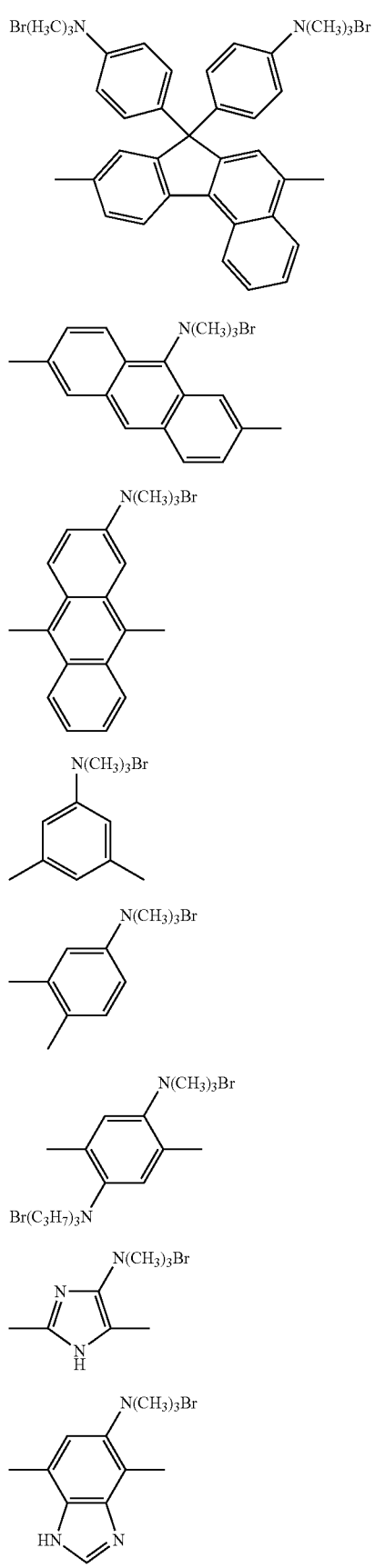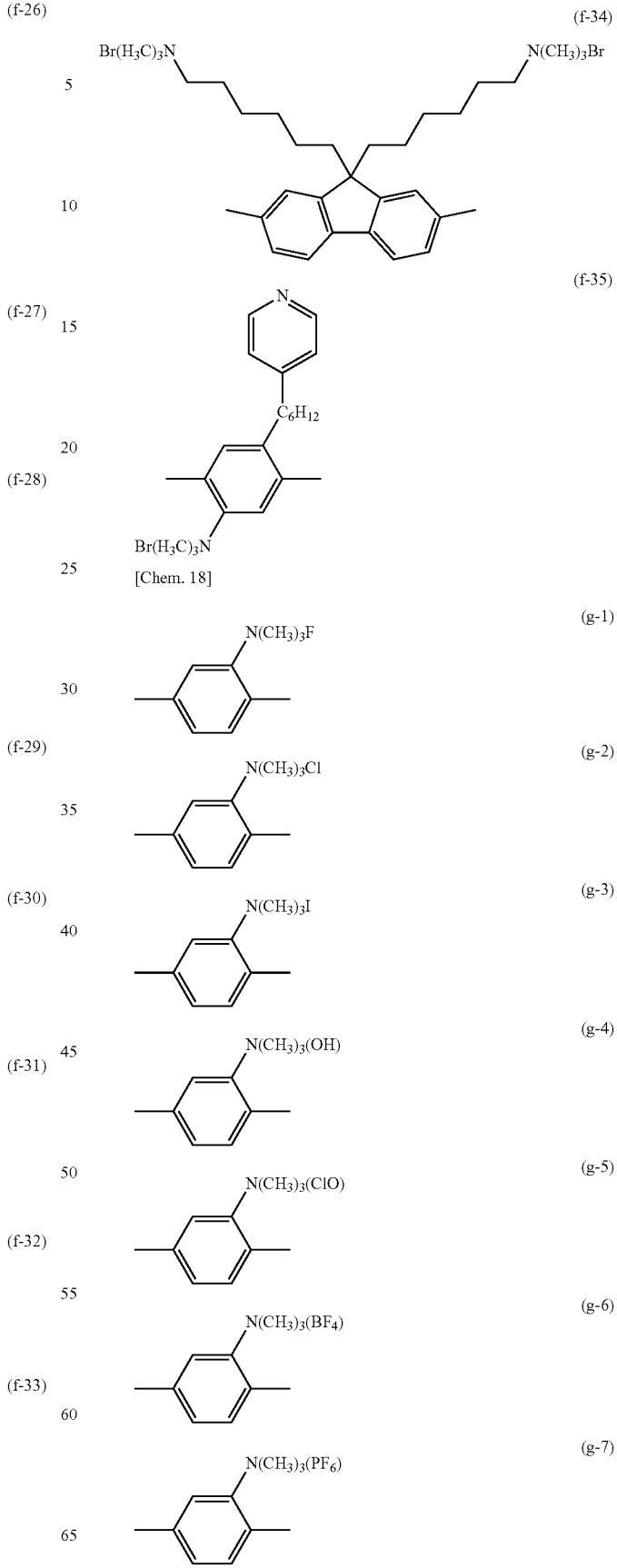

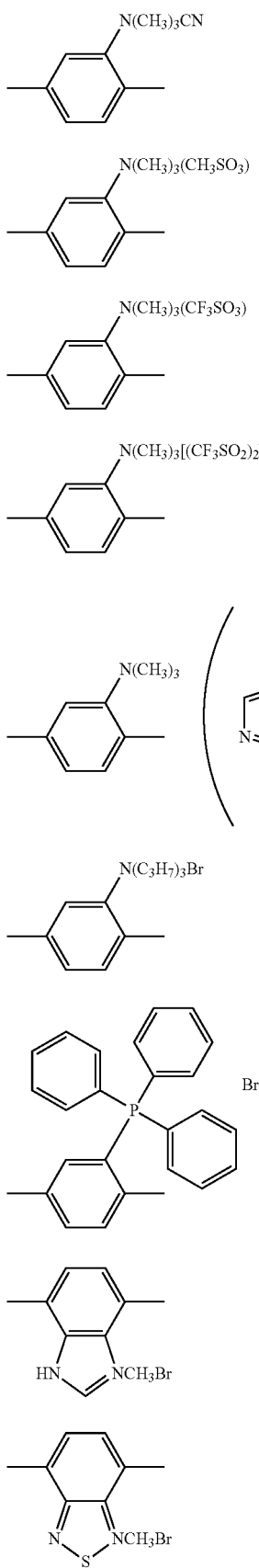
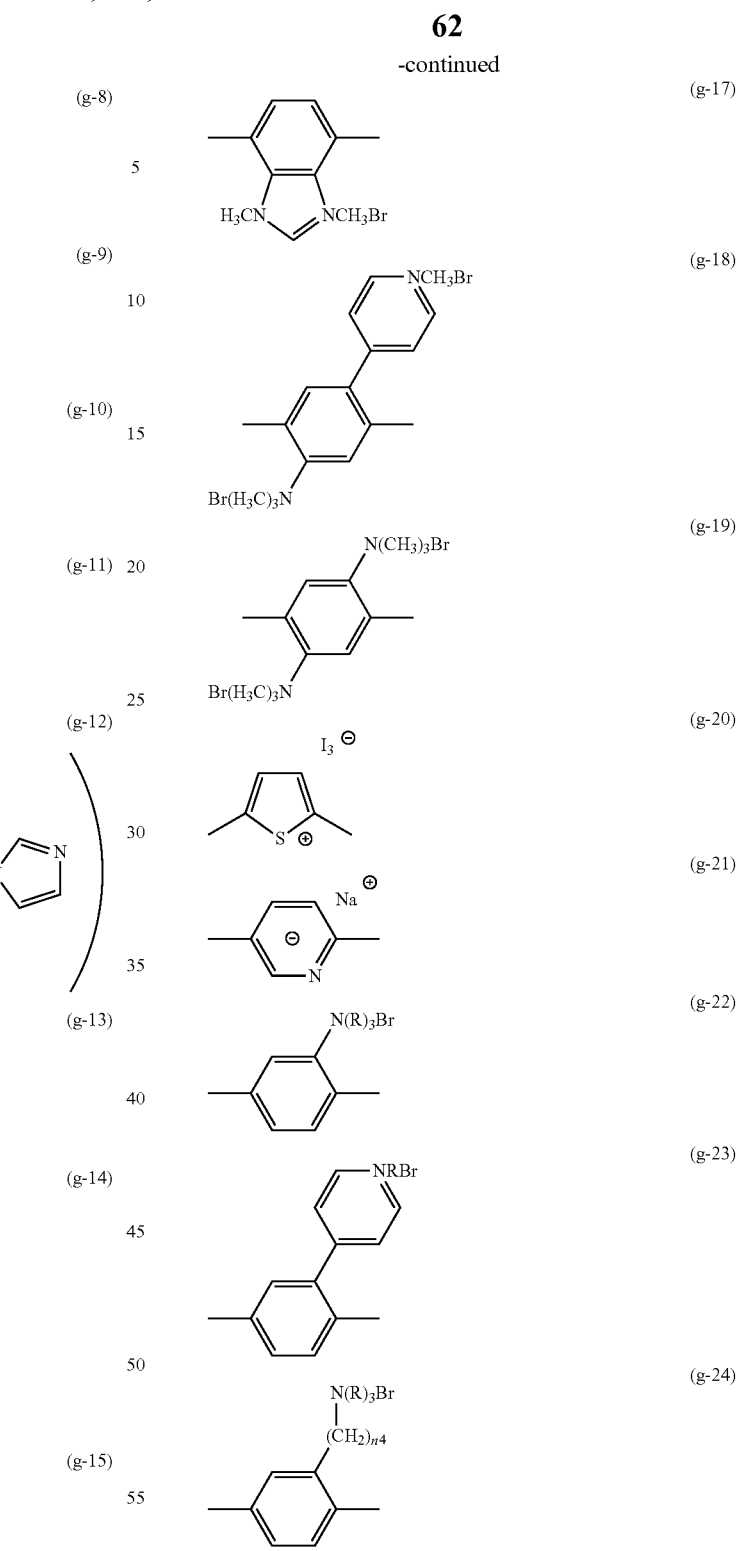
Preferably, the conjugated compound has at least one repeating unit selected from the group consisting of repeating units represented by Formulae (a-1) to (a-7), (a-10) to (a-19), (a-21) to (a-27), (a-29) to (a-35), (b-1) to (b-6), (b-9), (b-11) to (b-16), (b-22), (b-31) to (b-39), (c-1) to (c-15), (c-17), (c-20) to (c-22), (c-24) to (c-27), (c-29), (c-30) to (c-38), (d-1) to (d-6), (d-9), (d-11) to (d-16), (d-22), (d-31) to (d-39), (d-41) to (d-48), (e-1) to (e-3), (e-5) to (e-16), (f-1) to (f-6), (f-9), (f-11) to (f-16), (f-22), (f-31) to (f-35), (g-1)

to (g-13), and (g-16) to (g-24), because they can provide high adsorbability to silver particles, high dispersibility in a solvent, high conductivity, and high electron injection properties. More preferably, the conjugated compound has at least one repeating unit selected from the group consisting of repeating units represented by Formulae (a-1) to (a-3), (a-5), (a-7), (a-10), (a-12), (a-14) to (a-19), (a-21) to (a-27), (a-29) to (a-33), (b-1) to (b-6), (b-9), (b-13), (b-15), (b-16), (b-22), (b-34) to (b-39), (c-1) to (c-15), (c-17), (c-20) to (c-22), (c-24) to (c-27), (c-29) to (c-37), (d-1) to (d-6), (d-9), (d-11), (d-13), (d-15), (d-16), (d-22), (d-31) to (d-39), (d-41), (d-42), (d-47), (d-48), (e-1), (e-5) to (e-8), (e-11), (e-12), (e-15), (e-16), (f-1) to (f-6), (f-9), (f-11), (f-13)), (f-6), (f-22), (f-31), (f-34), (f-35), (g-1) to (g-3), (g-6) to (g-13), and (g-16) to (g-24). Further preferably, the conjugated compound has at least one repeating unit selected from the group consisting of repeating units represented by Formulae (a-1), (a-3), (a-7), (a-10), (a-14), (a-15), (a-17), (a-19), (a-22), (a-23), (a-25) to (a-27), (a-30), (a-31), (b-1), (b-2), (b-5), (b-6), (b-9), (b-11), (b-13), (b-22), (b-34) to (b-39), (c-1) to (c-4), (c-13) (c-15), (c-20) to (c-22), (c-25) to (c-27), (c-30) to (c-33), (d-1), (d-2), (d-5), (d-6), (d-9), (d-11), (d-13), (d-22), (d-31) to (d-38), (d-41), (d-42), (d-47), (d-48), (e-1), (e-5), (e-7), (e-8), (e-11), (e-12), (e-15), (e-16), (f-1), (f-2), (f-5), (f-6), (f-9), (f-13), (f-22), (f-31), (f-34), (f-35), (g-1) to (g-3), (g-6), (g-7), (g-9) to (g-13), and (g-18) to (g-21). Particularly preferably, the conjugated compound has at least one repeating unit selected from the group consisting of repeating units represented by Formulae (a-3), (a-14), (a-22), (a-17), (a-25), (a-30), (a-31), (b-6), (b-22), (b-34) to (b-37), (b-39), (c-1) to (c-4), (c-15), (c-22), (c-27), (c-33), (d-6), (d-22), (d-34) to (d-38), (d-41), (d-42), (d-48), (e-1), (e-5), (e-8), (e-12), (e-15), (f-6), (f-34), (g-2), (g-6), (g-7), (g-10) to (g-12), and (g-18) to (g-21). Even more preferably, the conjugated compound has at least one repeating unit selected from the group consisting of repeating units represented by Formulae (b-6), (b-34), (b-35), (b-37), (c-1) to (c-4), (c-33), (d-6), (d-34), (d-36) to (d-38), (d-41), (d-42), (d-48), (f-6), (f-34), (g-2), and (g-10) to (g-12). Yet more preferably, the conjugated compound has at least one repeating unit selected from the group consisting of repeating units represented by Formulae (b-6), (b-34), (b-37), (c-1) to (c-4), (c-33), (d-38), (d-41), (d-42), and (d-48). Most preferably, the conjugated compound has at least one repeating unit selected from the group consisting of repeating units represented by Formulae (c-33), (d-41), and (d-48).

Examples of the group represented by Formula (I) may include a group obtained by substituting one of the two bonds in the examples of the above repeating unit with a hydrogen atom.

The conjugated compound is a compound having the group represented by Formula (I) above, the repeating unit represented by Formula (II) above, or both of them. The conjugated compound may further have an additional repeating unit other than the repeating unit represented by Formula (II) above.

Examples of the additional repeating unit may include: an atomic group remaining after removing two hydrogen atoms directly bonding to carbon atoms that constitute a ring of an aromatic compound represented by any one of Formulae (1) to (57) and Formulae (n-1) to (n-13) above; an atomic group remaining after removing one hydrogen atom from the above-described monovalent hydrocarbon group; and an atomic group remaining after removing one hydrogen atom directly bonding to a carbon atom that constitutes a ring of the above-described monovalent heterocyclic group. Preferably, the additional repeating unit is an atomic group remaining after removing two hydrogen atoms directly bonding to carbon atoms that constitute a ring of the above aromatic compounds or an atomic group remaining after removing one hydrogen atom from the above monovalent hydrocarbon group. More preferably, the additional repeating unit is an atomic group remaining after removing two hydrogen atoms from an aromatic compound represented by any one of Formulae (1) to (57) above. Further preferably, the additional repeating unit is an atomic group remaining after removing two hydrogen atoms directly bonding to carbon atoms that constitute a ring of a compound represented by any one of Formulae (1) to (8), (17), (24) to (33), (36) to (51), (55), and (56). Particularly preferably, the additional repeating unit is an atomic group remaining after removing two hydrogen atoms directly bonding to carbon atoms that constitute a ring of a compound represented by any one of Formulae (1) to (8), (17), (30) to (33), (36) to (42), (48) to (51), (55), and (56). Yet more preferably, the additional repeating unit is an atomic group remaining after removing two hydrogen atoms directly bonding to carbon atoms that constitute a ring of a compound represented by any one of Formulae (1) to (8). Most particularly preferably, the additional repeating unit is an atomic group remaining after removing two hydrogen atoms directly bonding to carbon atoms that constitute a ring of a compound represented by Formula (3) or (8). These atomic groups may be substituted with, for example, a halogen atom. The repeating unit represented by Formula (II) may be bonded through a group represented by any one of Formulae (h-1) to (h-19) below. Among the groups represented by Formulae (h-1) to (h-19) below, a group represented by any one of Formulae (h-1), (h-3) to (h-6), (h-9), and (h-13) is preferred, and a group represented by Formula (h-9) or (h-13) is more preferred. When the additional repeating unit is included, it is preferable to introduce the additional repeating unit within the range of not inhibiting conjugation of the conjugated compound.

[Chem. 19]

(h-1)

(h-2)

(h-3)

(h-4)

(h-5)

(h-6)

(h-7)

(h-8)

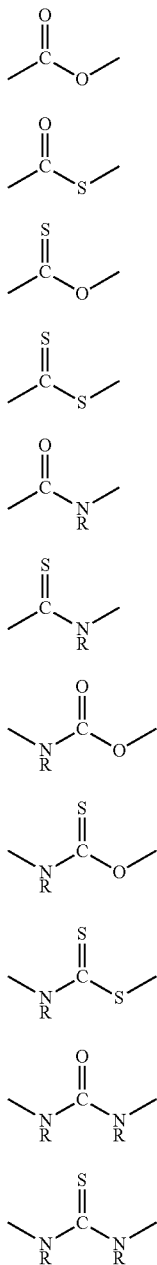

(h-9)
(h-10)
(h-11)
(h-12)
(h-13)
(h-14)
(h-15)
(h-16)
(h-17)
(h-18)
(h-19)

In Formulae, R represents a hydrogen atom or a monovalent hydrocarbon group.

The conjugated compound used in the present invention is preferably any one of the following 1 to 3. These conjugated compounds are water insoluble in the above-described sense.

1. A compound having the group represented by Formula (I) with the bonding hand of $Ar^1$ bonded to a hydrogen atom or a halogen atom 2. A compound having the repeating unit represented by Formula (II)

3. A compound having the group represented by Formula (I) at one or both ends and further having the repeating unit represented by Formula (II)

The conjugated compound used may be doped with a dopant. Preferably, the dopant is used in a ratio of 1 to 50 parts by weight based on 100 parts by weight of the conjugated compound.

Examples of the dopant may include halogens, halogen compounds, Lewis acids, protonic acids, nitrile compounds, organic metal compounds, alkali metals, and alkaline earth metals.

Examples of the halogens may include chlorine, bromine, and iodine.

Examples of the halogen compounds may include interhalogen compounds such as iodine chloride, iodine bromide, and iodine fluoride.

Examples of the Lewis acid may include phosphorus pentafluoride, arsenic pentafluoride, antimony pentafluoride, boron trifluoride, boron trichloride, boron tribromide, and sulfuric anhydride.

Examples of the protonic acid may include: inorganic acids such as hydrochloric acid, sulfuric acid, nitric acid, phosphoric acid, fluoroboric acid, hydrofluoric acid, and perchloric acid; and organic acids such as carboxylic acid and sulfonic acid.

The organic carboxylic acid may be any of aliphatic carboxylic acids, aromatic carboxylic acids, and cycloaliphatic carboxylic acids. Examples of the organic carboxylic acid may include formic acid, acetic acid, oxalic acid, benzoic acid, phthalic acid, maleic acid, fumaric acid, malonic acid, tartaric acid, citric acid, lactic acid, succinic acid, monochloroacetic acid, dichloroacetic acid, trichloroacetic acid, trifluoroacetic acid, nitroacetic acid, and triphenylacetic acid.

The organic sulfonic acid may be any of aliphatic sulfonic acids, aromatic sulfonic acids, and cycloaliphatic sulfonic acids. Examples of the organic sulfonic acid may include: sulfonic acid compounds having one sulfo group in the molecule thereof such as benzenesulfonic acid, p-toluenesulfonic acid, xylenesulfonic acid, naphthalenesulfonic acid, decylbenzenesulfonic acid, dodecylbenzenesulfonic acid, pentadecylbenzenesulfonic acid, methanesulfonic acid, ethanesulfonic acid, 1-propanesulfonic acid, 1-butanesulfonic acid, 1-hexanesulfonic acid, 1-heptanesulfonic acid, 1-octanesulfonic acid, 1-nonanesulfonic acid, 1-decanesulfonic acid, 1-dodecanesulfonic acid, vinylsulfonic acid, styrenesulfonic acid, and allylsulfonic acid; and sulfonic acid compounds having a plurality of sulfo groups in the molecule thereof such as ethanedisulfonic acid, butanedisulfonic acid, pentanedisulfonic acid, decanedisulfonic acid, benzenedisulfonic acid, naphthalenedisulfonic acid, toluenedisulfonic acid, dimethylbenzenedisulfonic acid, diethylbenzenedisulfonic acid, methylnaphthalenedisulfonic acid, and ethylnaphthalenedisulfonic acid.

The organic acid used as the dopant may be a polymer acid. Examples of the polymer acid may include polyvinylsulfonic acid, polystyrenesulfonic acid, a sulfonated styrene-butadiene copolymer, polyallylsulfonic acid, polymethallylsulfonic acid, poly-2-acrylamide-2-methylpropanesulfonic acid, and polyisoprenesulfonic acid.

The nitrile compounds may be a compound including two or more cyano groups in conjugated bonds.

Examples of such a compound may include tetracyanoethylene, tetracyanoethylene oxide, tetracyanobenzene, tetracyanoquinodimethane, and tetracyanoazanaphthalene.

Examples of the organic metal compounds may include tris(4-bromophenyl)ammonium hexachloroantimonate, bis(dithiobenzil)nickel, a bis(tetrabutylammonium)bis(1,3-dithiole-2-thione-4,5-dithiolato)zinc complex, and a tetrabutylammonium bis(1,3-dithiole-2-thione-4,5-dithiolato) nickel(III) complex.

Examples of the alkali metals may include Li, Na, K, Rb, and Cs.

Examples of the alkaline earth metals may include Be, Mg, Ca, Sr, and Ba.

The composition of the silver-conjugated compound composite of the present invention contains an ionic compound, in addition to the silver-conjugated compound composite.

The ionic compound is a compound composed of at least a cation and an anion, and may contain hydration water and a neutral ligand. The neutral ligand is a nonionic compound that has a lone electron pair capable of coordinate-bonding and that does not cause a change in oxidation number of an ionic compound when bonded to the ionic compound. Examples of the neutral ligand may include pyridine, 2,2'-bipyridyl, phenanthroline, terpyridine, triphenylphosphine, carbon monoxide, and crown ethers.

Examples of the cation may include metal cations and organic cations, and metal cations are preferred because the stability of the cations is high.

Examples of the metal cations may include alkali metal cations, alkaline earth metal cations, representative metal cations, and transition metal cations. Alkali metal cations and alkaline earth metal cations are preferred.

Examples of the alkali metal cations may include $Li^+$, $Na^+$, $K^+$, $Rb^+$, $Cs^+$ and $Fr^+$. $Li^+$, $Na^+$, $K^+$, $Rb^+$ or $Cs^+$ is preferred, and $Cs^+$ is more preferred.

Examples of the alkaline earth metal cations may include $Mg^{2+}$, $Ca^{2+}$, $Sr^{2+}$, and $Ba^{2+}$ Examples of the representative metal cations may include $Zn^{2+}$, $Cd^{2+}$, $Hg^+$, $Hg^{2+}$, $Al^{3+}$, $Ga^{3+}$, $In^{3+}$, $Ge^{4+}$, $Sn^{2+}$, $Sn^{4+}$, $Pb^{2+}$, $Pb^{4+}$, $Bi^{3+}$, $Al^{3+}$, $Tl^+$, and $Tl^{3+}$.

Examples of the transition metal cations may include $Sc^{3+}$, $Ti^{4+}$, $V^{3+}$, $V^{5+}$, $Cr^{2+}$, $Cr^{3+}$, $Mn^{2+}$, $Mn^{3+}$, $F^{2+}$, $Fe^{3+}$, $Co^{2+}$, $Co^{3+}$, $Ni^{2+}$, $Ni^{3+}$, $Cu^+$, $Cu^{2+}$, $Y^{3+}$, $Zr^{4+}$, $Nb^{3+}$, $Nb^{5+}$, $Mo^{4+}$, $Mo^{6+}$, $Ru^{4+}$, $Ru^{3+}$, $Pd^+$, $Pd^{2+}$, $Ag^+$, $Sb^{3+}$, $La^{3+}$, $Ce^{3+}$, $Ce^{4+}$, $Eu^{3+}$, $Hf^{4+}$, $Ta^{5+}$, $W^{6+}$, $Re^{6+}$, $Os^{2+}$, $Os^{4+}$, $Ir^{4+}$, $Pt^{2+}$, and $Pt^{4+}$.

Examples of the organic cations may include: onium cations having a nitrogen-containing aromatic ring such as an imidazolium cation and a pyridinium cation; an ammonium cation; and a phosphonium cation.

Examples of the anion may include $F^-$, $Cl^-$, $Br^-$, $I^-$, $OH^-$, $CN^-$, $NO_3^-$, $NO_2^-$, $ClO^-$, $ClO_2^-$, $ClO_3^-$, $ClO_4^-$, $CrO_4^{2-}$, $HSO_4^-$, $SCN^-$, $BF_4^-$, $PF_6^-$, $R^3O^-$ (wherein $R^3$ represents a monovalent hydrocarbon group optionally having a substituent), $R^4COO^-$ (wherein $R^4$ represents a monovalent hydrocarbon group optionally having a substituent), $R^5SO_3^-$ (wherein $R^5$ represents a monovalent hydrocarbon group optionally having a substituent), $R^6OCO_2^-$ (wherein $R^6$ represents a monovalent hydrocarbon group optionally having a substituent), $R^7SO_2^-$ (wherein $R^7$ represents a monovalent hydrocarbon group optionally having a substituent), $R^8S^-$ (wherein $R^8$ represents a monovalent hydrocarbon group optionally having a substituent), $B(R^9)_4^-$ (wherein $R^9$ represents a monovalent hydrocarbon group optionally having a substituent), $CO_3^{2-}$, $S^{2-}$, $SO_4^{2-}$, $S_2O_3^{2-}$, $PO_4^{3-}$, and $O^{2-}$. Of these, $F^-$, $Cl^-$, $Br^-$, $I^-$, $OH^-$, $NO_3^-$, $BF_4^-$, $PF_6^-$, $R^3O^-$, $R^4COO^-$, $R^5SO_3^-$, $R^6CO_3^-$, $R^7SO_2^-$, $CO_3^{2-}$, $SO_4^{2-}$ or $PO_4^{3-}$ is preferred. $F^-$, $Cl^-$, $Br^-$, $I^-$, $OH^-$, $NO_3^-$, $BF_4^-$, $PF_6^-$, $R^3O^-$, $R^4COO^-$, $R^5SO_3^-$, $CO_3^{2-}$, or $SO_4^{2-}$ is more preferred. $F_-$, $Cl^-$, $Br^-$, $I^-$, $OH^-$, $NO_3^-$, $BF_4^-$, $PF_6^-$, $R^4COO^-$, $R^5SO_3^-$, $CO_3^{2-}$, or $SO_4^{2-}$ is still more preferred. $F^-$, $OH^-$, $NO_3^-$, $R^4COO^-$, or $CO_3^{2-}$ is particularly preferred.

Examples of the monovalent hydrocarbon group in the monovalent hydrocarbon group optionally having a substituent represented by $R^3$ to $R^9$ may include: alkyl groups having 1 to 50 carbon atoms such as a methyl group, an ethyl group, a propyl group, an isopropyl group, a butyl group, an isobutyl group, a sec-butyl group, a tert-butyl group, a pentyl group, a hexyl group, a nonyl group, a dodecyl group, a pentadecyl group, an octadecyl group, and a docosyl group; cyclic saturated hydrocarbon groups having 3 to 50 carbon atoms such as a cyclopropyl group, a cyclobutyl group, a cyclobutyl group, a cyclopentyl group, a cyclohexyl group, a cyclononyl group, a cyclododecyl group, a norbornyl group, and an adamantyl group; alkenyl groups having 2 to 50 carbon atoms such as an ethenyl group, a propenyl group, a 3-butenyl group, a 2-butenyl group, a 2-pentenyl group, a 2-hexenyl group, a 2-nonenyl group, and a 2-dodecenyl group; aryl groups having 6 to 50 carbon atoms such as a phenyl group, a 1-naphthyl group, a 2-naphthyl group, a 2-methylphenyl group, a 3-methylphenyl group, a 4-methylphenyl group, a 4-ethylphenyl group, a 4-propylphenyl group, a 4-isopropylphenyl group, a 4-butylphenyl group, a 4-tert-butylphenyl group, a 4-hexylphenyl group, a 4-cyclohexylphenyl group, a 4-adamantylphenyl group, and a 4-phenylphenyl group; and arylalkyl groups having 7 to 50 carbon atoms such as a phenylmethyl group, a 1-phenyleneethyl group, a 2-phenylethyl group, a 1-phenyl-1-propyl group, a 1-phenyl-2-propyl group, a 2-phenyl-2-propyl group, a 3-phenyl-1-propyl group, a 4-phenyl-1-butyl group, a 5-phenyl-1-pentyl group, and a 6-phenyl-1-hexyl group. Of these, alkyl groups having 1 to 50 carbon atoms or aryl groups having 6 to 50 carbon atoms are preferred; alkyl groups having 1 to 12 carbon atoms or aryl groups having 6 to 18 carbon atoms are more preferred; alkyl groups having 1 to 6 carbon atoms or aryl groups having 6 to 12 carbon atoms are further preferred. The hydrocarbon group may have a substituent, and examples of the substituent may include an alkoxy group, aryloxy groups, an amino group, a substituted amino group, a silyl group, a substituted silyl group, a halogen atom, an imine residue, an amido group, an acid imido group, a monovalent heterocyclic group, a mercapto group, a hydroxyl group, a carboxyl group, a cyano group, and a nitro group. Among these, an amino group, a monovalent heterocyclic group, a mercapto group, a hydroxyl group, or a carboxyl group is preferred, and an amino group, a pyridyl group, a mercapto group, a hydroxyl group, or a carboxyl group is more preferred. When the substituent is plurally present (for example, one, two, or three substituents), the plurality of substituents may be the same as or different from each other.

The alkoxy group serving as the substituent may be linear, branched, or cyclic. The alkoxy group has usually 1 to 20 carbon atoms (usually 3 to 20 carbon atoms in a case of a cyclic alkoxy group) and preferably 1 to 10 carbon atoms (3 to 10 carbon atoms in a case of a cyclic alkoxy group). Examples of the alkoxy group may include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a nonyloxy group, a decyloxy group, and a lauryloxy group. A hydrogen atom in the alkoxy group may be substituted with a fluorine atom. Examples of the alkoxy group substituted with a fluorine atom may include a trifluoromethoxy group, a pentafluoroethoxy group, a perfluorobutoxy group, a perfluorohexyloxy group, a perfluorooctyloxy group, a methoxymethoxy group, and a 2-methoxyethoxy group.

The aryloxy group serving as the substituent has usually 6 to 60 carbon atoms and preferably 6 to 48 carbon atoms. Examples of the aryloxy group may include a phenoxy group, $C_1$ to $C_{12}$ alkoxy phenoxy groups, $C_1$ to $C_{12}$ alkyl phenoxy groups, a 1-naphthyloxy group, a 2-naphthyloxy group, and a pentafluorophenyloxy group.

Examples of the $C_1$ to $C_{12}$ alkoxy phenoxy groups may include a methoxyphenoxy group, an ethoxyphenoxy group, a propyloxyphenoxy group, an isopropyloxyphenoxy group, a butoxyphenoxy group, an isobutoxyphenoxy group, a sec-butoxyphenoxy group, a tert-butoxyphenoxy group, a pentyloxyphenoxy group, a hexyloxyphenoxy group, a cyclohexyloxyphenoxy group, a heptyloxyphenoxy group, an octyloxyphenoxy group, a 2-ethylhexyloxyphenoxy group, a nonyloxyphenoxy group, a decyloxyphenoxy group, a 3,7-dimethyloctyloxyphenoxy group, and a lauryloxyphenoxy group.

Examples of the $C_1$ to $C_{12}$ alkyl phenoxy groups may include a methylphenoxy group, an ethylphenoxy group, a dimethylphenoxy group, a propylphenoxy group, a 1,3,5-trimethylphenoxy group, a methylethylphenoxy group, an isopropylphenoxy group, a butylphenoxy group, an isobutylphenoxy group, a sec-butylphenoxygroup, a tert-butylphenoxy group, a pentylphenoxy group, an isoamylphenoxy group, a hexylphenoxy group, a heptylphenoxy group, an octylphenoxy group, a nonylphenoxy group, a decylphenoxy group, and a dodecylphenoxy group.

Examples of the substituted amino group serving as the substituent may include an amino group substituted with one or more groups selected from the group consisting of an alkyl group, an aryl group, an arylalkyl group, and a monovalent heterocyclic group. The substituted amino group has usually 1 to 60 carbon atoms and preferably 2 to 48 carbon atoms. Examples of the substituted amino group may include a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a pyrrolidyl group, a piperidyl group, a ditrifluoromethylamino group, a phenylamino group, a diphenylamino group, a $C_1$ to $C_{12}$ alkoxy phenylamino group, a di($C_1$ to $C_{12}$ alkoxy phenyl)amino group, a di($C_1$ to $C_{12}$ alkyl phenyl)amino group, a 1-naphthylamino group, a 2-naphthylamino group, a pentafluorophenylamino group, a pyridylamino group, a pyridazinylamino group, a pyrimidylamino group, a pyrazylamino group, a triazylamino group, a phenyl-$C_1$ to $C_{12}$ alkyl amino group, a $C_1$ to $C_{12}$ alkoxy phenyl-$C_1$ to $C_{12}$ alkyl amino group, a $C_1$ to $C_{12}$ alkyl phenyl-$C_1$ to $C_{12}$ alkyl amino group, a di($C_1$ to $C_{12}$ alkoxy phenyl-$C_1$ to $C_{12}$ alkyl)amino group, a di($C_1$ to $C_{12}$ alkyl phenyl-$C_1$ to $C_{12}$ alkyl)amino group, a 1-naphthyl-$C_1$ to $C_{12}$ alkyl amino group, and a 2-naphthyl-$C_1$ to $C_{12}$ alkyl amino group.

The monovalent heterocyclic group serving as the substituent is an atomic group remaining after removing one hydrogen atom directly bonding to a carbon atom that constitutes a ring of a heterocyclic compound optionally having a substituent. Examples of a heterocycle of the heterocyclic compound may include: monocyclic heterocycles such as a pyridine ring, a 1,2-diazine ring, a 1,3-diazine ring, a 1,4-diazine ring, a 1,3,5-triazine ring, a furan ring, a pyrrole ring, a thiophene ring, a pyrazole ring, an imidazole ring, an oxazole ring, a thiazole ring, an oxadiazole ring, a thiadiazole ring, and an azadiazole ring; fused polycyclic heterocycles in which two or more rings selected from the monocyclic heterocycles are fused; and bridged polycyclic heterocycles having a structure in which two heterocycles, or one heterocycle and one aromatic ring are bridged through a divalent group (for example, a methylene group, an ethylene group, and a carbonyl group). The heterocycle is preferably a pyridine ring, a 1,2-diazine ring, a 1,3-diazine ring, a 1,4-diazine ring, or a 1,3,5-triazine ring and is more preferably a pyridine ring or a 1,3,5-triazine ring. The optional substituent for the heterocyclic compound is the same as the optional substituent for the monovalent hydrocarbon group represented by $R^3$ to $R^9$. When the substituent is plurally present (for example, one, two, or three substituents), the plurality of substituents may be the same as or different from each other.

Preferably, the ionic compound has a structure represented by the following Compositional Formula (hh-1):

$$M^{m'+}_a X^{m'-}_b \qquad \text{(hh-1)}$$

wherein $M^{m'+}$ represents a metal cation, $X^{m'-}$ represents an anion, a and b are each independently an integer of one or more, and when $M^{m'+}$ and $X^{m'-}$ are each plurally present, they may be the same as or different from each other.

The ionic compound represented by Formula (hh-1) may contain hydration water, a neutral ligand and the like.

In Formula (hh-1), a and b are each independently an integer of preferably 1 to 3 and more preferably 1 or 2. However, a combination of a and b does not create an imbalance in a charge of the whole compound represented by Formula (hh-1).

In Formula (hh-1), m' represents an integer of 1 or more. The definition, specific examples, and preferred examples of the metal cation represented by $M^{m'+}$ are as described above.

In Formula (hh-1), n' represents an integer of 1 or more. The definition, specific examples, and preferred examples of the anion represented by $X^{m'-}$ are as described above.

When the ionic compound contains hydration water, it is preferable that the ionic compound has a structure represented by Formula (hh-2) below.

$$M^{m'+}_a X^{m'-}_b \cdot n''(H_2O) \qquad \text{(hh-2)}$$

In Formula (hh-2), n'' represents an integer of 1 or more. The definitions, specific examples, and preferred examples of $M^{m'+}$, $X^{m'-}$, a and b are as described above.

Examples of the ionic compound may include lithium fluoride, sodium fluoride, potassium fluoride, cesium fluoride, calcium fluoride, gallium fluoride, lithium hydroxide, sodium hydroxide, potassium hydroxide, cesium hydroxide, calcium hydroxide, lithium hydrogencarbonate, potassium hydrogencarbonate, cesium hydrogencarbonate, barium hydrogencarbonate, lithium carbonate, sodium carbonate, potassium carbonate, cesium carbonate, barium carbonate, magnesium carbonate, calcium carbonate, copper carbonate, iron carbonate, silver carbonate, ammonium carbonate, lithium acetate, sodium acetate, potassium acetate, cesium acetate, barium acetate, magnesium acetate, calcium acetate, silver acetate, copper acetate, ammonium acetate, lithium sulfate, sodium sulfate, potassium sulfate, cesium sulfate, calcium sulfate, magnesium sulfate, aluminum sulfate, zinc sulfate, ammonium sulfate, silver sulfate, copper sulfate, iron sulfate, lead sulfate, potassium sulfite, sodium thiosulfate, lithium nitrate, potassium nitrate, sodium nitrate, cesium nitrate, calcium nitrate, ammonium nitrate, silver nitrate, iron nitrate, copper nitrate, cobalt nitrate, lead nitrate, potassium nitrite, lithium phosphate, tripotassium phosphate, trisodium phosphate, aluminum phosphate, sodium hydrogen phosphate, sodium dihydrogen phosphate, potassium perchlorate, potassium permanganate, potassium chromate, potassium cyanate, potassium thiocyanate, sodium tetrafluoroborate, sodium hexafluorophosphate, ammonium hexafluorophosphate, lithium stearate, sodium stearate, cesium stearate, calcium stearate, sodium myristate, zinc myristate, glutaric acid disodium salt, glutaric acid dicesium salt, 6-aminohexanoic acid sodium salt, sodium thiomalate, cesium thiomalate, 4-aminocyclohexanecarboxylic acid sodium salt, 4-aminocyclohexanecarboxylic acid cesium salt, 6-aminohexanoic acid cesium salt, 4-aminobenzenecarboxylic acid cesium salt, sodium linoleate, sodium glutamate, lithium benzoate, sodium benzoate, potassium benzoate, cesium benzoate, lithium terephthalate, sodium terephthalate, cesium terephthalate, pyridinecarboxylic acid lithium salt, pyridinecarboxylic acid sodium salt, pyridinecarboxylic acid potassium salt, pyridinecarboxylic acid cesium salt, pyridinedicarboxylic acid cesium salt, 2-2'-bipyridine-4-4'-dicarboxylic acid cesium salt, 1-butyl-3-methylimidazolium chloride, 1-butylpyridinium hexafluorophosphate, tetrabutylammonium chloride, trimethylbutylammonium chloride, 1-hexyl-1-methylpyrrolidinium chloride, trihexyl(tetradecyl)phosphonium hexafluorophosphate, and glycine hydrochloride.

The ionic compound is preferably lithium fluoride, sodium fluoride, potassium fluoride, cesium fluoride, calcium fluoride, gallium fluoride, lithium hydroxide, sodium hydroxide, potassium hydroxide, cesium hydroxide, sodium carbonate, potassium carbonate, cesium carbonate, barium carbonate, magnesium carbonate, calcium carbonate, copper carbonate, iron carbonate, silver carbonate, ammonium carbonate, lithium acetate, sodium acetate, potassium acetate, cesium acetate, lithium benzoate, sodium benzoate, potassium benzoate, cesium benzoate, lithium terephthalate, sodium terephthalate, cesium terephthalate, pyridinecarboxylic acid lithium salt, pyridinecarboxylic acid sodium salt, pyridinecarboxylic acid potassium salt, pyridinecarboxylic acid cesium salt, 1-butyl-3-methylimidazolium chloride, 1-butylpyridinium hexafluorophosphate, tetrabutylammonium chloride, trimethylbutylammonium chloride, 1-hexyl-1-methylpyrrolidinium chloride, or trihexyl(tetradecyl) phosphonium hexafluorophosphate, more preferably lithium fluoride, sodium fluoride, potassium fluoride, cesium fluoride, calcium fluoride, lithium hydroxide, sodium hydroxide, potassium hydroxide, cesium hydroxide, sodium carbonate, potassium carbonate, cesium carbonate, lithium acetate, sodium acetate, potassium acetate, cesium acetate, lithium benzoate, sodium benzoate, cesium benzoate, cesium terephthalate, or pyridinecarboxylic acid cesium salt, still more preferably cesium fluoride, cesium hydroxide, cesium acetate, cesium benzoate, or pyridinecarboxylic acid cesium salt, and particularly preferably cesium hydroxide.

These ionic compounds may contain hydration water and/or a neutral ligand.

Examples of the compound represented by Formula (hh-2) may include cesium hydroxide monohydrate, cobalt chloride hexahydrate, copper sulfate monohydrate, copper sulfate trihydrate, copper sulfate pentahydrate, sodium sulfate decahydrate, sodium carbonate decahydrate, sodium carbonate monohydrate, aluminum sulfate hexadecahydrate, nickel chloride hexahydrate, tin chloride dihydrate, cobalt iodide hexahydrate, and rhodium chloride trihydrate. Of these, cesium hydroxide monohydrate is preferred.

The ionic compound may be used alone or in combination of two or more types thereof.

The molecular weight of the above ionic compound is preferably less than 1,000, more preferably less than 800, and further preferably less than 500.

In the composition of the silver-conjugated compound composite of the present invention, the added amount of the ionic compound is usually 0.01 to 1,000 parts by weight, preferably 0.1 to 100 parts by weight, and more preferably 1 to 50 parts by weight, based on 100 parts by weight of the silver-conjugated compound composite.

Silver-Conjugated Compound Composite:

In the silver-conjugated compound composite, an adsorbed conjugated compound can be detected by analysis such as spectroscopic analysis, thermal analysis, mass analysis, and elemental analysis.

Examples of the spectroscopic analysis in the present invention may include nuclear magnetic resonance spectroscopy, infrared spectroscopy, Raman spectroscopy, atomic absorption spectrometry, arc discharge emission spectrometry, spark discharge emission spectrometry, inductive coupling plasma emission spectrometry, X-ray photoelectron spectroscopy (XPS), fluorescent X-ray spectroscopy, ultraviolet-visible spectroscopy, and fluorescence spectroscopy. Examples of the thermal analysis may include thermogravimetric analysis, differential thermal analysis, and differential scanning calorimetry. Examples of the mass analysis may include mass spectrometry using various ionization methods.

Because the dispersibility of the conjugated compound adsorbed to the silver particles is improved, the ratio of the number of hetero atoms other than silver atoms present in the silver-conjugated compound composite is preferably 0.01 or more, more preferably 0.02 or more, further preferably 0.025 or more, and particularly preferably 0.03 or more, when the total number of atoms present in the silver-conjugated compound composite that is determined by X-ray photoelectron spectroscopy is 1. The upper limit of the ratio is usually 0.7. More specifically, in the silver-conjugated compound composite, the ratio of [the number of hetero atoms (excluding silver atoms) in the composite]/[the total number of atoms in the composite] measured by an X-ray photoelectron spectroscopy is preferably 0.01 or more, more preferably 0.02 or more, further preferably 0.025 or more, and particularly preferably 0.03 or more, and the upper limit of the ratio is usually 0.7.

In the silver-conjugated compound composite, the characteristics of the conjugated compound can be imparted to the silver particles. Therefore, it is preferable that a peak attributed to the conjugated compound which is not detected in pure metallic silver is detected by X-ray photoelectron spectroscopy. More specifically, in the silver-conjugated compound composite, it is preferable that a peak measured by an X-ray photoelectron spectroscopy for the composite includes a peak attributed to the conjugated compound which is not detected for a pure silver metal.

Prior to a measurement of the silver-conjugated compound composite by X-ray photoelectron spectroscopy, the silver-conjugated compound composite is washed five or more times with a solvent capable of dissolving the conjugated compound weakly adhering to the surface of the silver-conjugated compound composite and with a solvent capable of dissolving other compounds adhering to the silver particles. The washing may be performed by, for example, adding the silver-conjugated compound composite as a sample to a solvent to bring the silver-conjugated compound composite into contact with the solvent, then performing stirring, shaking, and ultrasonic dispersion, and, if necessary, performing centrifugation, removal of a supernatant, re-dispersion, dialysis, filtration, heating, and the like.

The hetero atom means an element other than carbon and hydrogen atoms and is preferably at least one selected from the group consisting of a nitrogen atom, an oxygen atom, a sulfur atom, and a phosphorus atom and more preferably a nitrogen atom, an oxygen atom, or a sulfur atom, for easy synthesis and good stability of silver-conjugated compound composite.

The conjugated compound used in the present invention has a band gap of preferably 2.10 eV or more, more preferably 2.20 eV or more, further preferably 2.40 eV or more, and particularly preferably 2.60 eV or more, because good stability and light-emission properties are achieved. The ionization potential measured by photoelectron spectroscopy in the atmosphere is preferably 5.20 eV or more and more preferably 5.25 eV or more. The upper limit is not particularly limited, but the upper limit is usually 6.50 eV or less. The energy level of the lowest unoccupied molecular orbital is preferably 3.00 eV or less, more preferably 2.90 eV or less, further preferably 2.80 eV or less, and particularly preferably 2.70 eV or less.

The value of the band gap can be determined from the absorption edge on the long-wavelength side of an absorption spectrum measured by ultraviolet-visible-near infrared spectroscopy. The band gap can be measured by, for example, a method described later in Examples.

Preferably, the silver-conjugated compound composite has a particle shape. The particle shape of the silver-conjugated compound composite means that the aspect ratio described above for the silver-conjugated compound composite is less than 1.5. The Feret diameter of the silver-conjugated compound composite is usually 1,100 nm or less.

For example, it has been found from the results of componential analysis on the silver-conjugated compound composite that, when the conjugated compound is adsorbed to silver particles having a Feret diameter of 1,000 nm to prepare a silver-conjugated compound composite, the Feret diameter of the silver-conjugated compound composite can be theoretically 1,100 nm. The Feret diameter of the silver-conjugated compound composite is preferably 700 nm or less and more preferably 400 nm or less. The lower limit of the Feret diameter of the silver-conjugated compound composite is not particularly limited, but the lower limit is usually 1 nm or more.

In the silver-conjugated compound composite, a plurality of silver particles having a Feret diameter of 1,000 nm or less may be aggregated through the conjugated compound adsorbed to the silver particles.

<Preparation Methods>
Preparation Method 1:

The silver-conjugated compound composite can be prepared by, for example, a method including the step of causing silver particles having a Feret diameter of 1,000 nm or less that are preliminarily coated with an unconjugated compound (the silver particles are hereinafter referred to as "coated silver particles") and a conjugated compound having a weight average molecular weight of $3.0 \times 10^2$ or more to be in contact (for example, mixed) with each other in a solvent.

The use of the coated silver particles is advantageous in that silver particles having a Feret diameter of 1,000 nm or less can be easily obtained.

In this preparation method, when the coated silver particles are used, the obtained silver-conjugated compound composite contains the unconjugated compounds in addition to the silver particles and the conjugated compounds. The unconjugated compounds may play a role in mediating adsorption of the conjugated compounds to the silver particles in the preparation method. As a result that a considerable part of the unconjugated compounds is replaced with the conjugated compounds, at least a part of the conjugated compounds directly adsorbs to the silver particles. Therefore, it is sufficient that the unconjugated compound is present in an amount to play the above role. More specifically, the amount of the unconjugated compound contained in the composite is preferably 0.1% by weight or more and more preferably 1% by weight or more. The upper limit of the amount is not particularly limited, but the upper limit is preferably 99% by weight or less, more preferably 80% by weight or less, further preferably 50% by weight or less, particularly preferably 30% by weight or less, and most preferably 10% by weight or less.

The unconjugated compound usable in the above preparation method means an organic compound having no π electron conjugation region, i.e., no delocalization region of conjugated π electron described in the definition of the conjugated compound as above.

Examples of the unconjugated compound may include polyvinylpyrrolidone, polyvinyl alcohol, polyallylamide, and polyacrylic acid. Of these, polyvinylpyrrolidone, polyvinyl alcohol, or polyallylamide is preferred, polyvinylpyrrolidone or polyallylamide is more preferred, and polyvinylpyrrolidone is further preferred.

The coating treatment with the unconjugated compound can be performed, for example, by dispersing the silver particles in a solution containing the unconjugated compound or by reducing a silver compound in the presence of the unconjugated compound.

The solvent usable in the above preparation process is preferably a solvent capable of dissolving a conjugated compound having a weight average molecular weight of $3.0 \times 10^2$ or more. When the coated silver particles are used, the solvent is preferably a solvent capable of dissolving the unconjugated compound that is coated on the silver particles. Examples of such a solvent may include benzene, toluene, xylene, ortho-dichlorobenzene, chloroform, tetrahydrofuran, hexane, diethyl ether, acetonitrile, N-methylpyrrolidone, methanol, ethanol, isopropanol, ethylene glycol, and water. A mixture of two or more of these solvents may be used, or the step of causing the (coated) silver particles and the conjugated compound to be repeatedly brought in contact with each other in different solvents may be performed.

In the solution containing the conjugated compound having a weight average molecular weight of $3.0 \times 10^2$ or more used in the above preparation method, the concentration of the conjugated compound is preferably 10 μmol/L or more, more preferably 50 μmol/L or more, further preferably 100 μmol/L or more, and yet more preferably 200 μmol/L or more, because the adsorption of the conjugated compound to the silver particles is facilitated. The upper limit of the concentration is not particularly limited, but it is preferable that the conjugated compound is dissolved in the solvent.

The amount of the silver particles or coated silver particles in 10 mL of the solution of the conjugated compound having a weight average molecular weight of $3.0 \times 10^2$ or more is preferably 0.1 mg or more, more preferably 1 mg or more, still more preferably 5 mg or more, and particularly preferably 10 mg or more. The upper limit of the amount is usually 10 g, preferably 5 g or less, more preferably 1 g or less, and still more preferably 100 mg or less.

Preparation Method 2:

The silver-conjugated compound composite can also be obtained by, for example, a preparation method including the step of reducing a silver compound in the presence of the conjugated compound having a weight average molecular weight of $3.0 \times 10^2$ or more (this step is hereinafter referred to as a "reducing step").

Examples of the silver compound may include silver chloride, silver bromide, silver iodide, silver sulfide, silver oxide, silver nitrate, silver hypochlorite, silver chlorite, silver chlorate, silver perchlorate, silver acetate, silver sulfate, silver carbonate, silver phosphate, silver tetrafluoroborate, silver hexafluorophosphate, and silver trifluoromethanesulfonate. The silver compound is preferably silver nitrate, silver perchlorate, silver acetate, silver sulfate, silver carbonate, silver phosphate, silver tetrafluoroborate, silver hexafluorophosphate, or silver trifluoromethanesulfonate, and more preferably silver nitrate, silver perchlorate, silver acetate, silver carbonate, silver tetrafluoroborate, silver hexafluorophosphate, or silver trifluoromethanesulfonate, because such a silver compound has high solubility in a reducing agent. The silver compound may be used alone or in combination of two or more types thereof.

Examples of the reducing agent that may be used in the reducing step may include: reducing agents having no aromatic ring such as ethylene glycol, diethylene glycol, and triethylene glycol; and reducing agents having an aromatic ring such as phenol, benzyl alcohol, phenylethyl alcohol, benzaldehyde, phenylacetaldehyde, phenylmethylamine, phenylethylamine, aniline, thiophenol, phenylmethylthiol, phenylethylthiol, thiophene, hydroxythiophene, thiophenealdehyde, furfural, pyrrole, and derivatives thereof. Of these, ethylene glycol, diethylene glycol, triethylene glycol, phenol, benzyl alcohol, phenylethyl alcohol, aniline, thiophenol, phenylmethylthiol, phenylethylthiol, or hydroxythiophene is preferred because the stability and reducing ability of the reducing agent are high. A part or all of hydrogen atoms included in the reducing agent may be substituted. The reducing agent may be used alone or in combination of two or more types thereof.

Examples of the solvent that may be used in the reducing step may include benzene, toluene, xylene, ortho-dichlorobenzene, chloroform, tetrahydrofuran, hexane, diethyl ether, acetonitrile, and N-methylpyrrolidone. The above reducing agent may be used as the solvent.

Preferably, the reducing step is performed in the presence of a metal halide, a hydrogen halide, or both of them.

Examples of the metal halide may include lithium chloride, cesium chloride, tungsten chloride, molybdenum chloride, sodium chloride, magnesium chloride, potassium chloride, calcium chloride, scandium chloride, titanium chloride, vanadium chloride, chromium chloride, manganese chloride, iron chloride, cobalt chloride, nickel chloride, copper chloride, zinc chloride, platinum chloride, tin chloride, silver chloride, sodium bromide, magnesium bromide, potassium bromide, calcium bromide, iron bromide, copper bromide, nickel bromide, silver bromide, sodium iodide, magnesium iodide, potassium iodide, calcium iodide, and silver iodide. Of these, lithium chloride, cesium chloride, tungsten chloride, molybdenum chloride, sodium chloride, magnesium chloride, potassium chloride, calcium chloride, scandium chloride, titanium chloride, vanadium chloride, chromium chloride, manganese chloride, iron chloride, cobalt chloride, nickel chloride, copper chloride, zinc chloride, platinum chloride, tin chloride, iron bromide, or copper bromide is preferred, and potassium chloride, calcium chloride, silver chloride, iron chloride, sodium chloride, or copper chloride is more preferred, for good solubility. These metal halides may be hydrates.

Examples of the hydrogen halide may include hydrogen fluoride, hydrogen chloride, hydrogen bromide, and hydrogen iodide. Since affinity for the silver compound is excellent, hydrogen chloride is preferred.

The metal halide may be used alone or in combination of two or more types thereof, and the hydrogen halide may be used alone or in combination of two or more types thereof.

The method of preparing the silver-conjugated compound composite may include only one step, i.e., only the reducing step, or may include two or more steps including other steps. A preparation method including two or more steps will be described below as a preferred embodiment.

More specifically, such a preparation method is preferably a preparation method including the reducing step and further including, before the reducing step, a heating step of heating the reducing agent having an aromatic ring, because the reducing agent is activated efficiently. In the heating step, the same solvent as that in the reducing step may be used.

First, the reducing agent having an aromatic ring is dissolved in a solvent, if necessary, and is then heated (pre-heated). Then the silver compound is added to the heated reducing agent and is reduced in the presence of a dispersant, if necessary. The desired silver-conjugated compound composite can thereby be prepared. When the silver compound is added to the heated reducing agent, a metal halide and/or a hydrogen halide may be added, in order to prevent the silver-conjugated compound composite from returning to the raw material silver particles.

The heating step is performed preferably in the presence of oxygen and more preferably in the presence of a gas mixture of nitrogen and oxygen in a ratio of nitrogen:oxygen=4:1 (based on volume) (air may be used as a substitute for the gas mixture).

Preferably, the reducing step is performed in an inert atmosphere such as a nitrogen or argon atmosphere.

The temperature in the heating step and the reducing step is usually 40 to 200° C., preferably 60 to 190° C., and more preferably 100 to 190° C. The temperature in the heating step and the temperature in the reducing step may be different.

The time required for the heating step is usually 5 minutes or more, preferable 10 minutes or more, and more preferably 20 minutes or more, and the upper limit is usually 400 minutes.

The time required for the reducing step is usually 5 minutes or more, preferably 10 minutes or more, and particularly preferably 15 minutes or more, and the upper limit is usually 400 minutes.

The method of preparing the silver-conjugated compound composite may further include, after the reducing step, a purifying step of purifying the unpurified silver-conjugated compound composite obtained in the reducing step. The purifying step may be performed by centrifugation, removing a supernatant, re-dispersion, washing, heating, drying, etc.

When the silver-conjugated compound composite obtained by the reducing step and the purifying step is in a state of dispersion liquid, the method may further include a collecting step for obtaining the silver-conjugated compound composite in a solid state by centrifugation, filtration, distillation, etc.

<Dispersion Liquid>

The composition off the silver-conjugated compound composite of the present invention may be used as is. Alternatively, the composition of the present invention may be dispersed in a solvent and used as a dispersion liquid containing the composite and the ionic compound, in order to improve workability during application etc. The solvent used may be a nonpolar or polar organic solvent. Examples of the nonpolar solvent may include benzene, toluene, xylene, ortho-dichlorobenzene, chloroform, tetrahydrofuran, hexane, and diethyl ether, and examples of the polar solvent may include: acetonitrile; N-methylpyrrolidone; and alcohols such as methanol, ethanol, and isopropanol. In the dispersion liquid of the composition of the silver-conjugated compound composite of the present invention, the concentration of the silver-conjugated compound composite is preferably 0.01 to 75% by weight, more preferably 0.05 to 50% by weight, and still more preferably 0.1 to 30% by weight, based on 100% by weight of the dispersion liquid. In the dispersion liquid of the composition of the silver-conjugated compound composite of the present invention, the concentration of the ionic compound is preferably 0.0001 to 20% by weight, more preferably 0.0001 to 10% by weight, further preferably 0.0001 to 1% by weight, particularly preferably 0.001 to 1% by weight, and most preferably 0.001 to 0.1% by weight, based on 100% by weight of the dispersion liquid. In addition to the composition of the silver-conjugated compound composite of the present invention, a dispersion stabilizer, a surfactant, a viscosity modifier, a corrosion inhibitor and the like may be dispersed or dissolved in the dispersion liquid.

The dispersion liquid of the present invention is useful as an electrically conductive paint, a thermally conductive paint, an adhesive, a bond or a functional coating material.

<Layered Structure>

The composition of the silver-conjugated compound composite of the present invention can be used for a layered structure, and thus becomes a material useful for manufacturing an electronic device or the like. The layered structure includes a substrate and a layer containing the composition of the silver-conjugated compound composite of the present invention formed on the substrate. When the layered structure is used for a light-emitting device, the substrate may be, for example, a glass substrate or a plastic substrate formed of polyethylene terephthalate, polyethylene, polypropylene, polycarbonate or the like. The layer containing the composition of the silver-conjugated compound composite of the present invention serves as an electrode.

<Applications>

Representative applications of the composition of the silver-conjugated compound composite of the present invention will next be described.

The composition of the silver-conjugated compound composite of the present invention has excellent electrical conductivity. Therefore, the composition of the silver-conjugated compound composite of the present invention can be used as, for example, an electrode material.

The composition of the silver-conjugated compound composite of the present invention can be used, in a state of dispersion liquid, as an electrically conductive paint. When an application method using the electrically conductive paint is selected, a patterned electrically conductive site can be produced. With this method, an electrode and the like can be manufactured without the need for a process such as vapor deposition, sputtering, etching, and plating. Since the composition of the silver-conjugated compound composite of the present invention has high electrical conductivity and electron injection properties, the electrode thus obtained has both high electrical conductivity and electron injection properties. This electrode can be used for organic electronic devices such as light-emitting devices (for example, organic electroluminescent devices), organic transistors, and photovoltaic cells (for example, solar cells). In addition, the composition of the silver-conjugated compound composite of the present invention is used for heating devices, electromagnetic wave shielding films, antennas, integrated circuits, antistatic agents or the like. The above-described state of dispersion liquid is suitable for application.

A light-emitting device includes electrodes comprised of an anode and a cathode, and a light-emitting layer provied between the electrodes. The composition of the silver-conjugated compound composite of the present invention can be used for the electrodes. The light-emitting device may further include a substrate, a hole injection layer, an electron injection layer, a hole transport layer, an electron transport layer, etc.

The light-emitting device may be any of a so-called bottom emission type in which light is emitted from the substrate side, a so-called top emission type in which light is emitted from an opposite side to the substrate, and a dual-sided emission type.

The light-emitting device of the present invention may further include other components between the cathode and the light-emitting layer or between the anode and the light-emitting layer.

For example, one or more of a hole injection layer and a hole transport layer may be provided between the anode and the light-emitting layer. When the hole injection layer is present, one or more hole transport layers may be provided between the light-emitting layer and the hole injection layer.

One or more of an electron injection layer and an electron transport layer may be provided between the cathode and the light-emitting layer. When the electron injection layer is present, one or more electron transport layers may be provided between the light-emitting layer and the electron injection layer.

A layer containing the composition of the silver-conjugated compound composite of the present invention can be used as a hole injection layer, a hole transport layer, an electron injection layer, an electron transport layer or the like.

The anode is an electrode for supplying a hole to a hole injection layer, a hole transport layer, a light-emitting layer or the like, and the cathode is an electrode for supplying an electron to an electron injection layer, an electron transport layer, a light-emitting layer or the like.

The light-emitting layer refers to a layer having: a function of receiving holes from an anode or an adjacent layer on the anode side and receiving electrons from a cathode or an adjacent layer on the cathode side when an electric field is applied; a function of moving received charges (electrons and holes) by the force of the electric field; and a function of providing a site where electrons and holes are recombined and thereby leading to light emission.

The electron injection layer is a layer adjacent to a cathode. This layer has a function of receiving electrons from the cathode and further has, as necessary, any one of a function of transporting electrons, a function of blocking holes injected from an anode, and a function of supplying electrons to a light-emitting layer. The electron transport layer is a layer mainly having a function of transporting electrons. This layer further has, as necessary, any one of a function of receiving electrons from a cathode, a function of blocking holes injected from an anode, and a function of supplying electrons to a light-emitting layer.

The hole injection layer is a layer adjacent to an anode. This layer has a function of receiving holes from the anode and further has, as necessary, any one of a function of transporting holes, a function of supplying holes to a light-emitting layer, and a function of blocking electrons injected from a cathode. The hole transport layer is a layer mainly having a function of transporting holes. This layer further has, as necessary, any one of a function of receiving holes from an anode, a function of supplying holes to a light-emitting layer, and a function of blocking electrons injected from a cathode.

The electron transport layer and the hole transport layer may be collectively referred to as a charge transport layer. The electron injection layer and the hole injection layer may be collectively referred to as a charge injection layer.

More specifically, the light-emitting device may have the following layer structure (a). Alternatively, the light-emitting device may have a layer structure in which one or more of a hole injection layer, a hole transport layer, an electron transport layer, and an electron injection layer are omitted from the layer structure (a). In the layer structure (a), it is preferable that a layer containing the composition of the silver-conjugated compound composite used in the present invention is used in a cathode.

(a) Anode-(hole injection layer)-(hole transport layer)-light-emitting layer-(electron transport layer)-(electron injection layer)-cathode Here, the symbol "-" indicates that the layers on both sides of the symbol are adjacently stacked. The "(hole injection layer)" indicates a layer structure including one or more hole injection layers. The "(hole transport layer)" indicates a layer structure including one or more hole transport layers. The "(electron injection layer)" indicates a layer structure including one or more electron injection layers. The "(electron transport layer)" indicates a layer structure including one or more electron transport layers. The same shall apply to the description of the following layer structures.

The light-emitting device may include two light-emitting layers in a single layered structure. In such a case, the light-emitting device may have the following layer structure (b). Alternatively, the light-emitting device may have a layer structure in which one or more of a hole injection layer, a hole transport layer, an electron transport layer, an electron injection layer, and an electrode are omitted from the layer structure (b). In the layer structure (b), it is preferable that a layer containing the composition of the silver-conjugated compound composite used in the present invention is used in the cathode.

(b) Anode-(hole injection layer)-(hole transport layer)-light-emitting layer-(electron transport layer)-(electron injection layer)-electrode-(hole injection layer)-(hole transport layer)-light-emitting layer-(electron transport layer)-(electron injection layer)-cathode The light-emitting device may include three or more light-emitting layers in a single layered structure. In such a case, the light-emitting device may have the following layer structure (c). Alternatively, the light-emitting device may have a layer structure in which one or more of a hole injection layer, a hole transport layer, an electron transport layer, an electron injection layer, and an electrode are omitted from the layer structure (c). In the layer structure (c), it is preferable that a layer containing the composition of the silver-conjugated compound composite used in the present invention is used in a cathode.

(c) Anode-(hole injection layer)-(hole transport layer)-light emitting layer-(electron transport layer)-(electron injection layer)-repeating unit A-repeating unit A . . . -cathode Here, the "repeating unit A" indicates a unit of a layer structure of electrode-(hole injection layer)-(hole transport layer)-light-emitting layer-(electron transport layer)-(electron injection layer).

Preferred examples of the layer structure of the light-emitting device may include the structures below. In the layer structures below, a layer containing the composition of the silver-conjugated compound composite used in the present invention may be used as one or more layers selected from the group consisting of an anode, a hole injection layer, a hole transport layer, an electron injection layer, an electron transport layer, and a cathode.

(a') Anode-light-emitting layer-cathode (b') Anode-hole injection layer-light-emitting layer-cathode (c') Anode-light-emitting layer-electron injection layer-cathode (d') Anode-hole injection layer-light-emitting layer-electron injection layer-cathode (e') Anode-hole injection layer-hole transport layer-light-emitting layer-cathode (f') Anode-hole injection layer-hole transport layer-light-emitting layer-electron injection layer-cathode (g') Anode-light-emitting layer-electron transport layer-electron injection layer-cathode (h') Anode-hole injection layer-light-emitting layer-electron transport layer-electron injection layer-cathode (i') Anode-hole injection layer-hole transport layer-light-emitting layer-electron transport layer-electron injection layer-cathode The layer containing the composition of the silver-conjugated compound composite of the present invention is preferably an anode or a cathode, and more preferably a cathode.

In the light-emitting device, an insulating layer may be provided adjacent to an electrode in order to enhance adhesion with the electrode and to improve injection of charges from the electrode. Also, a thin buffer layer may be inserted in the interface of a charge transport layer (i.e., a hole transport layer or an electron transport layer) or a light-emitting layer in order to enhance the adhesion of the interface and to prevent mixing at the interface. The order and the number of stacked layers to be stacked, and the thicknesses of each layer can be determined in consideration of light-emitting efficiency and a device life.

Next, materials of the layers constituting the light-emitting device and methods for forming these layers will be described in more detail.

—Substrate—

The light-emitting device is usually formed using a substrate. Any substrate may be used so long as it does not change chemically during the formation of an electrode and an organic layer. Examples of the substrate may include a glass substrate, a plastic substrate, a macromolecular film substrate, a metal film substrate, a silicon substrate, and a laminated substrate thereof. A commercially available substrate may be used, or the substrate may be manufactured by a known method.

When the light-emitting device forms a pixel of a display device, a circuit for driving the pixel may be provided on the substrate, and a planarization film may be provided on the driving circuit. When a planarization film is provided, it is preferable that the center line average roughness (Ra) of the planarization film satisfy Ra<10 nm.

The Ra can be measured based on the Japanese Industrial Standards JIS-B0601-2001 with reference to JIS-B0651 to JIS-B0656, JIS-B0671-1, etc.

—Anode—

In the anode constituting the light-emitting device, the work function of the light-emitting layer-side surface of an anode is preferably 4.0 eV or more, for excellent properties of supplying holes to organic semiconductor materials used in the hole injection layer, the hole transport layer, the light-emitting layer and the like.

In the light-emitting device, metals, alloys, metal oxides, electrically conductive compounds such as metal sulfides, and a mixture thereof can be used for an anode material other than the composition of the silver-conjugated compound composite of the present invention. Specific examples of such a material may include: electrically conductive metal oxides such as tin oxide, zinc oxide, indium oxide, indium tin oxide (ITO), indium zinc oxide (IZO), and molybdenum oxide; metals such as gold, silver, chromium, and nickel; and mixtures of these electrically conductive metal oxides and metals.

The anode may have a single-layer structure formed of one type or two or more types of these materials, or may have a multi-layer structure formed of a plurality of layers having the same composition or different compositions. When the anode has a multi-layer structure, it is more preferable that a material having a work function of 4.0 eV or more is used for a top surface layer on the light-emitting layer side.

As a method for manufacturing an anode, a known method can be used. Examples thereof may include a vacuum deposition method, a sputtering method, an ion plating method, a plating method, and a film-formation method using a solution (a solution mixture containing a macromolecular binder may be used).

The thickness of the anode is usually 10 nm to 10 μm, and preferably 40 nm to 500 nm.

The center line average roughness (Ra) of the light-emitting layer-side surface of the anode satisfies preferably Ra<10 nm, and more preferably Ra<5 nm, because defective electrical connection such as a short circuit can be more effectively prevented.

After being manufactured according to the above method, the anode may be subjected to a surface treatment with UV ozone, a silane coupling agent, a solution containing an electron acceptor compound such as 2,3,5,6-tetrafluoro-7,7,8,8-tetracyanoquinodimethane, etc. The surface treatment improves electrical connection with a layer in contact with the anode.

In the light-emitting device, when an anode is used as a light reflecting electrode, it is preferable that the anode has a multi-layer structure in which a light reflecting layer that is formed of a high light reflecting metal and a high work function material layer that contains a material having a work function of 4.0 eV or more are combined.

Examples of the structure of such an anode may include the following (i) to (v).

(i) Ag—$MoO_3$
(ii) (Ag—Pd—Cu alloy)-(ITO and/or IZO)
(iii) (Al—Nd alloy)-(ITO and/or IZO)
(iv) (Mo—Cr alloy)-(ITO and/or IZO)
(v) (Ag—Pd—Cu alloy)-(ITO and/or IZO)-$MoO_3$ In order to obtain sufficient light reflectance, the thickness of a light reflecting layer formed of a high light reflecting metal such as Al, Ag, an Al alloy, an Ag alloy and a Cr alloy is preferably 50 nm or more, and more preferably 80 nm or more. The thickness of the high work function material layer such as an ITO, IZO and $MoO_3$ layer is usually within a range of 5 nm to 500 nm.

—Hole Injection Layer—

In the light-emitting device, preferred examples of a material for forming the hole injection layer other than the composition of the silver-conjugated compound composite used in the present invention may include carbazole derivatives, triazole derivatives, oxazole derivatives, oxadiazole derivatives, imidazole derivatives, fluorene derivatives, polyarylalkane derivatives, pyrazoline derivatives, pyrazolone derivatives, phenylenediamine derivatives, arylamine derivatives, starburst amines, phthalocyanine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene-based compounds, porphyrin-based compounds, polysilane-based compounds, poly(N-vinylcarbazole) derivatives, organic silane derivatives, and polymers containing these; electrically conductive metal oxides such as vanadium oxide, tantalum oxide, tungsten oxide, molybdenum oxide, ruthenium oxide, and aluminum oxide; electrically conductive polymers and oligomers such as polyaniline, aniline-based copolymers, thiophene oligomers, and polythiophene; electrically conductive organic materials such as poly(3,4-ethylenedioxythiophene)-polystyrene sulfonic acid and polypyrrole, and polymers containing these; amorphous carbon; acceptor organic compounds such as tetracyanoquinodimethane derivatives (for example, 2,3,5,6-tetrafluoro-7,7,8,8-tetracyanoquinodimethane), 1,4-naphthoquinone derivatives, diphenoquinone derivatives, and polynitro compounds; and silane coupling agents such as octadecyltrimethoxysilane.

The material may be used alone or in combination of two or more types thereof. The hole injection layer may have a single-layer structure formed only of the above material, or may have a multi-layer structure formed of a plurality of layers having the same composition or different compositions. The material described as examples of the material of the hole transport layer may be used as the material of the hole injection layer.

As a method for manufacturing the hole injection layer, a known method can be used. When the hole injection material used for the hole injection layer is an inorganic material, a vacuum deposition method, a sputtering method, an ion plating method or the like can be used. When the hole injection material is a low molecular organic material, a vacuum deposition method, a transfer method such as a laser transfer or thermal transfer, a film-formation method using a solution (a solution mixture containing a macromolecular binder may be used) or the like can be used. When the hole injection material is a macromolecular organic material, a film-formation method using a solution can be used.

When the hole injection material is a low molecular organic material such as a pyrazoline derivative, an arylamine derivative, a stilbene derivative and a triphenyldiamine derivative, it is preferable to form a hole injection layer using a vacuum deposition method.

The hole injection layer may be formed using a solution mixture in which a macromolecular compound binder and the above low molecular organic material are dispersed.

The macromolecular compound binder to be mixed is preferably a compound that does not excessively inhibit charge transport, and a compound that does not strongly absorb visible light is preferably used. Examples of such a macromolecular compound binder may include poly(N-vinylcarbazole), polyaniline and derivatives thereof, polythiophene and derivatives thereof, poly(p-phenylenevinylene) and derivatives thereof, poly(2,5-thienylenevinylene) and derivatives thereof, polycarbonate, polyacrylate, polymethyl acrylate, polymethyl methacrylate, polystyrene, polyvinyl chloride, and polysiloxane.

The solvent used for film-formation using a solution may be any solvent that can dissolve the hole injection material. Examples of such a solvent may include: water; chlorine-containing solvents such as chloroform, methylene chloride, and dichloroethane; ether solvents such as tetrahydrofuran; aromatic hydrocarbon solvents such as toluene and xylene; ketone solvents such as acetone and methyl ethyl ketone; and ester solvents such as ethyl acetate, butyl acetate, and ethylcellosolve acetate.

The film-formation method using a solution may include an application method, and specific examples thereof may include: coating methods such as a spin coating method, a casting method, a bar coating method, a roll coating method, a wire bar coating method, a dip coating method, a slit coating method, a capillary coating method, a spray coating method, and a nozzle coating method; and printing methods such as a micro-gravure printing method, a gravure printing method, a screen printing method, a flexographic printing method, an offset printing method, a reverse printing method, and an inkjet printing method.

Printing methods such as a gravure printing method, a screen printing method, a flexographic printing method, an offset printing method, a reverse printing method, and an inkjet printing method and a nozzle coating method are preferred, because a pattern can be easily formed.

When forming an organic compound layer such as the hole transport layer and the light-emitting layer following to the hole injection layer, particularly when forming both layers by an application method, a previously applied layer (hereinafter, also referred to as a "lower layer") might be dissolved in a solvent contained in a solution for a subsequently applied layer (hereinafter, also referred to as an "upper layer"), and thus a layered structure cannot be formed. In such a case, a method of insolubilizing the lower layer to a solvent may be used. Examples of the method of insolubilizing the lower layer to a solvent may include: a method of introducing a crosslinking group into a macromolecular compound contained in the lower layer for crosslinking and insolubilization; a method of mixing a low molecular compound having a crosslinking group containing an aromatic ring typified by an aromatic bisazide as a crosslinking agent for crosslinking and insolubilization; a method of mixing a low molecular compound having a crosslinking group not containing an aromatic group typified by an acrylate group as a crosslinking agent for crosslinking and insolubilization; a method of exposing the lower layer to ultraviolet rays for crosslinking and insolubilization to the organic solvent used for the manufacture of the upper layer; and a method of heating the lower layer for crosslinking and insolubilization to the organic solvent used for the manufacture of the upper layer. The heating temperature when heating the lower layer is usually 100° C. to 300° C., and the heating time is usually 1 minute to 1 hour.

As another method for stacking an upper layer without dissolving a lower layer, there may be a method of using solutions having different polarities for the manufacture of adjacent layers. Examples of such a method may include a method of using a water soluble macromolecular compound for a lower layer and an oil-based solution containing an oil soluble macromolecular compound as a solution for an upper layer, so that the lower layer is not dissolved even when the upper layer is applied thereon.

The optimal value of the thickness of the hole injection layer varies depending on a material used, and the thickness may be determined such that a driving voltage and luminous efficiency have appropriate values. The thickness of the hole injection layer is usually 1 nm to 1 μm, preferably 2 nm to 500 nm, and more preferably 10 nm to 100 nm.

—Hole Transport Layer—

Examples of the material constituting the hole transport layer in the light-emitting device other than the composition of the silver-conjugated compound composite used in the present invention may include: carbazole derivatives, triazole derivatives, oxazole derivatives, oxadiazole derivatives, imidazole derivatives, fluorene derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene-based compounds, porphyrin-based compounds, polysilane-based compounds, poly(N-vinylcarbazole) derivatives, organic silane derivatives, and polymers thereof; electrically conductive polymers and oligomers such as aniline-based copolymers, thiophene oligomers, and polythiophene; and electrically conductive organic materials such as polypyrrole.

The material may be used alone or in combination of two or more types thereof. The hole transport layer may have a single-layer structure formed only of the above material, or may have a multi-layer structure formed of a plurality of layers having the same composition or different compositions. The material described as examples of the material of the hole injection layer may be used as the material of the hole transport layer.

Other useful materials constituting the hole transport layer include compounds disclosed in JP 63-70257 A, JP 63-175860 A, JP 2-135359 A, JP 2-135361 A, JP 2-209988 A, JP 3-37992 A, JP 3-152184 A, JP 5-263073 A, JP 6-1972 A, JP 2006-295203 A, WO2005/52027, etc. Of these, a polymer containing a divalent aromatic amine residue as a repeating unit is suitably used.

A film-forming method of the hole transport layer includes the same method as that of the hole injection layer. Examples of the film-forming method using a solution may include an application method, and specific examples thereof may include: coating methods such as a spin coating method, a casting method, a bar coating method, a slit coating method, a spray coating method, and a nozzle coating method; and printing methods such as a gravure printing method, a screen printing method, a flexographic printing method, and an inkjet printing method. When using a sublimable compound material, a vacuum deposition method and a transfer method may be used. The solvent used for the film-formation method using a solution may be the same as the solvents described as examples in the film-formation method of the hole injection layer.

When forming an organic layer such as the light-emitting layer by an application method following to the hole transport layer, in the case of the lower layer being dissolved in a solvent contained in a solution for a subsequently applied layer, the lower layer can be insolubilized to the solvent using the same methods as those described in the film-formation method of the hole injection layer.

The optimal value of the thickness of the hole transport layer varies depending on a material used, and the thickness may be determined such that a driving voltage and luminous efficiency have appropriate values. The thickness of the hole transport layer is usually 1 nm to 1 µm, preferably 2 nm to 500 nm, and more preferably 5 nm to 100 nm.

—Light-Emitting Layer—

When the light-emitting layer contains a macromolecular compound in the light-emitting device, preferred examples of the macromolecular compound may include conjugated macromolecular compounds such as polyfluorene derivatives, polyparaphenylenevinylene derivatives, polyphenylene derivatives, polyparaphenylene derivatives, polythiophene derivatives, polydialkylfluorenes, polyfluorenebenzothiadiazole, and polyalkylthiophenes.

The light-emitting layer containing the macromolecular compound may contain a macromolecular dye compound such as a perylene-based dye, a coumarin-based dye and a rhodamine-based dye, or a low molecular dye compound such as rubrene, perylene, 9,10-diphenyl anthracene, tetraphenyl butadiene, Nile red, coumarin 6 and quinacridone. The light-emitting layer may further contain a naphthalene derivative, anthracene or a derivative thereof, perylene or a derivative thereof, a dye such as a polymethine-based, xanthene-based, coumarin-based and cyanine-based dye, a metal complex of 8-hydroxyquinoline or a derivative thereof, aromatic amine, tetraphenyl cyclopentadiene or a derivative thereof, tetraphenyl butadiene or a derivative thereof, and a phosphorescent metal complex such as tris (2-phenylpyridine)iridium.

The light-emitting layer included in the light-emitting device may be made of a composition including an unconjugated macromolecular compound and a light-emitting organic compound such as the above organic dyes and metal complexes. Examples of the unconjugated macromolecular compound may include polyethylene, polyvinyl chloride, polycarbonate, polystyrene, poly(methyl methacrylate), poly(butyl methacrylate), polyester, polysulfone, polyphenylene oxide, polybutadiene, poly(N-vinylcarbazole), hydrocarbon resins, ketone resins, phenoxy resins, polyamide, ethyl cellulose, vinyl acetate, ABS resins, polyurethane, melamine resins, unsaturated polyester resins, alkyd resins, epoxy resins, and silicon resins. The unconjugated macromolecular compound may have, in its side chain, a structure of one or more derivatives or compounds selected from the group consisting of carbazole derivatives, triazole derivatives, oxazole derivatives, oxadiazole derivatives, imidazole derivatives, fluorene derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, and organic silane derivatives.

When the light-emitting layer contains a low molecular compound, examples of the low molecular compound may include: low-molecular dye compounds such as rubrene, perylene, 9,10-diphenyl anthracene, tetraphenyl butadiene, Nile red, coumarin 6, carbazole, and quinacridone; naphthalene derivatives; anthracene and derivatives thereof; perylene and derivatives thereof; dyes such as polymethine-based, xanthene-based, coumarin-based, cyanine-based and indigo-based dyes; metal complexes of 8-hydroxyquinoline and derivatives thereof; metal complexes of phthalocyanine and derivatives thereof; aromatic amines; tetraphenyl cyclopentadiene and derivatives thereof; and tetraphenyl butadiene and derivatives thereof.

When the light-emitting layer contains a phosphorescent metal complex, examples of the phosphorescent metal complex may include tris(2-phenylpyridine)iridium, thienylpyridine ligand-containing iridium complexes, phenylquinoline ligand-containing iridium complexes, and triazacyclononane backbone-containing terbium complexes.

Examples of the macromolecular compound used in the light-emitting layer may include polyfluorene, derivatives and copolymers thereof, polyarylene, derivatives and copolymers thereof, polyarylenevinylene, derivatives and copolymers thereof, and (co)polymers of aromatic amine and derivatives thereof, disclosed in WO97/09394, WO98/27136, WO99/54385, WO00/22027, WO01/19834, GB2340304A, GB2348316, U.S. Pat. No. 573,636, U.S. Pat. No. 5,741,921, U.S. Pat. No. 5,777,070, EP0707020, JP 9-111233 A, JP 10-324870 A, JP 2000-80167 A, JP 2001-123156 A, JP 2004-168999 A, JP 2007-162009 A, and "Development and Constituent Material of Organic EL Device" (CMC Publishing Co., Ltd., issued in 2006).

Examples of the low molecular compound may include compounds described in JP 57-51781 A, "Organic Thin Film Work Function Data Collection, [2nd edition]" (CMC Publishing Co., Ltd., issued in 2006), and "Development and Constituent Material of Organic EL Device" (CMC Publishing Co., Ltd., issued in 2006).

The material may be composed of a single component or of a composition including a plurality of components. The light-emitting layer may have a single-layer structure composed of one type or two or more types of the above materials, or a multi-layer structure formed of a plurality of layers having the same composition or different compositions.

Examples of the film-formation method of the light-emitting layer may include the same method as that of the hole injection layer. Examples of the film-formation method using a solution may include an application method, and specific examples thereof may include: coating methods such as a spin coating method, a casting method, a bar coating method, a slit coating method, a spray coating method, and a nozzle coating method; and printing methods such as a gravure printing method, a screen printing method, a flexographic printing method, and an inkjet printing method. When using a sublimable compound material, a vacuum deposition method, a transfer method or the like may be used.

Examples of the solvent used for film-formation using a solution may be the same as the solvents described as examples in the film-formation method of the hole injection layer.

When forming an organic compound layer such as the electron transport layer by an application method following to the light-emitting layer, in the case of a lower layer being dissolved in a solvent contained in a solution of a subsequently applied layer, the lower layer may be insolubilized to the solvent using the same methods as those described in the film-formation method of the hole injection layer.

The optimal value of the thickness of the light-emitting layer varies depending on a material used, and the thickness may be determined such that a driving voltage and luminous efficiency have appropriate values. The thickness of the light-emitting layer is usually 5 nm to 1 µm, preferably 10 nm to 500 nm, and more preferably 30 nm to 200 nm.

—Electron Transport Layer—

As a material constituting the electron transport layer in the light-emitting device other than the silver-conjugated compound composite composition used in the present invention, a known material may be used. Examples thereof may include triazole derivatives, oxazole derivatives, oxadiazole derivatives, imidazole derivatives, fluorene derivatives, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, anthraquinodimethane derivatives, anthrone derivatives, thiopyran dioxide derivatives, carbodiimide derivatives, fluorenylidenemethane derivatives, distyrylpyrazine derivatives, tetracarboxylic anhydrides of aromatic ring such as naphthalene and perylene, phthalocyanine derivatives, various metal complexes typified by metal complexes of 8-quinolinol derivatives, metal phthalocyanines and a metal complex having benzoxazole or benzothiazole as a ligand, organic silane derivatives, metal complexes of 8-hydroxyquinoline and derivatives thereof, polyquinoline and derivatives thereof, polyquinoxaline and derivatives thereof, and polyfluorene and derivatives thereof. Of these, triazole derivatives, oxadiazole derivatives, benzoquinone and derivatives thereof, anthraquinone and derivatives thereof, metal complexes of 8-hydroxyquinoline and derivatives thereof, polyquinoline and derivatives thereof, polyquinoxaline and derivatives thereof, and polyfluorene and derivatives thereof are preferred.

The material may be composed of a single component or a composition composed of a plurality of components. The electron transport layer may have a single-layer structure composed of one type or two or more types of the above materials, or may have a multi-layer structure formed of a plurality of layers having the same composition or different compositions. The materials described as examples of the material of the electron injection layer can be used as the material of the electron transport layer.

The film-formation method of the electron transport layer includes the same method as that of the hole injection layer. Examples of the film-formation method using a solution may include an application method, and specific examples thereof may include: coating methods such as a spin coating method, a casting method, a bar coating method, a slit coating method, a spray coating method, and a nozzle coating method; and printing methods such as a gravure printing method, a screen printing method, a flexographic printing method, and an inkjet printing method. When using a sublimable compound material, a vacuum deposition method, a transfer method or the like may be used.

The solvent used for the film-formation method using a solution may include the solvents described as examples in the film-formation method of the hole injection layer.

When forming an organic compound layer such as the electron injection layer by an application method following to the electron transport layer, in the case of a lower layer being dissolved in a solvent contained in a solution of a subsequently applied layer, the lower layer may be insolubilized to the solvent using the same methods as those described in the film-formation method of the hole injection layer.

The optimal value of the thickness of the electron transport layer varies depending on a material used, and the thickness may be determined such that a driving voltage and luminous efficiency have appropriate values. The thickness of the electron transport layer is usually 1 nm to 1 µm, preferably 2 nm to 500 nm, and more preferably 5 nm to 100 nm.

—Electron Injection Layer—

As the material constituting the electron injection layer in the light-emitting device other than the composition of the silver-conjugated compound composite used in the present invention, a known compound may be used. Examples thereof may include triazole derivatives, oxazole derivatives, oxadiazole derivatives, imidazole derivatives, fluorene derivatives, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, anthraquinodimethane derivatives, anthrone derivatives, thiopyran dioxide derivatives, carbodiimide derivatives, fluorenylidenemethane derivatives, distyrylpyrazine derivatives, tetracarboxylic anhydrides of aromatic ring such as naphthalene and perylene, phthalocyanine derivatives, various metal complexes typified by metal complexes of 8-quinolinol derivatives, metal phthalocyanines and a metal complex having benzoxazole or benzothiazole as a ligand, and organic silane derivatives.

The material may be used alone or in combination of two or more types thereof. The electron injection layer may have a single-layer structure formed only of the above materials or may have a multi-layer structure formed of a plurality of layers having the same composition or different compositions. The material described as examples of the material of an electron transport layer can also be used as a material of an electron injection layer.

The film-formation method of the electron injection layer includes the same method as that of the hole injection layer. Examples of the film-formation method using a solution may include an application method, and specific examples thereof may include: coating methods such as a spin coating method, a casting method, a bar coating method, a slit coating method, a spray coating method, and a nozzle coating method; and printing methods such as a gravure printing method, a screen printing method, a flexographic printing method, and an inkjet printing method. When using a sublimable compound material, a vacuum deposition method, a transfer method or the like may be used.

The solvent used for the film-formation using a solution may include the solvents described as examples in the film-formation method of the hole injection layer.

The optimal value of the thickness of the electron injection layer varies depending on a material used, and the thickness may be determined such that a driving voltage and luminous efficiency have appropriate values. The thickness of the electron injection layer is usually 1 nm to 1 µm, preferably 2 nm to 500 nm, and more preferably 5 nm to 100 nm.

—Cathode—

In the light-emitting device, the cathode may have a single-layer structure composed of a single material or a plurality of materials, or may have a multi-layer structure formed of a plurality of layers. In the light-emitting device, when the cathode has a single-layer structure, examples of the material of the cathode other than the composition of the silver-conjugated compound composite used in the present invention may include: low electrical resistance metals such as gold, silver, copper, aluminum, chromium, tin, lead, nickel, and titanium and alloys thereof; electrically conductive metal oxides such as tin oxide, zinc oxide, indium oxide, ITO, IZO, and molybdenum oxide; and mixtures of these electrically conductive metal oxides and metals. When the cathode has a multi-layer structure, a two-layer structure including a first cathode layer and a cover cathode layer, or a three-layer structure including a first cathode layer, a second cathode layer and a cover cathode layer is preferred. The first cathode layer refers to a layer of the cathode that is closest to the light-emitting layer. In the two-layer structure, the cover cathode layer refers to a layer that covers the first cathode layer. In the three-layer structure, the cover cathode layer refers to a layer that covers the first cathode layer and the second cathode layer. For excellent electron-supplying abilities, it is preferable that the material of the first cathode layer have a work function of 3.5 eV or less. Oxides, fluorides, carbonates, complex oxides and the like of a metal having a work function of 3.5 eV or less is also suitably used as a material of the first cathode layer.

As a material of the cover cathode layer, a metal, a metal oxide and the like each having low electrical resistivity and high corrosion resistance to moisture is suitably used.

Examples of the material of the first cathode layer may include one or more materials selected from the group consisting of: alkali metals, alkaline earth metals, and alloys containing one or more of alkali metals or alkaline earth metals; oxides, halides, carbonates, and complex oxides of alkali metals or alkaline earth metals; and mixtures thereof. Examples of the alkali metals and oxides, halides, carbonates, and complex oxides thereof may include lithium, sodium, potassium, rubidium, cesium, lithium oxide, sodium oxide, potassium oxide, rubidium oxide, cesium oxide, lithium fluoride, sodium fluoride, potassium fluoride, rubidium fluoride, cesium fluoride, lithium carbonate, sodium carbonate, potassium carbonate, rubidium carbonate, cesium carbonate, potassium molybdate, potassium titanate, potassium tungstate, and cesium molybdate. Examples of the alkaline earth metals and oxides, halides, carbonates, and complex oxides thereof may include magnesium, calcium, strontium, barium, magnesium oxide, calcium oxide, strontium oxide, barium oxide, magnesium fluoride, calcium fluoride, strontium fluoride, barium fluoride, magnesium carbonate, calcium carbonate, strontium carbonate, barium carbonate, barium molybdate, and barium tungstate. Examples of the alloys containing one or more of alkali metals or alkaline earth metals may include Li—Al alloys, Mg—Ag alloys, Al—Ba alloys, Mg—Ba alloys, Ba—Ag alloys, and Ca—Bi—Pb—Sn alloys. A composition of the materials described as examples of the material of the first cathode layer and the materials described as examples of the material constituting the electron injection layer may be used as the material of the first cathode layer. Examples of the material of the second cathode layer may include the same materials as those for the first cathode layer.

Examples of the material of the cover cathode layer may include: low electrical resistance metals such as gold, silver, copper, aluminum, chromium, tin, lead, nickel, and titanium and alloys containing any of these metals; metal nanoparticles, metal nanowires; electrically conductive metal oxides such as tin oxide, zinc oxide, indium oxide, ITO, IZO, and molybdenum oxide; mixtures of these electrically conductive metal oxides and metals; nanoparticles of electrically conductive metal oxides; and electrically conductive carbons such as graphenes, fullerenes, and carbon nanotubes.

Examples of the multi-layer structure of the cathode may include a two-layer structure including the first cathode layer and the cover cathode layer such as Mg/Al, Ca/Al, Ba/Al, NaF/Al, KF/Al, RbF/Al, CsF/Al, Na$_2$CO$_3$/Al, K$_2$CO$_3$/Al, and Cs$_2$CO$_3$/Al; and a three-layer structure including the first cathode layer, the second cathode layer and the cover cathode layer such as LiF/Ca/Al, NaF/Ca/Al, KF/Ca/Al, RbF/Ca/Al, CsF/Ca/Al, Ba/Al/Ag, KF/Al/Ag, KF/Ca/Ag, and K$_2$CO$_3$/Ca/Ag. Here, the symbol "/" indicates that layers on both sides of the symbol are adjacently stacked. Preferably, the material of the second cathode layer has a reducing effect on the material of the first cathode layer.

Here, the existence and degree of the reduction effect between the materials can be estimated, for example, based on a bond dissociation energy ($\Delta rH°$) between the compounds. More specifically, in the reduction reaction of the material constituting the first cathode layer by the material constituting the second cathode layer, when the bond dissociation energy between these materials used in combination is positive, the material of the second cathode layer has the reducing effect on the material of the first cathode layer. The bond dissociation energy can be referred in, for example, "Handbook of Electrochemistry, 5th edition" (Maruzen, issued in 2000) or "Thermodynamic Database MALT" (Kagaku Gijutsu-Sha, issued in 1992).

As the method for manufacturing the cathode, a publicly known method can be used. Examples of such a method may include a vacuum deposition method, a sputtering method, an ion plating method, and a film-formation method using a solution (a solution mixture containing a macromolecular binder may be used). When a metal, a metal oxide, a metal fluoride, or a metal carbonate is used as the material of the cathode, a vacuum deposition method is suitably used. When a metal oxide having a high boiling point, a metal complex oxide or an electrically conductive metal oxide such as ITO is used, a sputtering method or an ion plating method is suitably used. When a film is formed using a combination of two or more of metals, metal oxides, metal fluorides, metal carbonates, metal oxides having a high boiling point, metal complex oxides, and electrically conductive metal oxides, a co-vapor deposition method, a sputtering method, an ion plating method or the like is used. When metal nanoparticles, metal nanowires, or electrically conductive metal oxide nanoparticles are used, a film-formation method using a solution is preferably used. Particularly, when forming a film with a composition including a low molecular organic compound and a metal, a metal oxide, a metal fluoride or a metal carbonate, a co-vapor deposition method is suitable.

The optimal value of the thickness of the cathode varies depending on a material used and the layer structure, and the thickness may be determined such that driving voltage, luminous efficiency, and a device life have appropriate values. Usually, the thickness of the first cathode layer is 0.5 nm to 20 nm, and the thickness of the cover cathode layer is 10 nm to 1 μm. For example, when Ba or Ca is used in the first cathode layer, and Al is used in the cover cathode layer, it is preferable that the thickness of Ba or Ca is 2 nm to 10 nm, and the thickness of Al is 10 nm to 500 nm. When NaF or KF is used in the first cathode layer, and Al is used in the cover cathode layer, it is preferable that the thickness of NaF or KF is 1 nm to 8 nm, and the thickness of Al is 10 nm to 500 nm.

In the light-emitting device, when the cathode is used as an optical transparent electrode, the visible light transmittance of a cover cathode layer is preferably 40% or more, and more preferably 50% or more. This range of visible light transmittance can be achieved by using transparent and electrically conductive metal oxides such as indium tin oxide, indium zinc oxide and molybdenum oxide as a material of the cover cathode layer, or by providing a cover cathode layer which is made of low electrical resistance metals such as gold, silver, copper, aluminum, chromium, tin and lead and an alloy thereof and has a thickness of 30 nm or less.

Also, in order to improve light transmittance from the cathode side, an antireflective layer may be provided on the cover cathode layer of the cathode. The material used in the antireflective layer has a refractive index of preferably 1.8 to 3.0. Examples of the material satisfying this range of refractive index may include ZnS, ZnSe and $WO_3$. Although the thickness of an antireflective layer varies depending on a combination of the materials, it is usually 10 nm to 150 nm.

—Insulating Layer—

The light-emitting device of the present invention may include an insulating layer having a thickness of 5 nm or less as a layer having functions of, for example, improving adherence to an electrode, improving charge injection from an electrode, and inhibiting mixing with an adjacent layer. Examples of a material of the insulating layer may include metal fluorides, metal oxides and organic insulating materials (for example, poly(methyl methacrylate)). Examples of the light-emitting device provided with the insulating layer having a thickness of 5 nm or less may include a device provided with the insulating layer having a thickness of 5 nm or less adjacent to a cathode, and a device provided with the insulating layer having a thickness of 5 nm or less adjacent to an anode.

—Other Components—

The light-emitting device may further include a sealing member on the opposite side to a substrate while interposing a light-emitting layer and the like therebetween. The light-emitting device may include an optional component for constituting a display device, including a filter such as a color filter and a fluorescence conversion filter, and a circuit and wiring necessary for driving a pixel.

Although the composition of the silver-conjugated compound composite of the present invention is preferably used for a cathode, it can also be used for other layers.

When the composition of the silver-conjugated compound composite of the present invention is formed into a film using a solution, an application method such as a spin coating method, a casting method, a micro-gravure coating method, a gravure coating method, a bar coating method, a roll coating method, a wire bar coating method, a dip coating method, a spray coating method, a screen printing method, a flexographic printing method, an offset printing method, an inkjet printing method, a capillary coating method, or a nozzle coating method can be used.

For any intended application, the composition of the silver-conjugated compound composite of the present invention may be used alone or in combination of two or more types thereof.

—Method for Manufacturing Light-Emitting Device—

In an embodiment, the light-emitting device can be manufactured by, for example, sequentially stacking respective layers on the substrate.

More specifically, the light-emitting device can be manufactured by providing an anode on a substrate, providing layers such as a hole injection layer and a hole transport layer thereon, providing a light-emitting layer thereon, providing layers such as an electron transport layer and an electron injection layer thereon, and stacking a cathode thereon.

In another embodiment, the light-emitting device can be manufactured by providing a cathode on a substrate, providing layers such as an electron injection layer, an electron transport layer, a light-emitting layer, a hole transport layer, and a hole injection layer thereon, and stacking an anode thereon.

In yet another embodiment, the light-emitting device can be manufactured by bonding an anode or an anode-side base in which layers are stacked on the anode to a cathode or a cathode-side base in which layers are stacked on the cathode such that they face each other.

—Applications of Light-Emitting Device—

The light-emitting device can be used to manufacture a display device. The display device includes a light-emitting device as one pixel unit. An aspect of the arrangement of pixel units may include an arrangement usually employed in a display device such as a TV set, in which a large number of pixels are arranged on a common substrate. In a display device, the pixels to be arranged on a substrate can be formed in a pixel area defined by a bank. Also, the light-emitting device of the present invention can be used in a lighting device having a planar or curved shape.

The photovoltaic cell includes electrodes comprised of an anode and a cathode, and an organic layer provided between the electrodes, and the composition of the silver-conjugated compound composite of the present invention is used for the electrodes. The photovoltaic cell may further include a substrate, a hole injection layer, an electron injection layer, a hole transport layer, an electron transport layer, a charge separation layer and the like.

Preferably, the charge separation layer of the photovoltaic cell including a layer containing the composition of the silver-conjugated compound composite of the present invention contains an electron-donor compound and an electron-acceptor compound.

In the charge separation layer, the electron-donor compound may be contained alone or in combination of two or more types thereof, and the electron-acceptor compound may be contained alone or in combination of two or more types thereof. The electron-donor compound and the electron-acceptor compound are relatively determined based on the energy levels of these compounds.

Examples of the electron-donor compound may include pyrazoline derivatives, arylamine derivatives, stilbene derivatives, triphenyldiamine derivatives, and conjugated macromolecular compounds. Examples of the conjugated macromolecular compound may include oligothiophene and derivatives thereof, polyfluorene and derivatives thereof, polyvinylcarbazole and derivatives thereof, polysilane and derivatives thereof, polysiloxane derivatives having aromatic amine on their side chain or main chain, polyaniline and derivatives thereof, polypyrrole and derivatives thereof, polyphenylenevinylene and derivatives thereof, and polythienylenevinylene and derivatives thereof.

Examples of the electron-acceptor compound may include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof, fullerenes such as $C_{60}$ and derivatives thereof, phenanthrene derivatives such as bathocuproine, metal oxides such as titanium oxide, and carbon nanotubes. The electron-acceptor compound is preferably titanium oxide, carbon nanotubes, fullerenes, or fullerene derivatives and particularly preferably fullerenes or fullerene derivatives.

The thickness of the charge separation layer is usually 1 nm to 100 μm, more preferably 2 nm to 1,000 nm, further preferably 5 nm to 500 nm, and further more preferably 20 nm to 200 nm.

<Method for Manufacturing Charge Separation Layer>

The method for manufacturing the charge separation layer may be any method. Examples of such a method may include film-formation methods such as film-formation using a solution and a vacuum deposition method.

For the film formation using a solution, there can be used an application method such as a spin coating method, a casting method, a micro-gravure coating method, a gravure coating method, a bar coating method, a roll coating method, a wire bar coating method, a dip coating method, a spray coating method, a screen printing method, a gravure printing method, a flexographic printing method, an offset printing method, an inkjet printing method, a dispenser printing method, a nozzle coating method and a capillary coating method. Among them, a spin coating method, a flexographic printing method, a gravure printing method, an inkjet printing method, or a dispenser printing method is preferred.

The photovoltaic cell including a layer containing the composition of the silver-conjugated compound composite of the present invention is usually formed on a substrate. The substrate may be any substrate that does not change during the formation of an electrode and an organic layer. Examples of a material of the substrate may include glass, plastic, macromolecular films and silicon. When the substrate is opaque, it is preferable that an opposite electrode (i.e., an electrode having a longer distance from the substrate) is transparent or translucent.

Examples of the material of the transparent or translucent electrode may include electrically conductive metal oxide films and translucent metal thin films. More specifically, a film formed using an electrically conductive material of indium oxide, zinc oxide, tin oxide and composites of these oxides (such as ITO and IZO), NESA, gold, platinum, silver, copper, etc. is used. Among them, a film formed using ITO, IZO, or tin oxide is preferred. Examples of the method for manufacturing the electrodes may include a vacuum deposition method, a sputtering method, an ion plating method, and a plating method. As a material of the electrode, a transparent and electrically conductive film of organic substance such as polyaniline and derivatives thereof, and polythiophene and derivatives thereof may be used. Furthermore, as a material of the electrode, metal, electrically conductive macromolecules and the like can be used. It is preferable that one of a pair of electrodes is made of a material having a low work function. Examples thereof may include: a metal such as lithium, sodium, potassium, rubidium, cesium, magnesium, calcium, strontium, barium, aluminum, scandium, vanadium, zinc, yttrium, indium, cerium, samarium, europium, terbium, or ytterbium; an alloy composed of two or more of the above metals; an alloy composed of one or more of the above metals and one or more metals of gold, silver, platinum, copper, manganese, titanium, cobalt, nickel, tungsten, and tin; and graphite or intercalated graphite. Examples of the alloy may include magnesium-silver alloys, magnesium-indium alloys, magnesium-aluminum alloys, indium-silver alloys, lithium aluminum alloys, lithium-magnesium alloys, lithium-indium alloys, and calcium-aluminum alloys.

In order to improve photovoltaic efficiency, an additional intermediate layer other than the charge separation layer may be used in addition to a layer containing the macromolecular compound used in the present invention. As a material of the intermediate layer, for example, halides and oxides of alkali metal and alkaline earth metal such as lithium fluoride are used. Also, fine particles of an inorganic semiconductor such as titanium oxide, PEDOT (poly-3,4-ethylenedioxythiophene), and the like may be used.

The photovoltaic cell can be manufactured by, for example, sequentially stacking each layer described above on the substrate. Since the forming method of each layer other than the charge separation layer can be performed in a similar manner as the light-emitting device already described, detailed descriptions will be omitted.

Although the composition of the silver-conjugated compound composite of the present invention is preferably used for the cathode, it may also be used for other layers.

When the composition of the silver-conjugated compound composite of the present invention is formed into a film using a solution, there can be used an application method such as a spin coating method, a casting method, a micro-gravure coating method, a gravure coating method, a bar coating method, a roll coating method, a wire bar coating method, a dip coating method, a spray coating method, a screen printing method, a flexographic printing method, an offset printing method, an inkjet printing method, a capillary coating method and a nozzle coating method.

For any intended application, the composition of the silver-conjugated compound composite of the present invention may be used alone or in combination of two or more types thereof.

<Applications of Device>

The photovoltaic cell having a layer containing the composition of the silver-conjugated compound composite of the present invention can be operated as an organic thin film solar cell when it is irradiated with light such as sunlight from transparent or translucent electrode to generate a photovoltaic force between the electrodes. It is also possible to use as an organic thin film solar cell module by integrating a plurality of organic thin film solar cells.

It is also possible to operate as an organic optical sensor when a photocurrent flows by irradiation with light from transparent or translucent electrode in a state where a voltage is applied or not applied between the electrodes. It is possible to use an organic image sensor by integrating a plurality of organic optical sensors.

<Solar Cell Module>

When the photovoltaic cell is used as an organic thin film solar cell to form a solar cell module, the solar cell module can basically have a similar module structure to that of a conventional solar cell module. The solar cell module usually has a structure in which cells are formed on a supporting substrate, such as metal, and ceramic, and covered with a filler resin, a protective glass or the like, and thus light is captured from the opposite side of the supporting substrate. The solar cell module may also have a structure in which a transparent material such as a reinforced glass is used as the material of a supporting substrate and cells are formed thereon, and thus light is captured from the side of the transparent supporting substrate. Examples of known structures of the solar cell module may include: a module structure of a superstraight type, a substrate type, and a potting type; and a substrate-integrated module structure used in an amorphous silicon solar cell and the like. The structure of a solar cell module using the organic thin film solar cell can also be appropriately selected from the above module structures depending on the intended purpose, place, environment, and the like.

In a solar cell module of the superstraight type or substrate type which is a typical module structure, solar cells are spaced at certain intervals between a pair of supporting substrates. One or both of the supporting substrates are transparent, and have been subjected to an antireflection treatment. Adjacent solar cells are electrically connected to each other via wiring such as a metal lead and a flexible wire. A current collecting electrode is placed at an external peripheral portion of the module for extracting electric power generated in the solar cell to the exterior. Between the supporting substrate and the solar cell, in order to protect solar cells and improve current collecting efficiency, various types of plastic materials such as ethylene vinyl acetate (EVA) may be provided in a form of film or filler resin depending on the intended purpose. When the solar cell module is used at a place where the surface of the module needs not to be covered with a hard material, for example, at a place unlikely to suffer from impact from outside, one of the supporting substrates can be omitted by forming a surface protective layer with a transparent plastic film or curing the filler resin to impart a protective function. The periphery of the supporting substrate is usually fixed with a frame made of metal in a sandwich shape, and a space between the supporting substrate and the frame is sealed with a sealing material, in order to ensure sealing of the inside and rigidity of the module. The solar cell module can also be formed on a curved surface when a flexible material is used for the solar cell per se, the supporting substrate, the filler material and the sealing material.

When manufacturing a solar cell module using a flexible supporting body such as a polymer film as a supporting substrate, a solar cell module body can be manufactured by sequentially forming solar cells while feeding a roll-shaped flexible supporting body, cutting into a desired size, and then sealing a peripheral portion with a flexible and moisture-proof material. It is also possible to employ a module structure called "SCAF" described in Solar Energy Materials and Solar Cells, 48, p 383-391. Furthermore, the solar cell module with the flexible supporting body can also be used in a state of being adhesively bonded to a curved glass or the like.

EXAMPLES

The present invention will be described in detail with reference to examples and a comparative example below. The present invention is not limited thereto.

—Measurement Methods—

The structural analysis of a polymer was performed by $^1$H-NMR analysis using a 300 MHz NMR spectrometer manufactured by Varian, Inc. The measurement was performed by dissolving a sample in a deuterated solvent capable of dissolving the sample so that the concentration of the sample became 20 mg/mL.

The weight average molecular weight (Mw) and the number average molecular weight (Mn) of a polymer were measured using a gel permeation chromatograph (GPC) (HLC-8220GPC, manufactured by Tosoh Corporation) as a polystyrene equivalent weight average molecular weight and a polystyrene equivalent number average molecular weight. A sample used for the measurement was dissolved in tetrahydrofuran at a concentration of about 0.5% by weight, and 50 μL of the solution was injected into the GPC. Tetrahydrofuran was used as the mobile phase of the GPC, and the mobile phase was flowed at a flow rate of 0.5 mL/min.

The ionization potential of the obtained polymer was measured in the atmosphere using a photoelectron spectrometer (product name: AC2, manufactured by RIKEN KEIKI Co., Ltd.). The sample for measurement was produced by preparing a 1 wt % chloroform solution of a polymer, spin-coating a quartz substrate with the solution at a rotation speed of 1,000 rpm for 30 seconds, and then drying the solution at 100° C. for 15 minutes. The band gap of the obtained polymer was measured as follows. The same measurement sample as that for the ionization potential was used, and the absorption spectrum of the polymer was measured using an ultraviolet-visible-near infrared spectrophotometer (CarySE, manufactured by Varian). The band gap was determined from the absorption edge of the absorption spectrum.

The surface composition analysis of the silver-conjugated compound composites prepared in Examples was performed by measuring an X-ray photoelectron spectrum using a scanning X-ray photoelectron spectrometer (product name: Quantera SXM, manufactured by ULVAC-PHI, Inc.). The analysis method was X-ray photoelectron spectroscopy (hereinafter referred to as "XPS") with an X-ray source of AlK α rays (1486.6 eV), an X-ray spot diameter of 100 μm, and a neutralization condition of using a neutralization electron gun and a low speed Ar ion gun. The sample was measured in a state where the sample was packed in a stainless-steel cup.

The shape of each silver-conjugated compound composite was determined by performing visual observation with a photograph taken by a scanning electron microscope manufactured by JEOL Ltd. (product name: JSM-5500) at a magnification of 20,000× (when the photograph was taken, the angle of a sample table was 0° (horizontal); the image was taken for an arbitrary position, and no operation such as alignment was performed when the sample was prepared). The Feret diameter is the arithmetic mean value of the measured Feret diameters for arbitrary extracted 200 or more particles in the photograph at 20,000×.

<Synthesis Example 1> (Synthesis of Coated Silver Particles A)

A 500 mL flask was charged with 2.08 g (18.75 mmol) of polyvinylpyrrolidone (hereinafter referred to as "PVP") (polystyrene equivalent weight average molecular weight: 55,000) and 200 mL of ethylene glycol. The resultant mixture was stirred until PVP was dissolved. Then 2.12 g (12.50 mmol) of silver nitrate was added thereto, and 50 mL of ethylene glycol was used to wash down the silver nitrate adhering to the wall surface of the flask into the flask. Then the flask was immersed in an oil bath at 165° C., and the mixture was stirred for 120 minutes, thus obtaining a dispersion liquid of silver particles.

The obtained dispersion liquid was cooled to 40° C. and then centrifuged to collect a precipitate. The collected precipitate was dried to obtain silver particles (hereinafter referred to as "coated silver particles A").

The obtained coated silver particles A with no electrically conducting treatment were observed under an SEM to measure the Feret diameter, and the Feret diameter was found to be 122 nm. In the SEM, when no electrically conducting treatment is performed, no image of organic materials is taken and only the image of silver can be taken. Therefore, the measured Feret diameter is the Feret diameter of the silver particles themselves. The results of XPS measurement revealed that polyvinylpyrrolidone was adsorbed to the surfaces of the silver particles.

<Synthesis Example 2> (Synthesis of Compound (3))

A 3,000 mL flask was charged with 52.5 g (0.16 mol) of 2,7-dibromo-9-fluorenone, 154.8 g (0.93 mol) of ethyl salicylate, and 1.4 g (0.016 mol) of mercaptoacetic acid, and the gas in the flask was replaced with nitrogen gas. Methanesulfonic acid (630 mL) was added to the mixture, and the resultant mixture was stirred at 75° C. overnight. Then the mixture was allowed to cool, added to iced water, and stirred for 1 hour. The solid generated was separated by filtration and washed with heated acetonitrile. The washed solid was dissolved in acetone, and a solid was re-crystallized from the obtained acetone solution and separated by filtration. The obtained solid (62.7 g), 86.3 g (0.27 mmol) of 2-[2-(2-methoxyethoxy)ethoxy]ethoxy p-toluene sulfonate, 62.6 g (0.45 mmol) of potassium carbonate, and 7.2 g (0.027 mol) of 1,4,7,10,13,16-hexaoxacyclooctadecane (also referred to as "18-crown-6") were dissolved in N,N-dimethylformamide (DMF) (670 mL). The mixture was transferred to a flask and stirred at 105° C. overnight. The obtained mixture was allowed to cool to room temperature, added to iced water, and stirred for 1 hour. Then chloroform was added to the reaction solution to perform separation and extraction. The separated organic layer was concentrated, thus obtaining 51.2 g of a product (yield: 31%). The structure of the product was determined using $^1$H-NMR. As a result, it was determined that the product was compound (3) represented by the following formula.

[Chem. 20]

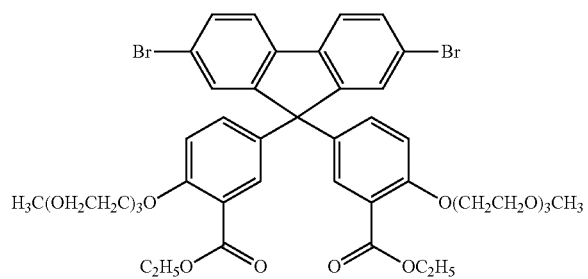

(3)

<Synthesis Example 3> (Synthesis of Compound (4))

The gas in a 1,000 mL flask was replaced with argon gas. Then the flask was charged with the compound (3) (15 g), bis(pinacolate)diboron (8.9 g), a [1,1'-bis(diphenylphosphino)ferrocene]dichloro palladium(II) dichloromethane complex (0.8 g), 1,1'-bis(diphenylphosphino)ferrocene (0.5 g), potassium acetate (9.4 g), and dioxane (400 mL), and these compounds were mixed and heated at 110° C. for 10 hours to reflux. The reaction solution was allowed to cool, and then filtrated. The filtrate was concentrated under reduced pressure. The reaction mixture was washed three times with methanol. Then the precipitate was dissolved in toluene. Activated carbon was added to the solution, and the solution was stirred. Then the solution was filtrated, and the filtrate was concentrated under reduced pressure, thus obtaining 11.7 g of a product. The structure of the product was determined using $^1$H-NMR. As a result, it was determined that the product was compound (4) represented by the following formula.

[Chem. 21]

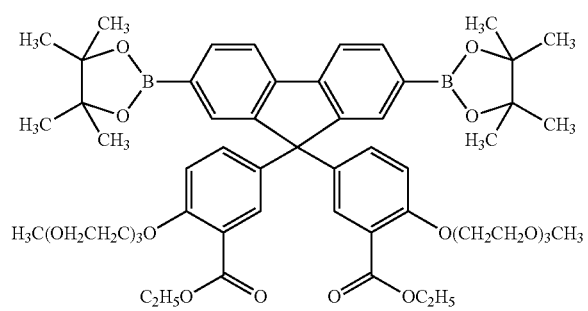

(4)

<Synthesis Example 4> (Synthesis of Polymer (P3))

The gas in a 100 mL flask was replaced with argon gas. Then the flask was charged with the compound (3) (0.55 g), the compound (4) (0.61 g), tetrakistriphenylphosphine palladium (0.01 g), methyltrioctylammonium chloride (product name: Aliquat336 (registered trademark), manufactured by Aldrich) (0.20 g), and toluene (10 mL), and these compounds were mixed and heated to 105° C. A 2M aqueous solution of sodium carbonate (6 mL) was added dropwise to the obtained reaction solution, and the resultant solution was refluxed for 8 hours. 4-Tert-butylphenyl boronic acid (0.01 g) was added to the reaction solution, and the resultant solution was refluxed for 6 hours. Then an aqueous solution of sodium diethyldithiocarbamate (10 mL, concentration: 0.05 g/mL) was added, and the resultant mixture was stirred for 2 hours. The solution mixture was added dropwise to 300 mL of methanol, and the resultant mixture was stirred for 1 hour. The precipitated precipitate was filtrated, dried under reduced pressure for 2 hours, and dissolved in 20 mL of tetrahydrofuran. The obtained solution was added dropwise to a solvent mixture of 120 mL of methanol and 50 mL of a 3 wt % aqueous solution of acetic acid, and the resultant mixture was stirred for 1 hour. The precipitated precipitate was filtrated and dissolved in 20 mL of tetrahydrofuran. The solution thus obtained was added dropwise to 200 mL of methanol, and the mixture was stirred for 30 minutes. The precipitated precipitate was filtrated to thereby obtain a solid. The obtained solid was dissolved in tetrahydrofuran, and the solution was passed through an aluminum column and a silica gel column for purification. The tetrahydrofuran solution recovered from the columns was concentrated and then added dropwise to methanol, and the precipitated solid was filtrated and dried, thus obtaining 520 mg of a polymer (hereinafter referred to as "polymer (P3)").

From the results of $^1$H-NMR, polymer (P3) has a repeating unit represented by the following formula.

[Chem. 22]

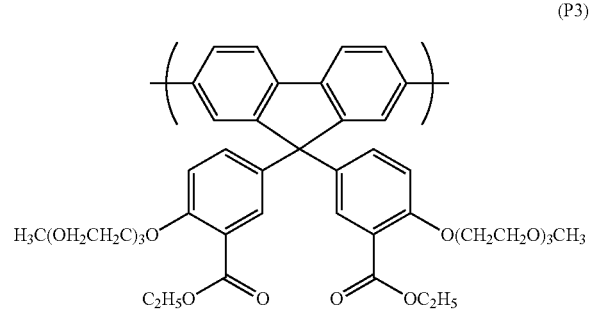

(P3)

The polystyrene equivalent number average molecular weight of polymer (p3) was $2.4 \times 10^4$, and the polystyrene equivalent weight average molecular weight was $4.8 \times 10^4$.

<Synthesis Example 5> (Synthesis of Polymer (P4))

Polymer (P3) (200 mg) was charged into a 100 mL flask, and the gas in the flask was replaced with nitrogen gas. Tetrahydrofuran (20 mL) and ethanol (20 mL) were added thereto, and the mixture was heated to 55° C. An aqueous solution prepared by dissolving cesium hydroxide (200 mg)

in water (2 mL) was added thereto, and the mixture was stirred at 55° C. for 6 hours. The obtained mixture was cooled to room temperature, and the reaction solvent was evaporated under reduced pressure, thus obtaining a solid. The solid was washed with water and dried under reduced pressure, thus obtaining 150 mg a polymer having a repeating unit represented by the following formula (hereinafter referred to as "polymer (P4)").

[Chem. 23]

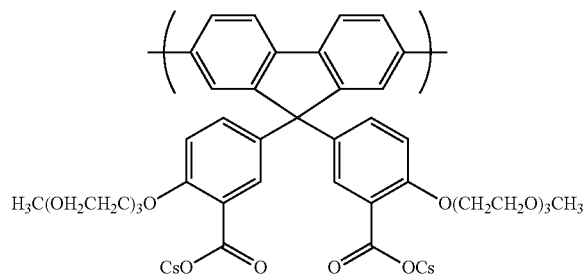

(P4)

By the $^1$H-NMR spectrum, it was confirmed that a signal attributed to an ethyl groups at an ethyl ester moiety in polymer (P3) completely disappeared. The polystyrene equivalent number average molecular weight and polystyrene equivalent weight average molecular weight of polymer (P4) were the same as those of polymer (P3). The maximum light-emission wavelength of polymer (P4) was 426 nm. The ionization potential of polymer (P4) was 5.50 eV, and its band gap was 2.80 eV.

<Synthesis Example 6> (Synthesis of Hole Transport Material B)

The inside of a flask was set under an inert gas atmosphere. Then, 2,7-dibromo-9,9-di(octyl)fluorene (1.4 g, 2.5 mmol), 2,7-bis(4,4,5,5-tetramethyl-1,3,2-dioxaborolane-2-yl)-9,9-di(octyl)fluorene (6.4 g, 10.0 mmol), N,N-bis(4-bromophenyl)-N',N'-bis(4-butylphenyl)-1,4-phenylenediamine (4.1 g, 6 mmol), bis(4-bromo phenyl) benzocyclobutene amine (0.6 g, 1.5 mmol), tetraethylammonium hydroxide (1.7 g, 2.3 mmol), palladium acetate (4.5 mg, 0.02 mmol), tri(2-methoxyphenyl) phosphine (0.03 g, 0.08 mmol), and toluene (100 mL) were mixed, and the mixture was stirred at 100° C. for 2 hours under heating. Then phenylboronic acid (0.06 g, 0.5 mmol) was added, and the obtained mixture was stirred for 10 hours. After the mixture was allowed to cool, an aqueous layer was removed, and an aqueous solution of sodium diethyldithiocarbamate was added. After the mixture was stirred, an aqueous layer was removed, and an organic layer was washed successively with water and a 3 wt % aqueous solution of acetic acid. The organic layer was poured into methanol to precipitate a polymer, and the polymer collected by filtration was again dissolved in toluene and passed through a silica gel column and an alumina column. Then the toluene solution containing the polymer was collected, and the collected toluene solution was poured into methanol to precipitate the polymer. The precipitated polymer was collected by filtration and vacuum-dried at 50° C., thus obtaining a macromolecular compound (12.1 g) serving as hole transport material B. According to gel permeation chromatography, the polystyrene equivalent weight average molecular weight of the obtained hole transport material B was $3.0 \times 10^5$, and its molecular weight distribution index (Mw/Mn) was 3.1.

The hole transport material B is a copolymer having a repeating unit represented by the following formula:

[Chem. 24]

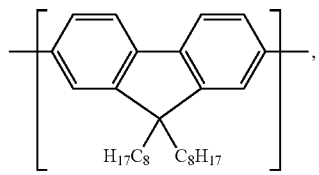

a repeating unit represented by the following formula:

[Chem. 25]

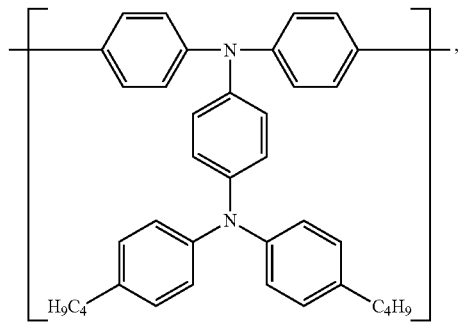

and a repeating unit represented by the following formula:

[Chem. 26]

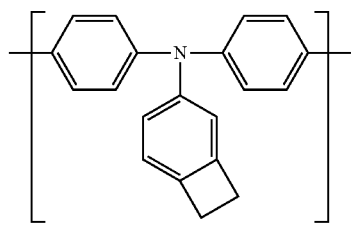

at a molar ratio of 62.5:30:7.5 (a theoretical value obtained from the charged amounts of the raw materials).

<Synthesis Example 7> (Synthesis of Light-Emitting Material B)

The inside of a flask was set under an inert gas atmosphere. Then, 2,7-dibromo-9,9-di(octyl)fluorene (9.0 g, 16.4 mmol), N,N'-bis(4-bromophenyl)-N,N'-bis(4-tert-butyl-2,6-dimethylphenyl)1,4-phenylenediamine (1.3 g, 1.8 mmol), 2,7-bis(4,4,5,5-tetramethyl-1,3,2-dioxaborolane-2-yl)-9,9-di(4-hexylphenyl)fluorene (13.4 g, 18.0 mmol), tetraethylammonium hydroxide (43.0 g, 58.3 mmol), palladium acetate (8 mg, 0.04 mmol), tri(2-methoxyphenyl)phosphine (0.05 g, 0.1 mmol), and toluene (200 mL) were mixed, and the mixture was heated and stirred at 90° C. for 8 hours. Then phenylboronic acid (0.22 g, 1.8 mmol) was added, and the obtained mixture was stirred for 14 hours. After the mixture was allowed to cool, an aqueous layer was removed, and an aqueous solution of sodium diethyldithiocarbamate was added. After the mixture was stirred, an aqueous layer was removed, and an organic layer was washed successively with water and a 3 wt % aqueous solution of acetic acid. The organic layer was poured into methanol to precipitate a polymer, and the polymer collected by filtration was again dissolved in toluene and passed through a silica gel column and an alumina column. Then the toluene solution containing the polymer was collected, and the collected toluene solution was poured into methanol to precipitate the polymer. The precipitated polymer was vacuum-dried at 50° C., thus obtaining a macromolecular compound (12.5 g) serving as light-emitting material B. According to gel permeation chromatography, the polystyrene equivalent weight average molecular weight of the obtained light-emitting material B was $3.1 \times 10^5$, and its molecular weight distribution index (Mw/Mn) was 2.9.

The light-emitting material B is a copolymer having a repeating unit represented by the following formula:

[Chem. 27]

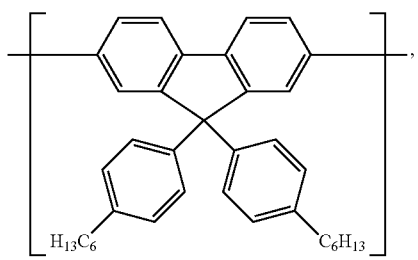

a repeating unit represented by the following formula:

[Chem. 28]

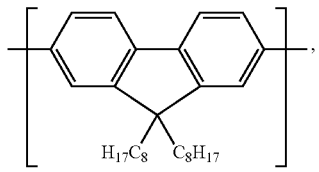

and a repeating unit represented by the following formula:

[Chem. 29]

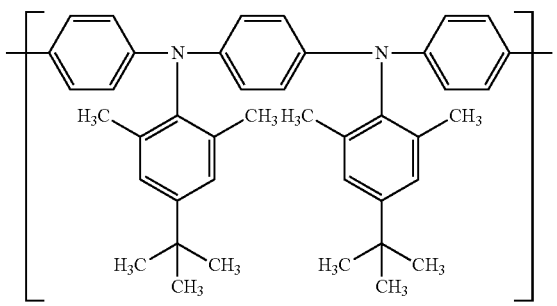

at a molar ratio of 50:45:5 (a theoretical value obtained from the charged amounts of the raw materials).

<Example 1> (Manufacture of Light-Emitting Device k-1)

First, on ITO of a glass substrate having a film of ITO formed thereon as an anode, 0.5 mL of poly(3,4-ethylene-dioxythiophene)/polystyrenesulfonic acid (manufactured by H. C. Starck GmbH, a PEDOT:PSS solution, trade name: CLEVIOS (registered trade mark) P VP Al 4083) as a solution of a hole injection material was applied, and a film was formed by a spin coating method so as to have a thickness of 70 nm. The obtained glass substrate having the film formed thereon was heated in air at 200° C. for 10 minutes. Then, the substrate was allowed to cool down to room temperature, thus obtaining glass substrate A having a hole injection layer formed thereon.

Second, 5.2 mg of the hole transport material B and 1 mL of xylene were mixed to prepare a composition for a hole transport layer containing 0.6% by weight of the hole transport material B.

The composition for a hole transport layer was applied by a spin coating method onto glass substrate A having the hole injection layer formed thereon, to form a coating film having a thickness of 33 nm. The glass substrate on which the coating film was formed was heated under a nitrogen atmosphere at 200° C. for 20 minutes to make the coating film insoluble, and thereafter allowed to cool down to room temperature, thus obtaining glass substrate B having a hole transport layer formed thereon.

Third, the light-emitting material B and xylene were mixed to prepare a composition for a light-emitting layer containing 1.3% by weight of the light-emitting material B.

The composition for a light-emitting layer was applied by a spin coating method onto glass substrate B having the hole transport layer formed thereon, to form a coating film having a thickness of 99 nm. The substrate on which the coating film was formed was heated under a nitrogen atmosphere at 130° C. for 15 minutes. Then, the solvent was evaporated. Thereafter, the substrate was allowed to cool down to room temperature, thus obtaining glass substrate C having a light-emitting layer formed thereon.

Fourth, about 0.2 parts by weight of the polymer (P4), about 0.07 parts by weight of cesium hydroxide monohydrate, and about 98.73 parts by weight of methanol were mixed with about 1.0 part by weight of the coated silver particles A, and the mixture was stirred for 1 hour to obtain a dispersion liquid of a composition of a silver-conjugated compound composite (100 parts by weight). In this dispersion liquid, the silver-conjugated compound composite (a composite in which the polymer (P4) was adsorbed to the coated silver particles A) and an ionic compound (cesium hydroxide monohydrate) were dispersed.

The dispersion liquid of the composition of the silver-conjugated compound composite was applied by a casting method onto the glass substrate C having the light-emitting layer formed thereon, thus obtaining a layered structure m-1 including the composition of the silver-conjugated compound composite of the present invention. Here, the composition of the silver-conjugated compound composite serves as a cathode.

Finally, the layered structure m-1 in which the cathode was formed was sealed with sealing glass and a two-component epoxy resin (product name: PX681C/NC, manufactured by Robnor resins) in a nitrogen atmosphere, thus manufacturing a light-emitting device k-1.

A forward voltage of 20 V was applied to the light-emitting device k-1, and the light-emitting brightness was measured. As a result, the light-emitting brightness was 920 cd/m$^2$.

<Comparative Example 1> (Manufacture of Light-Emitting Device k-2)

A light-emitting device (hereinafter referred to as a "light-emitting device k-2") was manufactured in a similar manner as in Example 1 except that the coated silver particles A were used instead of the composition of the silver-conjugated compound composite in Example 1. A forward voltage of 20 V was applied to the light-emitting device k-2, but no light emission was observed.

<Example 2> (Manufacture of Light-Emitting Device k-3)

A light-emitting device (hereinafter referred to as "light-emitting device k-3") was manufactured in a similar manner as in Example 1 except that a dispersion liquid of a composition of a silver-conjugated compound composite (100 parts by weight) obtained by mixing about 1.0 part by weight of the coated silver particles A with about 0.2 parts by weight of the polymer (P4), about 0.01 parts by weight of cesium acetate, and about 98.79 parts by weight of methanol and stirring the mixture for 1 hour was used instead of the dispersion liquid of the silver-conjugated compound composite composition in Example 1. A forward voltage of 15 V was applied to the light-emitting device k-3, and the light-emitting brightness was 194 cd/m$^2$.

<Example 3> (Manufacture of Light-Emitting Device k-4)

A light-emitting device (hereinafter referred to as "light-emitting device k-4") was manufactured in a similar manner as in Example 2 except that cesium benzoate was used instead of cesium acetate in Example 2. A forward voltage of 15 V was applied to the light-emitting device k-4, and the light-emitting brightness was 460 cd/m$^2$.

<Example 4> (Manufacture of Light-Emitting Device k-5)

A light-emitting device (hereinafter referred to as "light-emitting device k-5") was manufactured in a similar manner as in Example 2 except that 4-pyridinecarboxylic acid cesium salt was used instead of cesium acetate in Example 2. A forward voltage of 15 V was applied to the light-emitting device k-5, and the light-emitting brightness was 159 cd/m$^2$.

INDUSTRIAL APPLICABILITY

The composition of the silver-conjugated compound composite of the present invention is useful as: materials for coating electrodes, transparent electrodes, electrically conductive paints, adhesives, bonds, electrically conductive coatings, circuits, integrated circuits, electromagnetic wave shielding materials, sensors, antennas, and heating devices; fibers; packaging materials; materials for antimicrobial agents, deodorants, antistatic agents; medical materials; etc.

The layered structure of the present invention includes a layer containing the composition of the silver-conjugated compound composite. Since such a layer has high electrical conductivity, the layered structure is useful for organic electronic devices such as light-emitting devices, solar cells, and organic transistors. A light-emitting device using the composition of the silver-conjugated compound composite of the present invention has high light-emitting brightness when compared with a light-emitting device that does not use the composition of the silver-conjugated compound composite of the present invention.

The invention claimed is:

1. A composition of a silver-conjugated compound composite, comprising:
   (1) a silver-conjugated compound composite comprising a silver particle with a Feret diameter of 1000 nm or less and a conjugated compound having a weight average molecular weight of $3.0 \times 10^2$ or more being adsorbed to the silver particle; and
   (2) an ionic compound;
   wherein the ionic compound is lithium fluoride, sodium fluoride, potassium fluoride, cesium fluoride, calcium fluoride, lithium hydroxide, sodium hydroxide, potassium hydroxide, cesium hydroxide, sodium carbonate, potassium carbonate, cesium carbonate, lithium acetate, sodium acetate, potassium acetate, cesium acetate, lithium benzoate, sodium benzoate, cesium benzoate, cesium terephthalate, or pyridinecarboxylic acid cesium salt, wherein the ionic compound may contain hydration water, and
   the added amount of the ionic compound is 1 to 50 parts by weight, based on 100 parts by weight of the silver-conjugated compound composite.

2. The composition of a silver-conjugated compound composite according to claim 1, wherein the conjugated compound is an aromatic compound.

3. The composition of a silver-conjugated compound composite according to claim 1, wherein the content of the conjugated compound in the composition of a silver-conjugated compound composite is 1.0% by weight or more.

4. The composition of a silver-conjugated compound composite according to claim 1, further comprising an unconjugated compound.

5. The composition of a silver-conjugated compound composite according to claim 1, wherein the silver-conjugated compound composite has a Feret diameter of 1100 nm or less and the silver-conjugated compound composite has a particle shape.

6. The composition of a silver-conjugated compound composite according to claim 1, wherein the conjugated compound comprises a hetero atom-containing group.

7. The composition of a silver-conjugated compound composite according to claim 1, wherein the conjugated compound comprises a group represented by Formula (I) below, a repeating unit represented by Formula (II) below, or both of them:

wherein
Ar$^1$ represents an (n$^1$+1) valent aromatic group,
R$^1$ represents a single bond or an (m+1) valent group,
X$^1$ represents a hetero atom-containing group,
m$^1$ and n$^1$ each independently represent an integer of 1 or more, and when R$^1$, X$^1$ and m$^1$ are each plurally present, they may be the same as or different from each other;

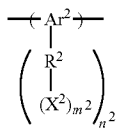
(II)

wherein

Ar$^2$ represents an (n$^2$+2) valent aromatic group,

R$^2$ represents a single bond or an (m$^2$+1) valent group,

X$^2$ represents a hetero atom-containing group, m$^2$ and n$^2$ each independently represent an integer of 1 or more, and when R$^2$, X$^2$ and m$^2$ are each plurally present, they may be the same as or different from each other.

8. The composition of a silver-conjugated compound composite according to claim 7, wherein the formula weight of a repeating unit represented by Formula (II) is 3.0×10$^2$ or more.

9. The composition of a silver-conjugated compound composite according to claim 7, wherein the (n$^1$+1) valent aromatic group represented by Ar$^1$ is a residue remaining after removing (n$^1$+1) hydrogen atoms directly bonding to carbon atoms that constitute a ring of an aromatic compound represented by any one of formulae below, the (n$^2$+2) valent aromatic group represented by Ar$^2$ is a residue remaining after removing (n$^2$+2) hydrogen atoms directly bonding to carbon atoms that constitute a ring of an aromatic compound represented by any one of formulae below, and the aromatic groups are optionally substituted

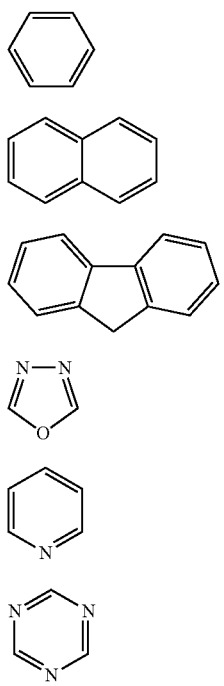

-continued

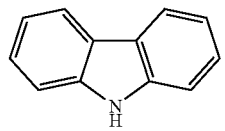
(7)

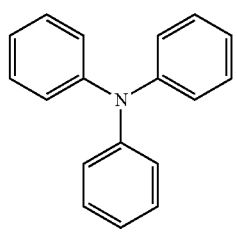
(8)

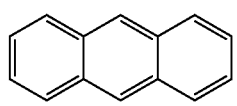
(9)

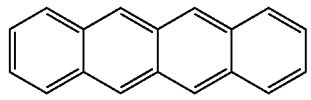
(10)

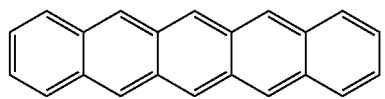
(11)

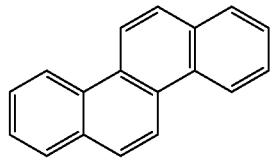
(12)

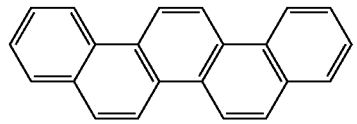
(13)

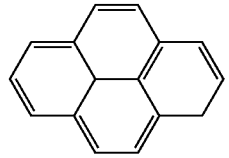
(14)

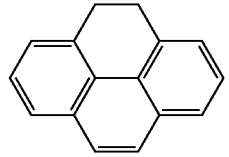
(15)

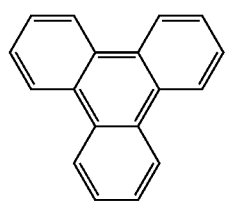
(16)

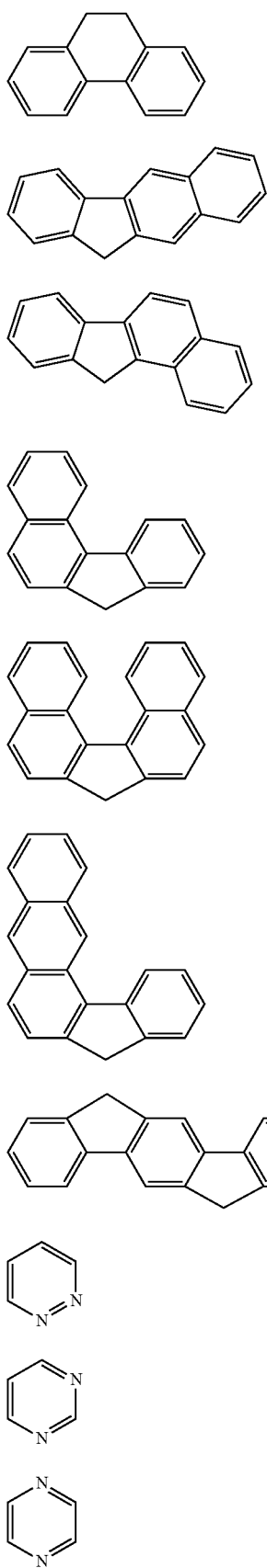
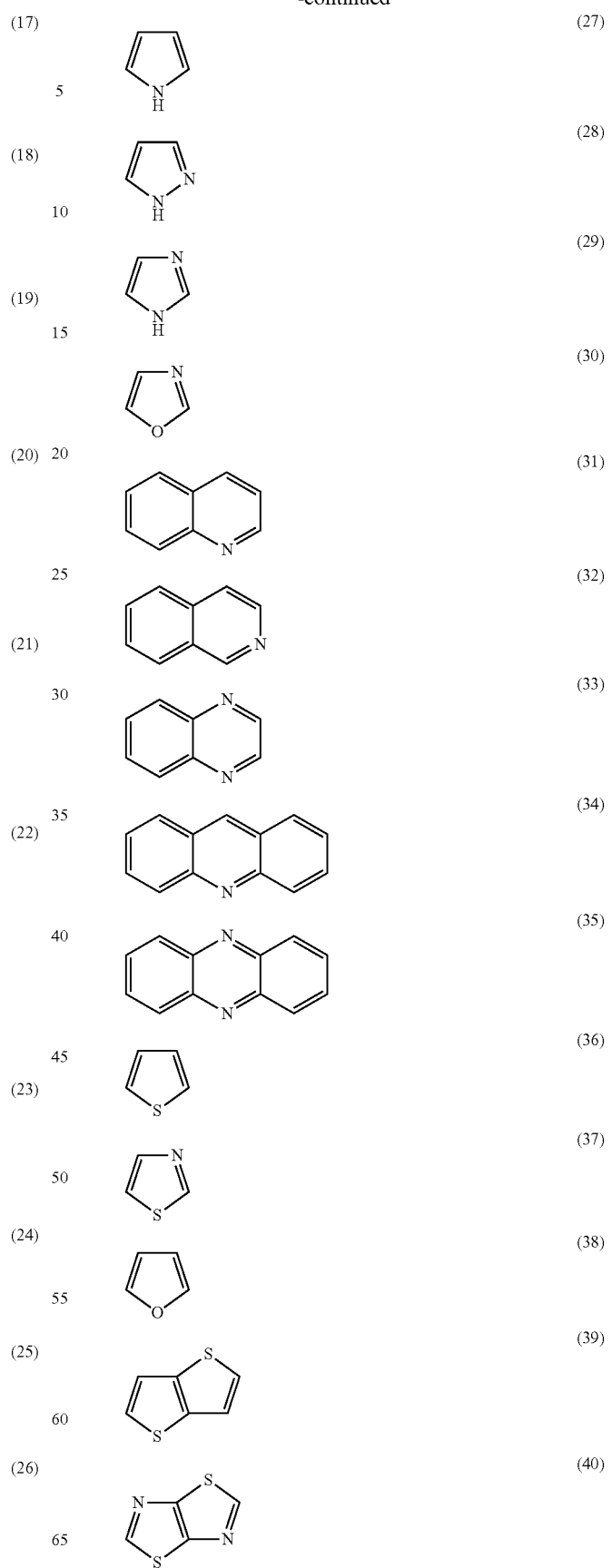

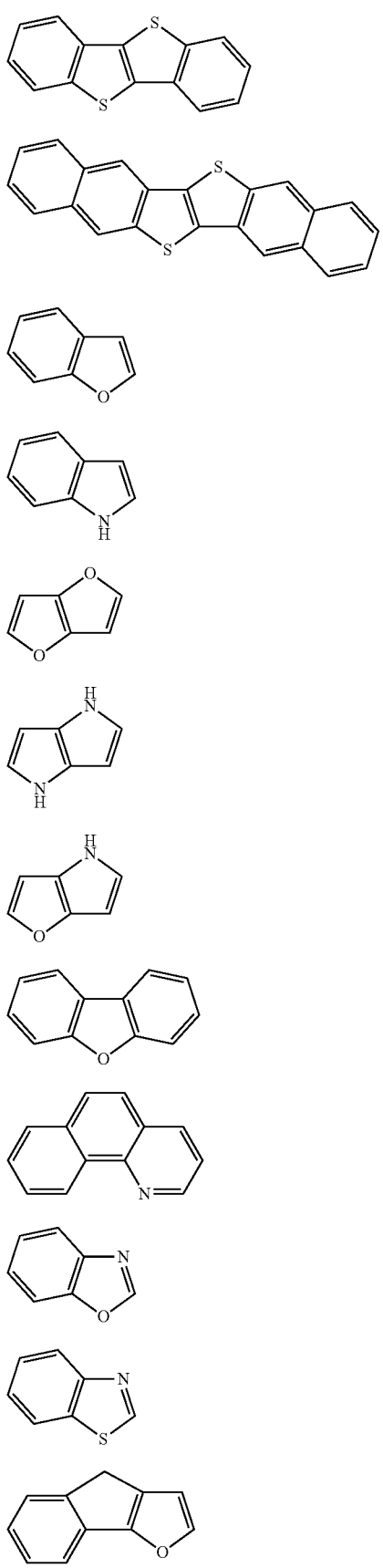
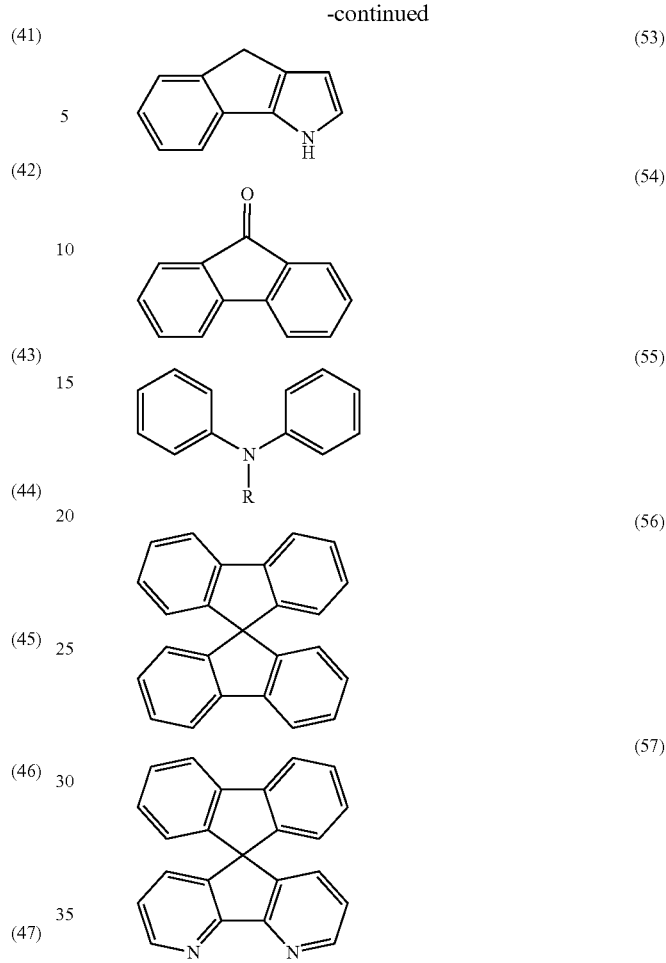

wherein R represents a hydrogen atom or a monovalent hydrocarbon group.

10. The composition of a silver-conjugated compound composite according to claim 6, wherein the hetero atom-containing group is a mercapto group, a mercaptocarbonyl group, a mercaptothiocarbonyl group, a substituted or unsubstituted hydrocarbylthio group, a substituted or unsubstituted hydrocarbylthiocarbonyl group, a substituted or unsubstituted hydrocarbyldithio group, a hydroxyl group, a substituted or unsubstituted hydrocarbyloxy group, a carboxyl group, a substituted or unsubstituted hydrocarbylcarbonyl group, a cyano group, an amino group, a mono(substituted or unsubstituted hydrocarbyl)amino group, a di(substituted or unsubstituted hydrocarbyl)amino group, a phosphino group, a mono(substituted or unsubstituted hydrocarbyl)phosphino group, a di(substituted or unsubstituted hydrocarbyl)phosphino group, a group represented by formula: —P(=O)(OH)$_2$, a sulfo group, a monovalent heterocyclic group, a group represented by formula: —COOM, a group represented by formula: —SO$_3$M, a group represented by formula: —NR$_3$M', a halogen atom, a formyl group, a substituted or unsubstituted hydrocarbyloxycarbonyl group, a substituted or unsubstituted hydrocarbylcarbonyloxy group, a nitro group, a group represented by formula: —OP(=O)(OH)$_2$, a carbamoyl group, a mono(substituted or unsubstituted hydrocarbyl)carbamoyl group, a di(substituted or unsubstituted hydrocarbyl)carbamoyl group, a group represented by formula: —C(=S)NR$_2$, a group represented by formula: —B(OH)₂, a group represented by formula: —BR₂, a boric acid ester residue represented by formula:

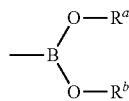

wherein $R^a$ and $R^b$ each independently represent a monovalent hydrocarbon group, or $R^a$ and $R^b$ are combined together to form a divalent hydrocarbon group;
a silyl group represented by formula: —Si(OR)₃, a substituted or unsubstituted hydrocarbylsulfo group, a group represented by formula: —S(=O)₂R, a sulfino group, a substituted or unsubstituted hydrocarbylsulfino group, a group represented by formula: —NRC(=O)OR, a group represented by formula: —NRC(=O)SR, a group represented by formula: —NRC(=S)OR, a group represented by formula: —NRC(=S)SR, a group represented by formula: —OC(=O)NR₂, a group represented by formula: —SC(=O)NR₂, a group represented by formula: —OC(=S)NR₂, a group represented by formula: —SC(=S)NR₂, a group represented by formula: —NRC(=O)NR₂, a group represented by formula: —NRC(=S)NR₂, a group represented by formula: —SM, a group represented by formula: —C(=O)SM, a group represented by formula: —CS₂M, a group represented by formula: —OM, a group represented by formula: —NM₂, a group represented by formula: —NRM, a group represented by formula: —OP(=O)(OM)₂, a group represented by formula: —P(=O)(OM)₂, a group represented by formula: —C(=O)NM₂, a group represented by formula: —C(=O)NRM, a group represented by formula: —C(=S)NRM, a group represented by formula: —C(=S)NM₂, a group represented by formula: —B(OM)₂, a group represented by formula: —BR₃M, a group represented by formula: —B(OR)₃M, a group represented by formula: —S(=O)₂M, a group represented by formula: —S(=O)OM, a group represented by formula: —NRC(=O)OM, a group represented by formula: —NRC(=O)SM, a group represented by formula: —NRC(=S)OM, a group represented by formula: —NRC(=S)SM, a group represented by formula: —OC(=O)NM₂, a group represented by formula: —OC(=O)NRM, a group represented by formula: —OC(=S)NM₂, a group represented by formula: —OC(=S)NRM, a group represented by formula: —SC(=O)NM₂, a group represented by formula: —SC(=O)NRM, a group represented by formula: —SC(=S)NM₂, a group represented by formula: —SC(=S)NRM, a group represented by formula: —NRC(=O)NM₂, a group represented by formula: —NRC(=O)NRM, a group represented by formula: —NRC(=S)NM₂, a group represented by formula: —NRC(=S)NRM, a group represented by formula: —PR₃M', a group represented by formula: —OR₂M', a group represented by formula: —SR₂M', a group represented by formula: —IRM', a group remaining after removing one hydrogen atom directly bonding to a carbon atom that constitutes a ring of an aromatic compound represented by any one of Formulae (n-1) to (n-13) below:

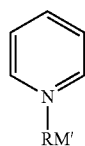 (n-1)

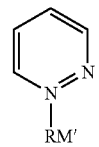 (n-2)

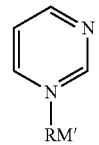 (n-3)

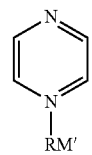 (n-4)

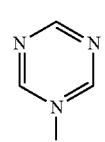 (n-5)

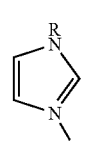 (n-6)

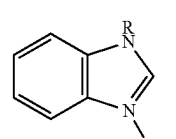 (n-7)

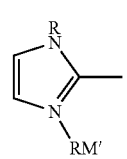 (n-8)

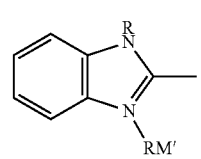 (n-9)

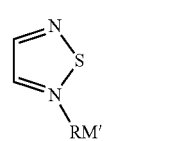 (n-10)

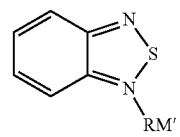 (n-11)

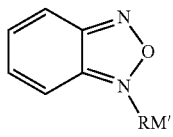
(n-12)

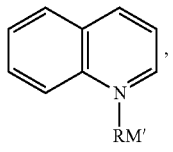
(n-13)

a monovalent group represented by any one of Formulae (p-1) to (p-9) below:

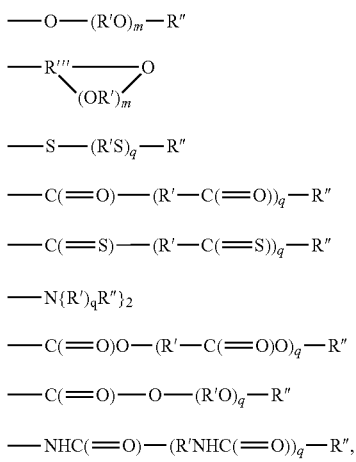

or a combination of two or more of them, wherein R represents a hydrogen atom or a monovalent hydrocarbon group; M represents a metal cation or a substituted or unsubstituted ammonium cation; M' represents an anion; R' represents a substituted or unsubstituted divalent hydrocarbon group; R" represents a hydrogen atom, a substituted or unsubstituted monovalent hydrocarbon group, a carboxyl group, a sulfo group, a hydroxyl group, a group represented by formula: —SH, a group represented by formula: —NR$^c_2$, a cyano group or a group represented by formula: —C(=O)NR$^c_2$, wherein Rc represents a substituted or unsubstituted alkyl group having 1 to 30 carbon atoms or a substituted or unsubstituted aryl group having 6 to 50 carbon atoms; R'" represents a substituted or unsubstituted trivalent hydrocarbon group; m represents an integer of 1 or more; q represents an integer of 0 or more; and when R', R" and R'" are each plurally present, they may be the same as or different from each other.

11. The composition of a silver-conjugated compound composite according to claim 10, wherein the hetero atom-containing group is a mercapto group, a substituted or unsubstituted hydrocarbylthio group, a substituted or unsubstituted hydrocarbyldithio group, a hydroxyl group, a substituted or unsubstituted hydrocarbyloxy group, a carboxyl group, a substituted or unsubstituted hydrocarbylcarbonyl group, a cyano group, an amino group, a mono(substituted or unsubstituted hydrocarbyl)amino group, a di(substituted or unsubstituted hydrocarbyl)amino group, a group represented by formula: —P(=O)(OH)$_2$, a sulfo group, a monovalent heterocyclic group, a group represented by formula: —COOM, a group represented by formula: —SO$_3$M, a group represented by formula: —NR$_3$M', a halogen atom, a formyl group, a nitro group, a group represented by formula: —OP(=O)(OH)$_2$, a carbamoyl group, a group represented by Formula (n-1), a group represented by Formula (n-5), a group represented by Formula (p-1), a group represented by Formula (p-2), or a combination of two or more of them, wherein R, R', R", R'", M, M' and m represent the same meaning as those described above.

12. The composition of a silver-conjugated compound composite according to claim 11, wherein the hetero atom-containing group is a hydroxyl group, a carboxyl group, a cyano group, an amino group, a group represented by formula: —P(=O)(OH)$_2$, a sulfo group, a monovalent heterocyclic group, a group represented by formula: —COOM, a group represented by formula: —SO$_3$M, a group represented by formula: —NR$_3$M', a group represented by Formula (p-1), a group represented by Formula (p-2), or a combination of two or more of them, wherein R, R', R", R'", M, M' and m represent the same meaning as those described above.

13. The composition of a silver-conjugated compound composite according to claim 1, wherein the ratio of [the number of hetero atoms (excluding silver atoms) in the composite]/[the total number of atoms in the composite] measured by an X-ray photoelectron spectroscopy is 0.01 or more.

14. The composition of a silver-conjugated compound composite according to claim 1, wherein a peak measured by an X-ray photoelectron spectroscopy for the composite includes a peak attributed to an atom in the conjugated compound which is not detected for a pure silver metal.

15. The composition of a silver-conjugated compound composite according to claim 1, wherein a band gap of the conjugated compound measured by an ultraviolet/visible/near-infrared spectrophotometer is 2.10 eV or more.

16. The composition of a silver-conjugated compound composite according to claim 1, wherein an ionization potential of the conjugated compound measured by a photoelectron spectrometer in the atmosphere is 5.20 eV or more.

17. A dispersion liquid comprising the composition of a silver-conjugated compound composite according to claim 1.

18. An electrode material comprising the composition of a silver-conjugated compound composite according to claim 1.

19. A layered structure comprising:
a substrate; and
a layer comprising the composition of a silver-conjugated compound composite according to claim 1 formed on the substrate.

20. An organic electronic device comprising the composition of a silver-conjugated compound composite according to claim 1.

* * * * *